(12) United States Patent
Baekbo et al.

(10) Patent No.: US 8,836,358 B2
(45) Date of Patent: Sep. 16, 2014

(54) AUTOMATED MULTI-POINT PROBE MANIPULATION

(75) Inventors: Henrik Baekbo, Bronshoj (DK); Peter F. Nielsen, Farum (DK); Chaker Khalfaoui, Bronshoj (DK); Lauge Gammelgaard, Copenhagen (DK); Hans H. Jankjaer, Gentofte (DK); Lars Norregaard, Virum (DK); Hans H. Jochumsen, Allerod (DK); Anders Jensen, Allerod (DK); Jannik Sadolin, Bronshoj (DK); Niels Torp Madsen, Valby (DK)

(73) Assignee: Capres A/S, Lyngby (DK)

( * ) Notice: Subject to any disclaimer, the term of this patent is extended or adjusted under 35 U.S.C. 154(b) by 467 days.

(21) Appl. No.: 13/260,520

(22) PCT Filed: Mar. 30, 2010

(86) PCT No.: PCT/EP2010/054180
§ 371 (c)(1),
(2), (4) Date: Nov. 28, 2011

(87) PCT Pub. No.: WO2010/115771
PCT Pub. Date: Oct. 14, 2010

(65) Prior Publication Data
US 2012/0119770 A1   May 17, 2012

(30) Foreign Application Priority Data

Mar. 31, 2009 (EP) .................................... 09388007

(51) Int. Cl.
| | | |
|---|---|---|
| G01R 31/01 | (2006.01) | |
| G01R 31/28 | (2006.01) | |
| G01R 1/073 | (2006.01) | |
| G01R 3/00 | (2006.01) | |
| G01R 1/067 | (2006.01) | |

(52) U.S. Cl.
CPC .............. *G01R 3/00* (2013.01); *G01R 31/2887* (2013.01); *G01R 1/073* (2013.01); *G01R 1/06733* (2013.01)

USPC ................................ 324/750.22; 324/755.01

(58) Field of Classification Search
USPC .......... 324/750.22, 750.16, 537, 500, 754.03, 324/754.07, 754.11, 755.01, 755.11, 324/756.01, 756.03, 715, 724, 72.5, 149, 324/437, 445, 446, 754.13, 755.05
See application file for complete search history.

(56) References Cited

U.S. PATENT DOCUMENTS

| | | | |
|---|---|---|---|
| 3,963,315 A | | 6/1976 | Bonis |
| 5,084,672 A | * | 1/1992 | Ikeuchi et al. ........... 324/754.15 |

(Continued)

FOREIGN PATENT DOCUMENTS

| | | |
|---|---|---|
| DE | 20114544 | 2/2002 |
| EP | 0444697 | 9/1991 |

(Continued)

OTHER PUBLICATIONS

Gammelgaard et al.; "A complementary metal-oxide-semiconductor compatible monocantilever 12-point probe for conductivity measurements on the nanoscale"; Applied Physics Letters; American Institute of Physics; Melville, New York, US; vol. 93, No. 9; Sep. 3, 2008.

(Continued)

*Primary Examiner* — Hoai-An D Nguyen
(74) *Attorney, Agent, or Firm* — Klein, O'Neill & Singh, LLP

(57) ABSTRACT

A multi-point probe particularly suitable for automated handling is disclosed. An automated multi-point measuring system including the multi-point probe and a probe manipulator head is also disclosed In addition, an automated multi-point probe gripping system including a probe holder and the probe manipulator head is revealed. Further, a loaded probe loader comprising a probe loader and a probe cassette for handling the multi-point probe is also revealed, where the probe cassette is provided with the probe holder for securing the multi-point probe.

17 Claims, 25 Drawing Sheets

(56) References Cited

U.S. PATENT DOCUMENTS

| | | | |
|---|---|---|---|
| 5,416,429 A | 5/1995 | McQuade et al. | |
| 6,127,832 A | 10/2000 | Comulada, Jr. et al. | |
| 6,343,369 B1 | 1/2002 | Saunders et al. | |
| 7,304,486 B2* | 12/2007 | Petersen et al. | 324/755.01 |
| 7,323,890 B2* | 1/2008 | Petersen et al. | 324/754.11 |
| 2001/0050565 A1* | 12/2001 | Petersen et al. | 324/754 |
| 2002/0075009 A1 | 6/2002 | Butler | |
| 2003/0112001 A1 | 6/2003 | Eldridge et al. | |
| 2003/0175170 A1 | 9/2003 | Youngquist et al. | |
| 2004/0164756 A1 | 8/2004 | Suzuki | |
| 2005/0062488 A1 | 3/2005 | Worledge | |
| 2007/0152654 A1 | 7/2007 | Tsai | |
| 2008/0204058 A1 | 8/2008 | Gunji et al. | |
| 2011/0285416 A1* | 11/2011 | Petersen | 324/755.01 |

FOREIGN PATENT DOCUMENTS

| | | |
|---|---|---|
| EP | 0974845 | 1/2000 |
| EP | 0977045 | 2/2000 |
| EP | 1085327 | 3/2001 |
| EP | 1095282 | 5/2001 |
| EP | 1466182 | 10/2004 |
| EP | 1610131 | 12/2005 |
| EP | 1640730 | 3/2006 |
| EP | 1686387 | 8/2006 |
| EP | 1698905 | 9/2006 |
| EP | 1775594 | 4/2007 |
| EP | 1780550 | 5/2007 |
| EP | 1782078 | 5/2007 |
| EP | 1949115 | 7/2008 |
| EP | 1970714 | 9/2008 |
| EP | 2016433 | 1/2009 |
| JP | 4080314 | 3/1992 |
| JP | 2004212068 | 7/2004 |
| WO | WO93/18525 | 6/1993 |
| WO | WO95/17681 | 6/1995 |
| WO | WO97/08733 | 3/1997 |
| WO | WO03/079383 | 9/2003 |
| WO | WO2005/124371 | 12/2005 |
| WO | WO2008/002922 | 1/2008 |
| WO | WO2008/110174 | 9/2008 |

OTHER PUBLICATIONS

Petersen et al.; "Scanning microscopic four-point conductivity probes"; Sensors and Actuators A, Elsevier Sequaia S.A., Lausanne, CH; vol. 96, No. 1; Jan. 31, 2002; pp. 53-58.

International Search Report on corresponding PCT application (PCT/EP2010/054180) from International Searching Authority (EPO) dated Sep. 3, 2010.

\* cited by examiner

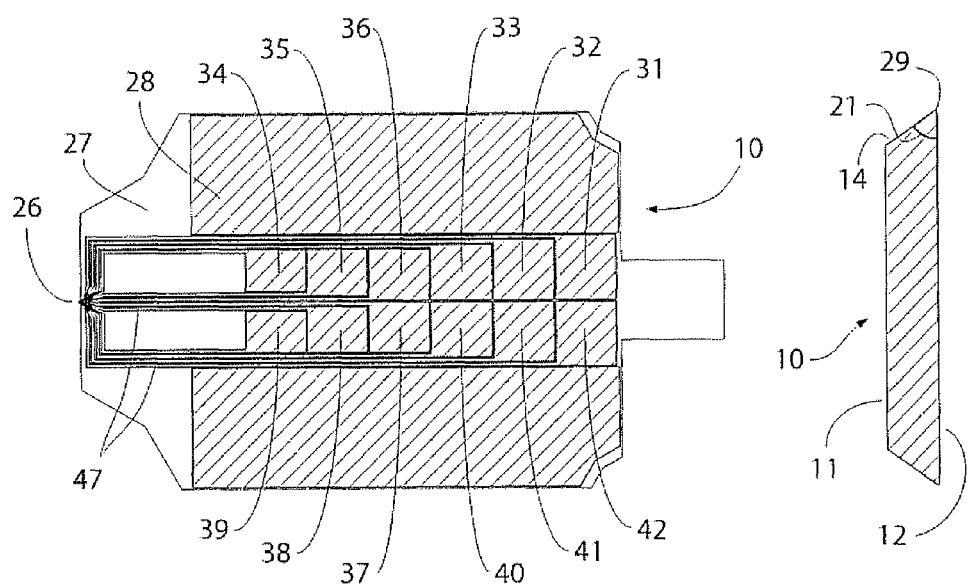
Figure 4a
Figure 5
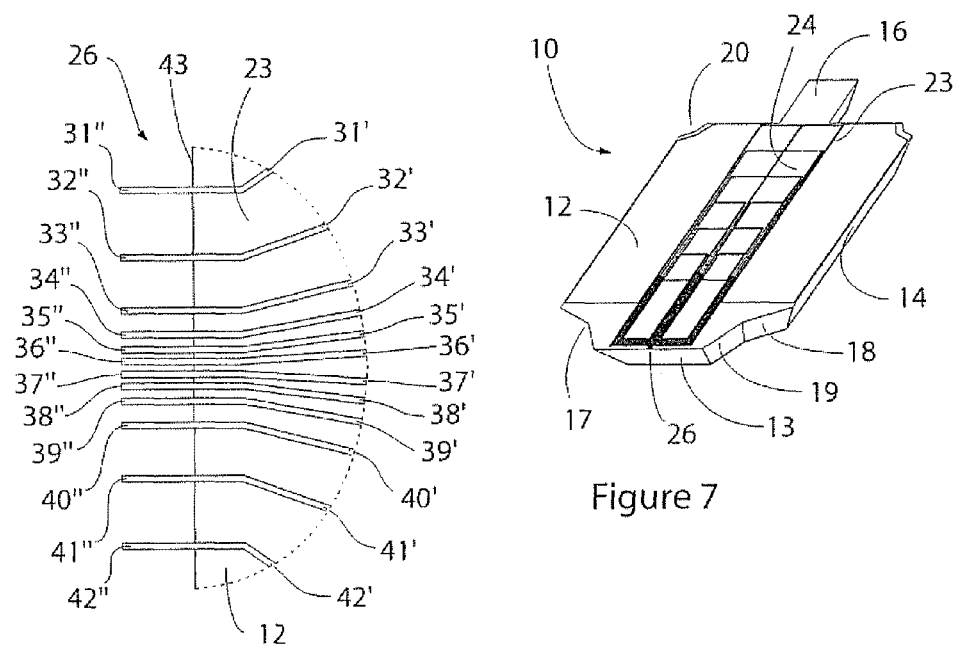
Figure 6a
Figure 7

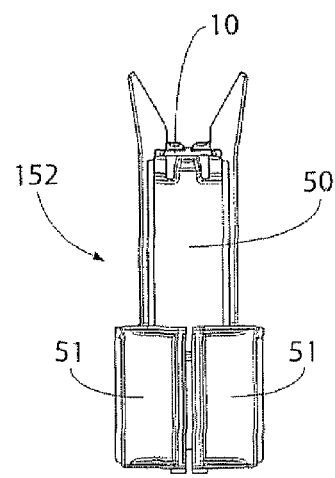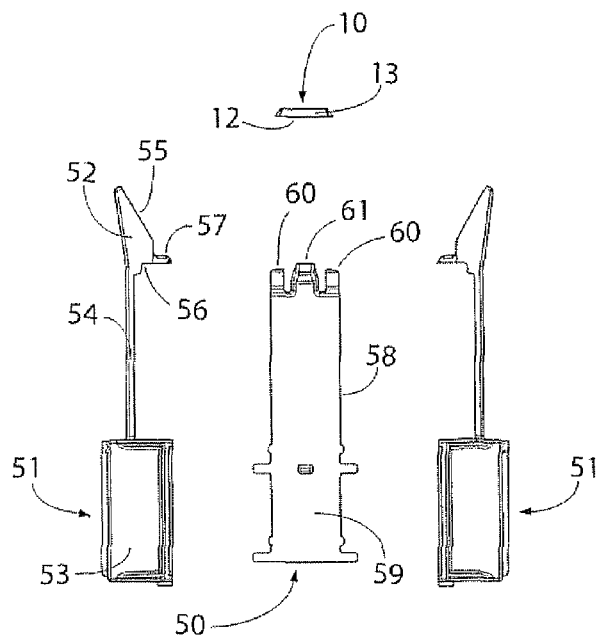
Figure 8                    Figure 9
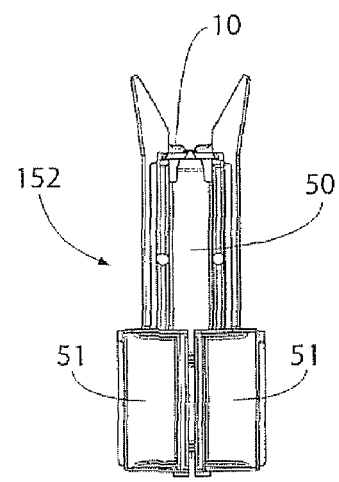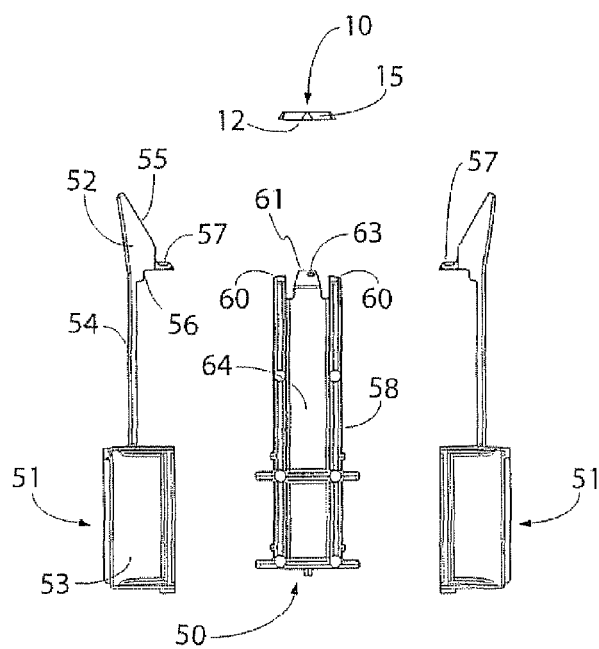
Figure 10                   Figure 11

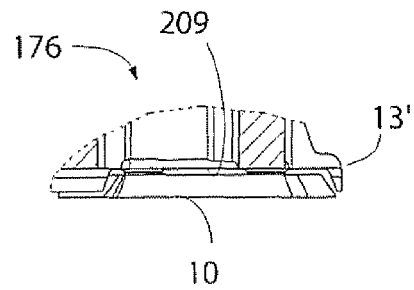
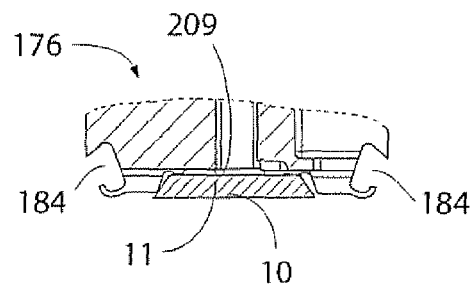
Figure 40  Figure 42
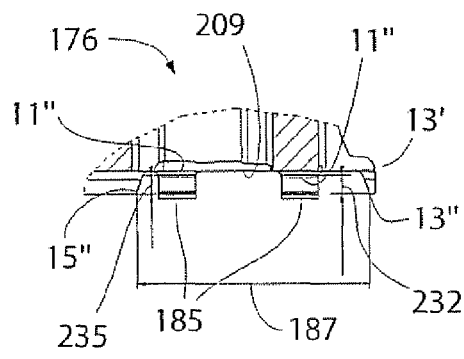
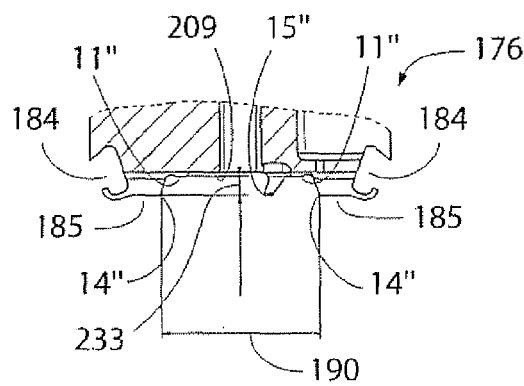
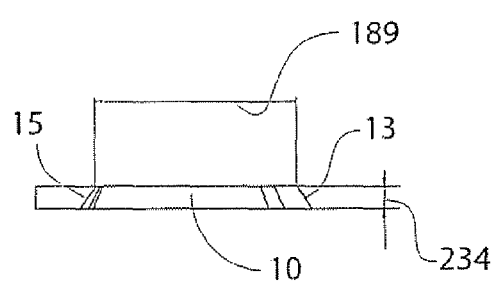
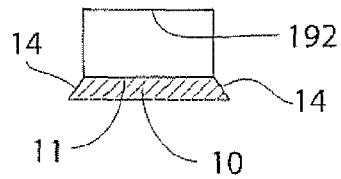
Figure 41  Figure 43

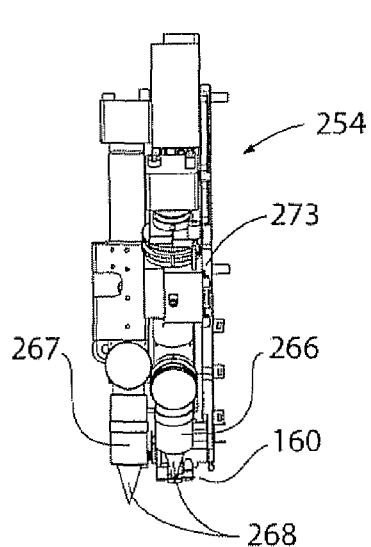
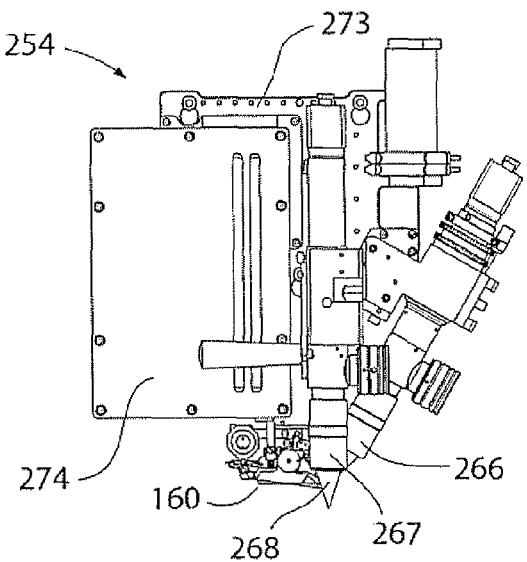
Figure 44  Figure 45
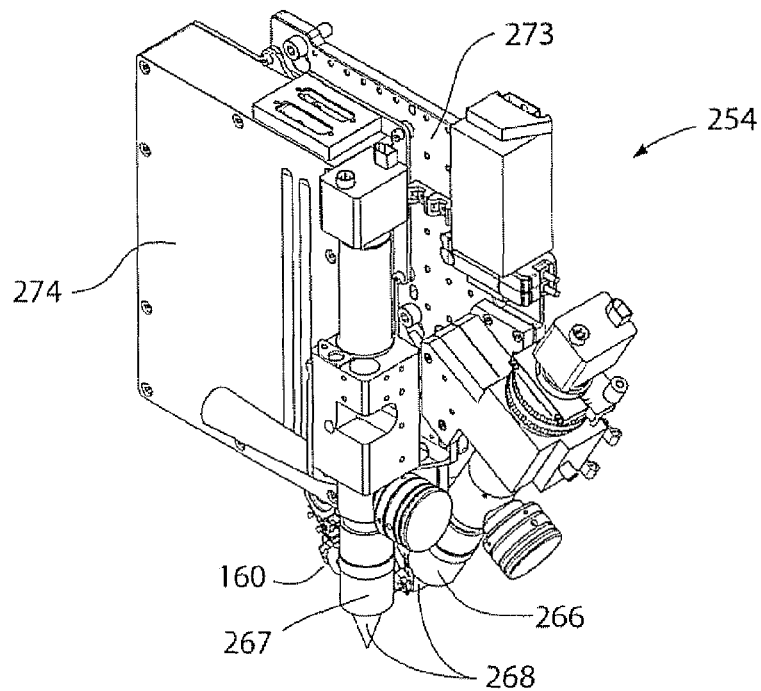
Figure 46

AUTOMATED MULTI-POINT PROBE MANIPULATION

CROSS-REFERENCE TO RELATED APPLICATION

This application is a national phase filing, under 35 U.S.C. §371(c), of International Application No. PCT/EP2010/054180, filed Mar. 30, 2010, the disclosure of which is incorporated herein by reference in its entirety.

FEDERALLY SPONSORED RESEARCH OR DEVELOPMENT

Not Applicable

FIELD OF THE INVENTION

The present invention generally relates to the handling of and measuring by multi-point probes, and in particular to the improving of the security and accuracy in automated handling. More specifically, the present invention relates to a multi-point probe, a probe holder, a probe cassette, a probe manipulator head, and a probe loader, which contribute to improve the security and accuracy.

DESCRIPTION OF RELATED ART

The handling of multi-point probes involves a significant amount of manual intervention, e.g. when loading them into measuring systems or manipulators. This presents a significant risk, as the tips or arms of the multi-point probes are easily damaged, for example by simply touching them with the fingers. This will in most occurrences result in the breakage of one or more probe arms, especially of probe arms on the micrometer scale, a kind of damage that is irreparable.

When employing multi-point probes in measurements on test substrates, each engagement will cause some wear on the probe arms, in particular for arms on the micrometer scale. Primarily, the wear will be on metal layers that are brought in direct physical contact with the test substrates. These kinds of multi-point probes can successfully be renovated by adding a new electrically conducting metal layer to the probe arms. However, this demands a manual handling, both by the persons using the multi-point probes and by the persons renovating them. The risk of damage is then significantly increased by the simple fact that the multi-point probes are repeatedly handled manually.

The multi-point probes having probe arms on the micrometer scale or below require a high accuracy in the positioning in a measuring system or gripping of a probe manipulator, in particular to avoid that other parts of the multi-point probe come in contact before the probe arms do so, which can cause serious harm to a test substrate or the probe itself.

Multi-point probes with probe arms on the micrometer scale and associated techniques have been described and discussed previously. Reference is therefore made to U.S. Pat. No. 7,323,890, U.S. Pat. No. 7,302,486, U.S. Pat. No. 7,135,876, and U.S. Pat. No. 7,307,436, which are all incorporated here in by reference. Further, reference is made also to the European patents EP 1 095 282 and EP 1 085 327; to the European patent applications EP 0 974 845, EP 1 698 905, EP 1 466 182, EP 1 610 131, EP 1 640 730, EP 1 686 387, EP 1 782 078, EP 1 775 594, EP 1 949 115, EP 1 780 550, 2 016 433, EP 1 970 714; and to the PCT application WO 2008/110174.

OBJECT OF THE INVENTION

An object according to the present invention is to provide an automated handling of multi-point probes or a handling that involves less manual contact with the multi-point probes. This has the advantage that risk of mistakes due to a human factor can be lowered. Another advantage is that the multi-point probes can be made smaller or does not have to be provided with a circuit board to enable manual handling, which means that the scales on the measuring system, and in particular on the manipulator holding the multi-point probe, can be made smaller. This in turns means that the multi-point may in some applications reach lowered regions or recesses that otherwise would be inaccessible.

Other objects of the present invention are to provide an accurate positioning and alignment of a multi-point probe relative to a test substrate, to provide a clean environment for the storage and employment of multi-point probes, and to provide an automated handling of multi-point probes. The accurate alignment enables more accurate measurements at high spatial resolutions. The clean environment will reduce the risk of dust particles coming in contact with the probe arms and test samples, which may damage them or disturb measurements. The automated handling will increase the repeatability of several consecutive measurements using different multi-point probes of the same make. It will also lower the time required for switching a multi-point probe, thereby increasing the general efficiency.

Particular features of the present invention are a multi-point probe, a probe holder, a probe cassette, a probe manipulator head, and a probe handler. These features will provide a more secure handling of multi-point probes as well as a more accurate positioning when employing them in a measurement.

SUMMARY/DISCLOSURE OF INVENTION

In addition to the above objects, the above advantages and the above features, numerous other objects, advantages and features will be evident from the detailed descriptions given below of preferred embodiments according to the present invention. The objects, advantages and features are according to a first aspect of the present invention obtained by a multi-point probe comprising a planar bottom face and a planar top face being parallel with each other. The multi-point probe further comprises a bevelled planar front face, a first side face, a second side face on the opposite side of the multi-point probe from the first side face, and an end face on the opposite side of the multi-point probe from the front face. Each of the front face, first side face, second side face, and end face joins the bottom face and the top face. The front face and the bottom face define an acute internal front angle and a front edge between them. The first side face and the bottom face define a first side edge between them, the second side face and the bottom face define a second side edge between them, and the end face and the bottom face define an end edge between them. A longitudinal direction of the multi-point probe is defined along the first and second side edges and perpendicular to the front edge. The bottom face is provided with an electrically conducting metal layer and a set of engraved cuts dividing the metal layer into a plurality of contact pads, a plurality of electrical conduits, and a plurality of signal traces converging at the front edge to a probe tip. Each electrical conduit of the plurality of electrical conduits interconnects a respective contact pad of the plurality of contact pads and a signal trace of the plurality of signal traces. The plurality of contact pads is divided into a first row and a second row positioned beside each other and along the longitudinal direction. The first row and the first side edge define a first outer area of the bottom face between them, the second row and the second side edge defines a second outer area of the bottom face between them, while the first row and the second row defines an inner area between them. The plurality of electrical conduits is divided into an outer group and an inner group, where an electrical conduit of the outer group traverses either the first or the second outer area and an electrical conduit of the inner group traverses the inner area.

Here, the ordering of the plurality of contact pads into a first row and a second row and the simultaneous ordering of the plurality of contact pads into three groups as described allows for an efficient use of the limited area of the bottom face of the multi-point probe. In particular, the lengths of the electrical conduits can be minimized with respect to the areas of the contact pads and the outer areas. This is an advantage as large contact pads require less accurate positioning when connecting them and large outer areas allow for several supports to simultaneously engage the multipoint probe from its bottom face. As an example of the latter, the multi-point probe can have sufficiently large outer areas for them to rest on a first support and simultaneously be engaged by a second support, which enables a secure automated handling.

Additionally, two neighbouring contact pads of the first row of contact pads may be separated by a single engraved cut of the set of engraved cuts and two neighbouring contact pads of the second row of contact pads may be separated by a single engraved cut of the plurality of engraved cuts. These features have the advantage that, for constant inner and outer areas, they contribute to increase the areas of the contact pads. The shortest separation between a contact pad of the first row and a contact pad of the second row that are neighbouring may be defined by a single engraved cut of the plurality of engraved cuts. This feature has the advantage that it enables the inner area to be minimized, which means that the areas of the contact pads and/or outer areas can be made larger. Further, the inner area between the first row and the second row may be completely covered by the inner group of the plurality of electrical conduits and by the respective engraved cuts of the set of engraved cuts defining them. This has the advantage that the inner area is minimized with respect to the width and the geometry of the electrical conduits. This allows for the combined areas of the contact pads and the outer areas to be maximized. The plurality of electrical conduits may connect to the plurality of contact pads parallel to the longitudinal direction. This geometry allows for a minimization of the inner area and maximization of the outer areas with respect to the width of the electrical conduits and the areas of the contact pads.

The probe tip may comprise a number of probe arms being parallel to the bottom face and extending freely from the front edge. Each probe arm of the number of probe arms is provided with an electrically conducting metal layer in connection with a single signal trace of the plurality of signal traces. This feature is particularly favourable for automatic loading, as the freely extending probe arms are individually flexible, thereby allowing for small misalignments of the multi-point probe when measuring. A probe arm of the number of probe arms may define a length between its distal end and the front edge that is less than 0.1 mm. Further, the spacing between two neighbouring probe arms of the number of probe arms may be less than 0.02 mm.

Two or more signal traces of the plurality of signal traces may be interconnected for defining an electronic circuitry. The probe tip may comprise a contact detector comprising a cantilever freely extending from the front edge of the multi-point probe for contacting a test surface. This has the advantage that a test surface can be detected to prevent breakage of the probe arms. The contact detector may also be used for determining the distance between the front edge of the multipoint probe and a test surface. The contact detector may be connected to at least one contact pad of the plurality of contact pads via a respective signal trace of the plurality of signal traces. Further, the contact detector may be a cantilever strain gauge and the cantilever may be parallel to the bottom face and may be provided with an electrically conducting metal layer defining a first limb and a second limb at the front edge of the multi-point probe. The first and second limbs cross the front edge and interconnect a pair of signal traces of the plurality of signal traces via the freely extending cantilever. A pair of signal traces may be interconnected by a reference resistor having approximately the same form and dimensions as the cantilever strain gauge. This enables accurate contact detections by coupling the contact detector in a partly external Wheatstone bridge.

Additionally or alternatively, the first side face is bevelled and defines an acute internal first side angle between itself and the bottom face, the second side face is bevelled and define an acute internal second side angle between itself and the bottom face, and the end face is bevelled and defines an acute internal end angle between itself and the bottom face. The bevelled faces joining the top and bottom faces allows for an accurate positioning of the multi-point probe, which will be discussed further below.

The objects, advantages and features are according to a second aspect of the present invention obtained by a probe holder comprising a support column defining a top at its upper end, a bottom at its lower end. The top and bottom are joined by a front, a back positioned on the opposite side of the support column from the front, a first side, and a second side positioned on the opposite side of the support column from the first side. The support column constitutes a top part and a bottom part supporting the top part. The support column defines at its top a first shoulder at its first side and a second shoulder at its second side. The first shoulder defines an upward facing and rectilinear first shoulder engagement edge and the second shoulder defines an upward facing and rectilinear second shoulder engagement edge for engaging to a planar bottom face of multi-point probe. The first and second shoulders together define a supporting plane by their respective first and second shoulder engagement edges. The support column defines a hollow space below and between the first and second shoulders and further a single opening in its back and in its top to the hollow space.

Here, the hollow space and the single opening allow a multi-point probe resting on the shoulders of the support column to be securely gripped from behind by engaging both its top and bottom faces, which enables a secure automated loading.

The support column may further comprise an upwardly and outwardly extending tongue at its front. The tongue may be provided with a fiducial for enabling automated optical focusing. Further, the tongue may comprise a planar reference surface provided with an indentation. The indentation has a rim coplanar with the planar reference surface and the fiducial may be defined by the rim. As the dimensions of tongue and the position of the indentation are known, automated focusing on the fiducial allows for an accurate positioning relative to the support column when gripping a multi-point probe on its shoulders, which will be further apparent from the detailed description below.

The probe holder according to the second aspect of the present invention may further comprise a bracket. The bracket in turn comprises a bracket base, a bracket neck and a bracket head; where the bracket base is joined to the bottom part of the support column, the bracket neck is connected at its bottom to the bracket base, and the bracket head is connected to the top of the bracket neck. Further, the bracket neck is a resilient cantilever spring defining a resting position at its equilibrium position and a release position when being deflected away from the support column. The bracket head comprises a pair of support pins positioned above the column body, each support pin of the pair of support pins defining a straight pin engagement edge at its side facing the other support pin for engaging a bevelled planar front face or end face of a multi-point probe. The pair of support pins together defines an engagement plane by their respective pin engagement edges. This bracket has the advantage that it secures a multi-point probe to the shoulders of a support column. If prevented from movements by the support tips, and their straight pin engagement edges in combination with the bevelled and planar front and end faces of the multi-point probe enables an accurate positioning on the shoulders of the support column.

The engagement plane defined by the pair of support pins may be parallel to the supporting plane defined by the first and second shoulders when the bracket neck is in its resting position. This way, when engaging the bevelled and planar front and end faces by the straight pin engagement edges, the force translated to the multi-point probe from the bracket neck will be small or non-existent. This is an advantage, as a large force can wedge the multi-point probe between the support pins, or cause the multi-point probe to shift its position when it is disengaged.

Additionally or alternatively, the bracket head further comprises a sloping head face on its side facing the support column. The sloping head face defines a plane having a normal defining a non-zero angle to a horizontal plane when the bracket neck is in its resting position. This feature has the advantage that the bracket head can be disengaged from a multi-point probe on a support column by simply moving an object vertically downward upon the sloping head face, which will deflect the bracket head away from the multi-point probe. The flexibility of the bracket neck may increase in a direction from the bracket base to the bracket head, by which the bracket head will disengage by both turning the support pin up from the multi-point probe when the bracket head is deflected away by deflecting the bracket head. The bracket neck may be provided with an aperture having a width that increases in a direction from the bracket base to the bracket head. This technical realisation of the previous feature has the advantage that it is both stable against torsions and sideways flexing of the bracket neck.

The objects, advantages and features are according to a third aspect of the present invention obtained by a probe cassette comprising a cover, a rack and a probe support attached to the rack for supporting one or more multi-point probes. The probe cassette defines a closed state in which the cover and the rack are connected and enclose the probe support and an open state in which the cover and the rack are disconnected. The cover is provided with parallel grooves defining an upward facing first flanged slide support; and the rack is provided with parallel grooves defining a downward facing second flanged slide support. The first flanged slide support is positioned above and extending in the same direction as the second flanged slide support when the probe cassette is in its closed state. By this, the cassette allows for an easy and secure handling of multi-point probes when loading, unloading and transporting multi-point probes. A multi-point probe can only be applied a limited number of times and a safe transport is therefore essential. Additionally or alternatively, the probe support can receive a plurality of multi-point probes, which has the advantage that several multi-point probes can be sent in one secure vessel or cassette. Additionally, the cover further comprises a handle and the rack may further be provided with a recess in the second flanged slide support, where the recess is provided with a catch bar defining a right angle to the grooves defining the second flanged slide support. The handle allows for an easy and secure handling of the cassette, while the groove allows for an easy opening of the cassette. The cassette may further comprise a lock providing a releasable locking of the cover to the rack in the closed state of the cassette. This will prevent a cassette from being unintentionally opened, which otherwise present would be a risk during transport. The lock will also prevent easy tampering with the multi-point probes.

The cover may further comprise a pad connector accessible from the outside of the cassette in its closed state, a female connector accessible from the inside of the cassette in its closed state, and an electrical connection between the pad connector and the female connector. Further, the probe cassette may further comprise a non-volatile digital memory being provided with a protective housing and a male connector compatible with the female connector. The female and male connectors provide a release able support of the non-volatile digital memory when connected. This allows information about a multi-point probe to be stored in the same cassette as it is physically transported or stored in. Further, the releasable support has the advantage that the non-volatile digital memory does not have to be connected to a computer via the pad connectors of the cover, but can instead be directly connected to a female connector of the computer. The non-volatile digital memory may contain information corresponding to the number of performed engagements between a multi-point probe and a test sample. This information may be related to the wear of the contact arms on the multi-point probe and may be used to decide when to replace it. The non-volatile digital memory may contain information corresponding to the operational parameters when employing the multipoint probe in measurements. These operational parameters can for example be the above-mentioned number of performed engagements. Other examples of operational parameters that may be important for the wear of the probe arms of the multi-point probe are the currents running through them, the pressure with which they are applied to a test surface, and the structure and material of the test surface.

Other information may be an identification number and/or technical specifications. The technical specifications can be the number of probe arms, the geometric configurations of the same, and the materials from which the multi-point probe has been manufactured.

Additionally, the probe holder of the probe cassette according to the third aspect of the present invention may be a probe holder according to the second aspect of the present invention. This allows for a cassette that can easily be loaded and unloaded in an automated handling, as should be obvious from the description above.

The objects, advantages and features are according to a fourth aspect of the present invention obtained by a probe manipulator head comprising a contact tongue defining a tip. Further, the contact tongue comprises a plurality of contact fingers being electrically conducting and extending freely from its tip for engaging a corresponding plurality of contact pads on the bottom face of a multi-point probe. Each contact finger of the plurality of contact fingers has a distal end and the plurality of contact finger together defines a contact plane by their distal ends. The contact plane enables a secure simultaneous connection between all of the contact fingers and a planar contact surface, e.g. the bottom surface of a multi-point probe according to the first aspect of the present invention. When the contact plane is coplanar with the bottom surface, then all of the contact fingers are engaged. The contact tongue enables repeated engagements of the manipulator in which it releasably connected to a multitude of multi-point probes.

The contact fingers of the plurality of contact fingers may be parallel and extend in a common direction. Preferably the contact fingers are flexible, whereby the fact that the contact fingers are parallel means that the contact fingers flex in more or less the same way, which means that for shifts parallel to the contact surface, the contact fingers will not break a physical contact with a multi-point probe with its bottom surface coplanar with the contact surface. The contact fingers may have a rhombic cross section. Further, this feature enables the contact fingers to establish a higher engagement force against the contact pads, which will improve the electrical conductivity between them. Further, the contact plane may define an engagement angle to the common direction of the plurality of contact fingers. Assume that the contact fingers are parallel to a horizontal plan, then this feature allows for the tip of a multi-point probe engaged at its bottom face by the contact tongue to be located below and in front of all of the contact fingers, i.e. it allows for a favourable orientation of the multi-point probe.

Additionally or alternatively, the plurality of contact fingers may be divided into a first column and a second column. The contact fingers of the first column lay in a first plane and the contact fingers of the second column lay in a second plane, where the first plane and the second plane are parallel. This means that only a narrow portion at the centre of the bottom face of an associated multi-point probe has to be occupied by contact pads, leaving substantial areas at the sides of the multi-point probe for gripping. See further the multi-point probe according to the first aspect of the present invention, for which the contact fingers in the two columns are particularly suitable for connecting to the contact pads in the two rows.

The probe manipulator head according to the fourth aspect of the present invention may further comprise a mandible defining a front. The mandible in turn comprises at its front a first probe-support molar defining a first support plane and a second probe-support molar defining a second support plane for in unison engaging a planar bottom face of a multi-point probe. The first probe-support molar and the second probe-support molar are separated, and the first support plane and the second support plane are coplanar and define a common tangential support plane between the first probe-support molar and the second probe-support molar. The contact tongue and the mandible define a tongue engagement orientation relative to one another in which the plurality of contact fingers crosses the common support plane. This allows for a simultaneous connection of the contact fingers and probe support molars to the bottom face of a multi-point probe, in particular to a probe according to the first aspect of the present invention.

The contact tongue and the mandible may define a tongue disengagement orientation relative to one another, in which the plurality of contact finger are all on one side of the common support plane. This allows for the mandible to first engage the multi-point probe before the contact tongue. When gripping the multi-point probe, the contact tongue could otherwise shift the position of the multi-point probe before it is engaged by the mandible, thereby causing a misalignment.

Further, each of the first probe-support molar and the second probe-support molar may comprise a convex engagement surface having an engagement point for engaging the bottom face of a multi-point probe. The first support plane may be coplanar with the tangential plane to the engagement point and the convex engagement surface of the first probe-support molar. Similarly, the second support plane may be coplanar with the tangential plane to the engagement point and the convex engagement surface of the second probe-support molar. This has the advantage that no sharp edge will engage the bottom face of a multi-point probe, which could otherwise release particles by scraping off material from the bottom face. Further, two engagement areas will allow more freedom in the adjustment of the position of a multipoint probe when it is engaged by the mandible.

The probe manipulator head according to the fourth aspect of the present invention may further comprise a maxilla defining a front. The maxilla comprises a pivot axis providing a pivotal support for the mandible and the contact tongue, and a turn actuator coupled via a mechanical linkage to the mandible and the contact tongue. The pivot axis, the turn actuator, the mechanical linkage, and the mandible define a variable separation between the front of the mandible and the front of the maxilla. The variable separation is varied by turning the turn actuator and has a minimum separation defining a closed position for the mandible. This enables a secure gripping of a multi-point probe by the manipulator head. Further, the variable separation may return cyclically to the same separation after a single complete turn of the turn actuator. This way a play induced when changing the direction of rotation of the actuator can be avoided, giving a better defined minimum separation and a more accurate gripping. At a constant turning of the turn actuator the rate of change of the variable separation may reach a minimum at the closed position, which will further increase the accuracy of the gripping as it enables a better determination minimum separation.

The front of the maxilla may define a palate for receiving a multi-point probe, the palate has a front engagement edge, an end engagement edge positioned on the opposite side of the palate from the front engagement edge, and a first and a second side engagement edge positioned on opposite sides of the palate and between the front and end engagement edges. The front and end engagement edges are parallel to each other and to the common support plane between the first and second probe-support molars when the mandible is in its closed position. The first and second side engagement edges are parallel to each other and to the common support plane between the first and second probe-support molars when the mandible is in its closed position. This allows for an accurate positioning of a multi-point probe having a bevelled front, end, and side faces in the grip of the probe manipulator. A multi-point probe according to the first aspect of the present invention is particularly suitable for being engaged by the proposed maxilla.

The maxilla may further comprise a first probe-support incisor and a second probe-support incisor, each having a rounded support tip at its distal end for engaging a bevelled planar front face of a multi-point probe. The rounded support tip of the first probe-support incisor and the rounded support tip of the second probe-support incisor define the front engagement edge. This will enable the probe tip of a multi-point probe engaged by the probe manipulator head to be viewed from above. This in turn enables visual inspection of the probe tip and supervision of the probe tip when it engages a test sample. The maxilla may also comprise a cantilever spring extending from the palate toward the common support plane between the first and second probe-support molars for engaging the top face of a multi-point probe. The spring will hold a multi-point probe in position when it is engaged by the maxilla, thereby allowing a more accurate positioning in the grip of the probe manipulator head. This feature is particularly favourable in combination with a multi-point probe resting on the shoulders of a support column of a probe holder according to the second aspect of the present invention.

The objects, advantages and features are according to a fifth aspect of the present invention obtained by a probe loader comprising a horizontal support stage and a vertical support stage rigidly connected to the horizontal support stage, a horizontal loader supported by the horizontal support stage, and a vertical loader supported by the vertical support stage. The horizontal loader comprises a first loader arm defining a horizontal first loading axis and a second loader arm defining a horizontal second loading axis. The first loading axis and the second loading axis jointly define a crossing angle. The horizontal loader further comprises a first linear actuator, a first wagon, a second linear actuator, and a second wagon. The first loader arm is rigidly connected to the horizontal support stage and provides a sliding support for the first wagon, and the first linear actuator provides a variable position of the first wagon along the first loading axis. The second loader arm is rigidly connected to the first wagon and provides a sliding support for the second wagon, and the second linear actuator provides a variable position of the second wagon along the second loading axis. The probe loader further comprises a cover holder rigidly connected to the horizontal support stage and provided with flanges defining a downward facing first receiving flanged slide support for cooperating with the first flanged slide support of a cover of a probe cassette. The second wagon comprises a rack holder provided with flanges defining an upward facing second receiving flanged slide support for cooperating with the second flanged slide support of a rack of a probe cassette. The proposed probe loader allows a cassette to be in its open state and the racket to change its horizontal position, which allows for an automated and secure handling of a probe cassette without a direct manual intervention by an operator. Further, the horizontal support stage enables a multi-point probe carried by a rack of a probe cassette to be moved into position for engagement by the vertical loader, without the vertical loader having to move in a horizontal direction. This way a high accuracy of the horizontal position of the vertical loader can be reached, and consequently also of the position of a multi-point probe engaged by the vertical loader.

The vertical loader may comprise a vertical loader arm defining a vertical loading axis, a vertical linear actuator, and a probe gripper for engaging a multi-point probe supported by a probe support attached to a rack supported by the rack holder. The vertical loader arm may be rigidly connected to the vertical support stage and provide a sliding support for the probe gripper, and the vertical linear actuator may provide a variable position of the probe gripper along the vertical loading axis. This way, the vertical position of the multipoint probe can be varied after it has been engaged by the probe gripper of the vertical loader, which allows a loading of multi-point probe to the vertical loader, even though a test substrate is located below it.

The probe loader may define a loading position in which the rack holder is located at the cover holder with the second receiving flanged slide support positioned below and parallel to the first receiving flanged slide support, and a gripping position in which the rack holder is located at the probe gripper with the second receiving flanged slide support positioned below the probe gripper. This allows for the loading of a cassette in its closed state according to the third aspect of the present invention, after which it can be changed to its open state by moving the rack holder in a direction parallel to the flanged receiving slide supports. Further, it also allows a multi-point probe carried by the rack of the cassette to be engaged by the probe gripper. The probe gripper may comprise a probe manipulator head according the fourth aspect of the present invention, which will enable an accurate and secure automated positioning of a multi-point probe according to the first aspect of the present invention in relation to the horizontal and vertical support stages, which is paramount for achieving a high spatial accuracy in measurements on a test substrates supported by the horizontal support stage.

The objects, advantages and features are according to a sixth aspect of the present invention obtained by a multi-point measuring system comprising a multi-point probe according to the first aspect of the present invention and a probe manipulator head according the third aspect of the present invention, wherein at least one of the plurality of contact fingers of the contact tongue is connected by its distal end to a contact pad of the plurality of contact pads of the multi-point probe in a releasable connection. As the contact pads are connected to the probe arms, input signals can be sent and output signals can be received through the contact fingers. The contact finger may be connected to a measurement system providing input signals and analysing output signals. Further, the first outer area of the multi-point probe may be parallel to the first support plane and engaged by the first probe-support molar of the mandible, while the second outer area of the multi-point probe is parallel to the second support plane and engaged by the second probe-support molar of the mandible. This will provide a secure and repeatable grip of by the manipulator head, which is essential for achieving high stability in the measuring performance of identical multi-point probes that are replaced repeatedly. Additionally or alternatively, the bevelled planar front face is parallel to and engaged by the front engagement edge of the maxilla, the first side face is parallel to and engaged by the first side engagement edge of the maxilla, the second side face is parallel to and engaged by the second side engagement edge of the maxilla, and the end face is parallel to and engaged by the end engagement edge of the maxilla. As discussed above, this will prove an accurate positioning of the multi-point probe in relation to the manipulator head.

The objects, advantages and features are according to a seventh aspect of the present invention obtained by a loaded multi-point probe holder comprising a multi-point probe according to the first aspect of the present invention and a probe holder according to the second aspect of the present invention. The first outer area of the multi-point probe is in contact with the first shoulder of the support column and parallel to the first shoulder engagement edge, and the second outer area of the multi-point probe is in contact with the second shoulder of the support column and parallel to the second shoulder engagement edge. This has the advantage that the multi-point probe is accessible from the back, the below, and the top, allowing it to be removed from the probe holder in a secure grip engaging its upper and lower faces simultaneously. Additionally, the bevelled planar front face of the multi-point probe may be parallel to and engaged by the pin engagement edge of one of the pair of support pins of the bracket, and the end face of the multi-point probe may be parallel to and engaged by the pin engagement edge of the other of the pair of support pins of the bracket. This way, the probe holder will provide a secure hold on the multi-point probe that is simultaneously in an accurately defined position relative to the support column. This in turn enables an accurate positioning of the multi-point probe in the grip of a probe manipulator head.

The objects, advantages and features are according to an eighth aspect of the present invention obtained by a loaded multi-point probe cassette comprising a probe cassette according to the third aspect of the present invention, wherein the probe support of the probe cassette is a loaded multi-point probe holder according to the seventh aspect of the present invention. Clearly, this will combine the advantages of the two aspects, in particular the security provided by them both. The non-volatile digital memory may contain information corresponding to the number of performed measurement engagements by the multi-point probe of the loaded multi-point probe storage system. Due to wear, a multi-point probe can only be engaged a limited number of times. It can be reused after renovation, by which it is a logistic advantage to have information about the multi-point probe stored at its physical location. Other information than the number of engagements may be contained within the non-volatile digital memory, such as an identification number and technical specifications. The technical specifications can be the number of probe arms and the materials it has been manufactured of, and also changes or additions performed during earlier renovations.

The objects, advantages and features are according to a ninth aspect of the present invention obtained by a multi-point probe gripping system comprising a probe holder according to the second aspect of the present invention and a probe manipulator head according to the fourth aspect of the present invention. The probe holder and the probe manipulator head define an engagement position relative to one another, in which the contact plane defined by the plurality of contact fingers of the contact tongue is coplanar with the supporting plane defined by the first and second shoulders of the support column, and the plurality of contact fingers traverses the hollow space defined by the support column from the back to the top of the support column through the single opening. This allows for a multi-point probe supported on the shoulders of the support column to be engaged by the contact tongue. Further, in the engagement position the bracket neck of the bracket may be held in the release position by engaging the bracket head of the bracket by the front of the maxilla. This has the advantage of a simpler technical realisation in that no additional mechanism for engaging the bracket neck is necessary.

The objects, advantages and features are according to a tenth aspect of the present invention obtained by a loaded probe loader comprising a probe loader according to the fifth aspect of the present invention and a probe cassette according to the third aspect of the present invention, wherein the first flanged slide support of the cover of the cassette cooperates with the first receiving flanged slide support of the cover holder of the probe loader, and the second flanged slide support of the rack of the cassette cooperates with the second receiving flanged slide support of the rack holder of the probe loader. This allows for a secure and protected transition of a probe cassette from its closed to its open state, as the cassette is not opened before it is loaded into the probe loader. Additionally, in the loading position of the probe loader the probe cassette may be in its closed state, and in the gripping position of the probe loader the probe cassette may be in its open state.

The objects, advantages and features are according to an eleventh aspect of the present invention obtained by a method for connecting a multi-point probe to a probe manipulator head comprising the steps of: providing a multi-point probe according to the first aspect of the present invention, providing a probe manipulator head according to the fourth aspect of the present invention, and connecting at least one of the plurality of contact fingers of the contact tongue by its distal end to a contact pad of the plurality of contact pads of the multi-point probe in a releasable connection. This enables an automated loading of the multi-point probe in the manipulator head. The method for connecting a multi-point probe to a probe manipulator may further comprise the steps of: engaging the first outer area of the multi-point probe by the first probe-support molar of the mandible in a parallel relationship between the first outer area and the first support plane, and engaging the second outer area of the multi-point probe by the second probe-support molar of the mandible in a parallel relationship between the second outer area and the second support plane. This enables a secure and accurate engagement of the multi-point probe by the manipulator head. Further, the method for connecting a multi-point probe to a probe manipulator head may further comprise the steps of: engaging the bevelled planar front face by the front engagement edge of the maxilla in a parallel relationship between them, engaging the first side face by the first side engagement edge of the maxilla in a parallel relationship between them, engaging the second side face by the second side engagement edge of the maxilla in a parallel relationship between them, and engaging the end face by the end engagement edge of the maxilla in a parallel relationship between them. This further improves the accuracy by which the multi-point probe is positioned in the grip of the manipulator head.

The objects, advantages and features are according to a twelfth aspect of the present invention obtained by a method for loading a probe holder with a multi-point probe comprising the steps of: providing a multi-point probe according to the first aspect of the present invention, providing a probe holder according to the second aspect of the present invention, engaging the first outer area of the multi-point probe by the first shoulder of the support column in a parallel relationship between the first outer area and the first shoulder engagement edge, and engaging the second outer area of the multi-point probe by the second shoulder of the support column in a parallel relationship between the second outer area and the second shoulder engagement edge. This enables the multi-point probe to be engaged from behind in a secure grip engaging it both from above and below. The method for loading a probe holder with a multi-point probe may further comprise the steps of: engaging the bevelled planar front face of the multi-point probe by the pin engagement edge of one of the pair of support pins of the bracket in a parallel relationship between them, and engaging the end face of the multi-point probe by the pin engagement edge of the other of the pair of support pins of the bracket in a parallel relationship between them. This allows for the probe tip to be held in place and positioned accurately on the support column.

The objects, advantages and features are according to a thirteenth aspect of the present invention obtained by a method for loading a probe cassette with a multi-point probe comprising the steps of: providing a multi-point probe according to the first aspect of the present invention, providing a probe cassette according to the third aspect of the present invention, and loading the probe support of the probe cassette with the multi-point probe. This enables a secure handling and transport of the multi-point probe. The method for loading a probe cassette with a multi-point probe may further comprise the step of: storing information corresponding to the number of performed measurement engagements by the multi-point probe in the non-volatile digital memory. As should be obvious from above, this is advantageous for determining the time for replacement of the multi-point probe.

The objects, advantages and features are according to a fourteenth aspect of the present invention obtained by a method for engaging a probe holder by a probe manipulator head comprising the steps of: providing a probe manipulator head according to the fourth aspect of the present invention, providing a probe holder according to the second aspect of the present invention, and positioning the probe holder and the probe manipulator head in an engagement position relative to one another in which the contact plane defined by the plurality of contact fingers of the contact tongue is coplanar with the supporting plane defined by the first and second shoulders of the support column, and the plurality of contact fingers traverses the hollow space defined by the support column from the back to the top of the support column through the single opening. This enables an automated loading of a multi-point probe in the probe manipulator head before it is employed in a measurement. The method for engaging a probe holder by a probe manipulator head may further comprise the step of: holding the bracket neck of the bracket in the release position by engaging the bracket head by the front of the maxilla. This enables the multi-point probe to be securely removed from the probe holder by the manipulator head.

SHORT DESCRIPTION OF THE DRAWINGS

A multitude of embodiments of the different aspects of the present invention are depicted below, where:

Figure 4B:
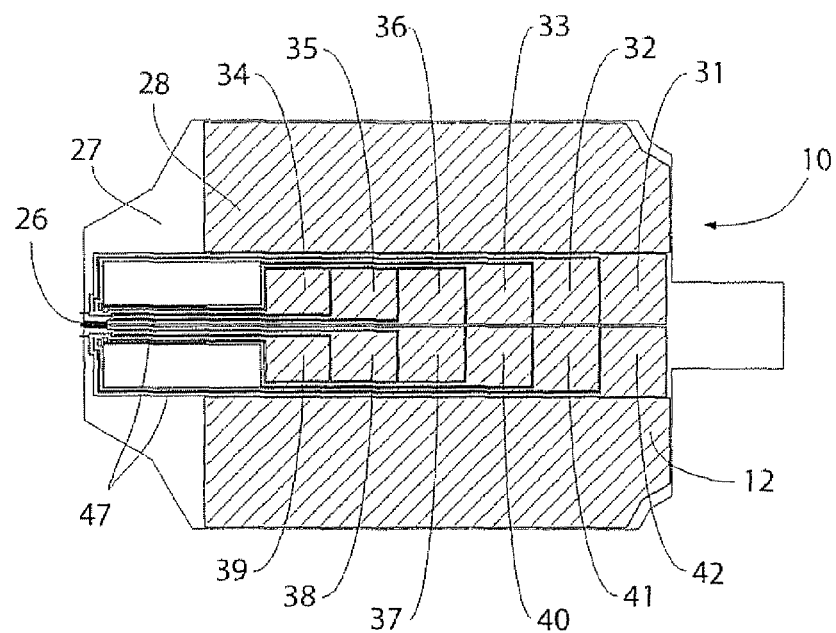
Figure 6B:
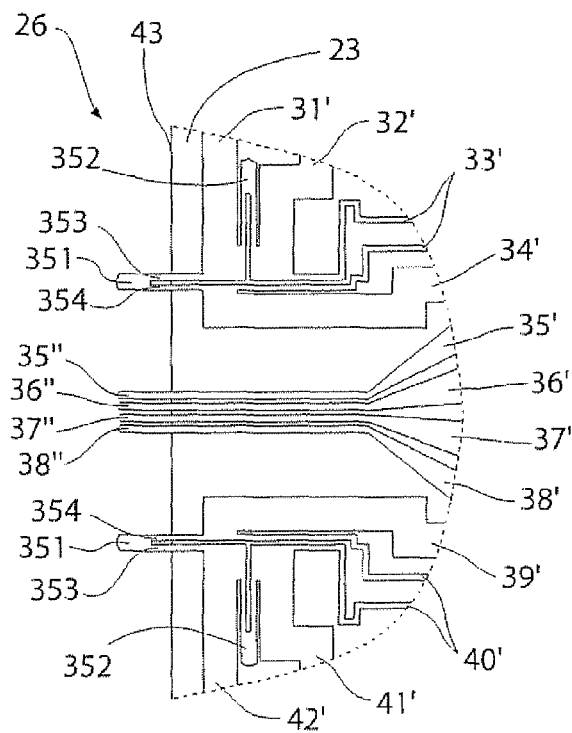
Figure 12:
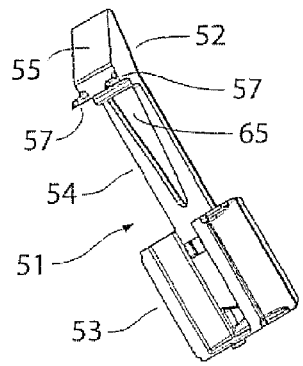
Figure 13:
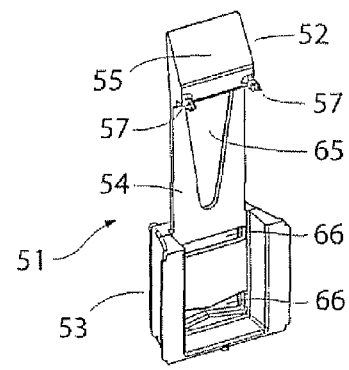
Figure 14:
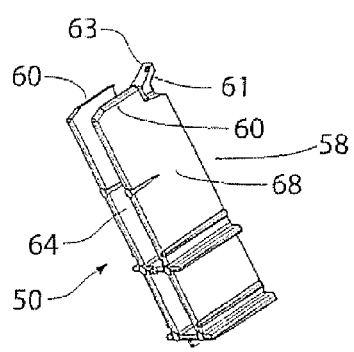
Figure 15:
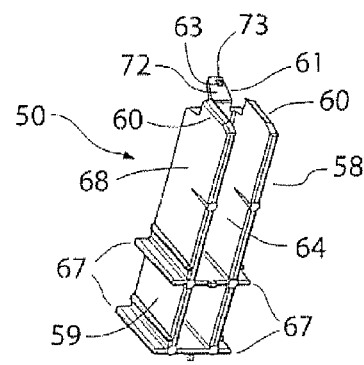
Figure 16:
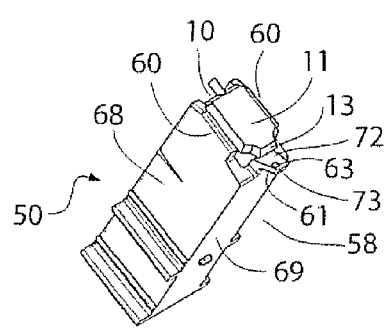
Figure 17:
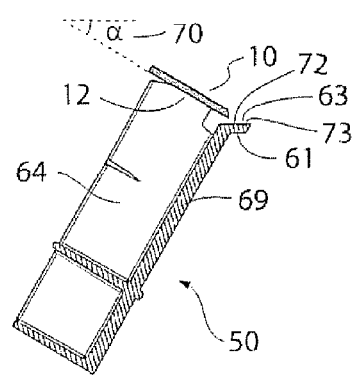
Figure 18:
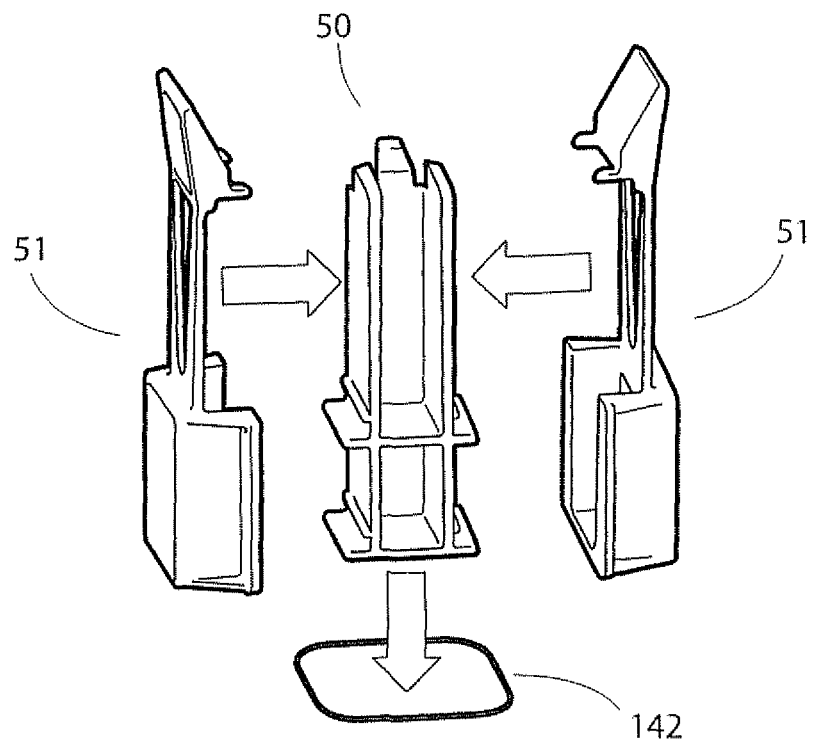
Figure 19:
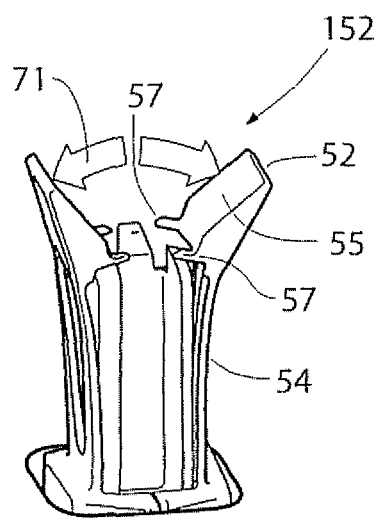
Figure 20:
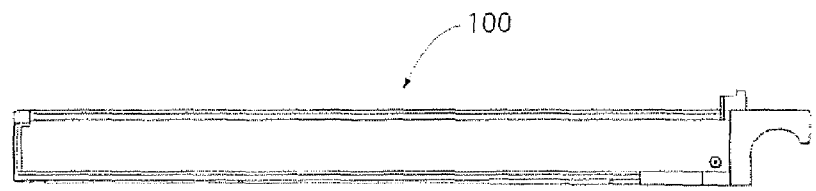
Figure 21:
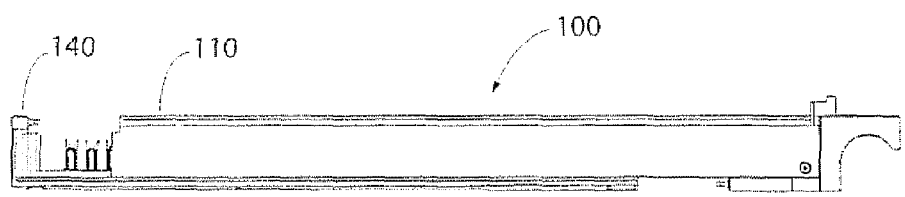
Figure 22:
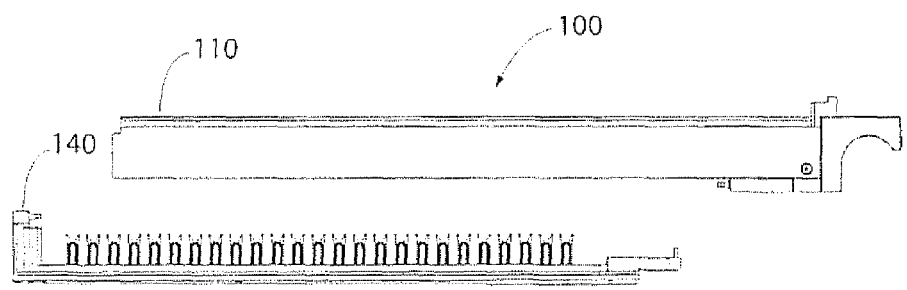
Figure 23:
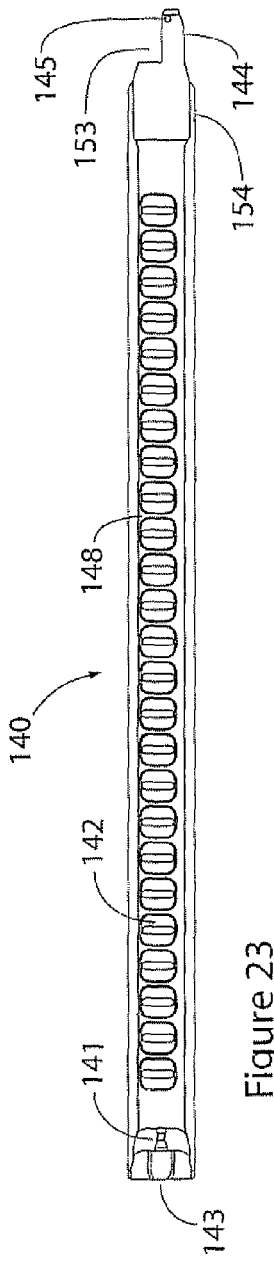
Figure 25:
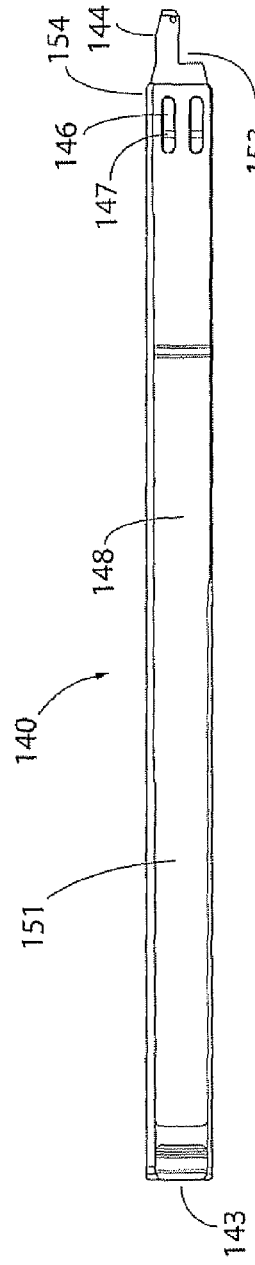
Figure 26:
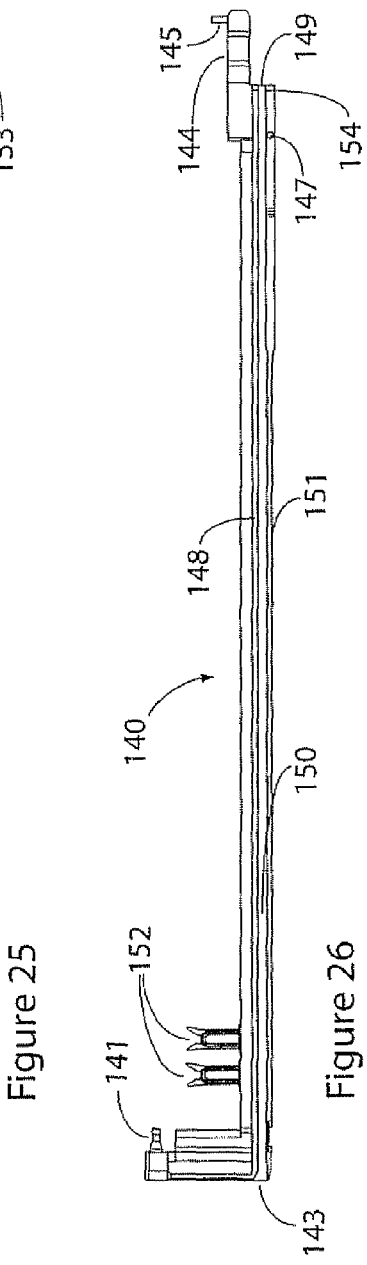
Figure 24:
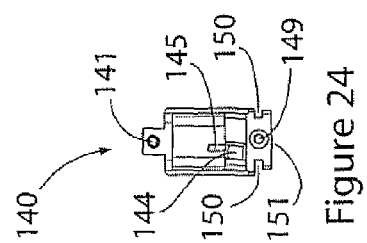
Figure 27:
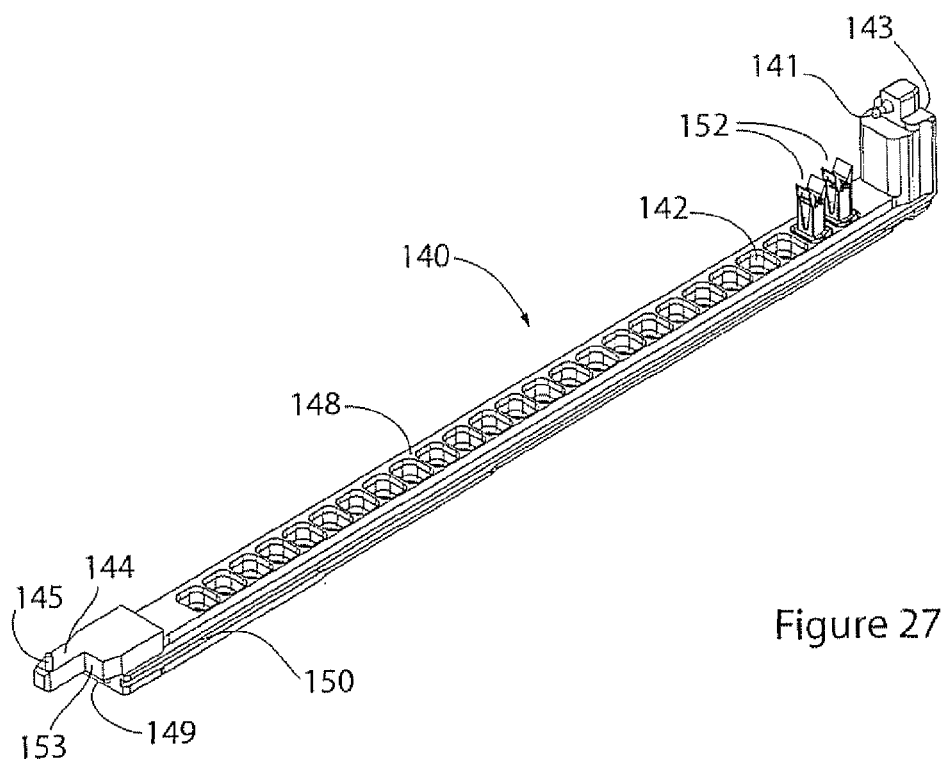
Figure 28:
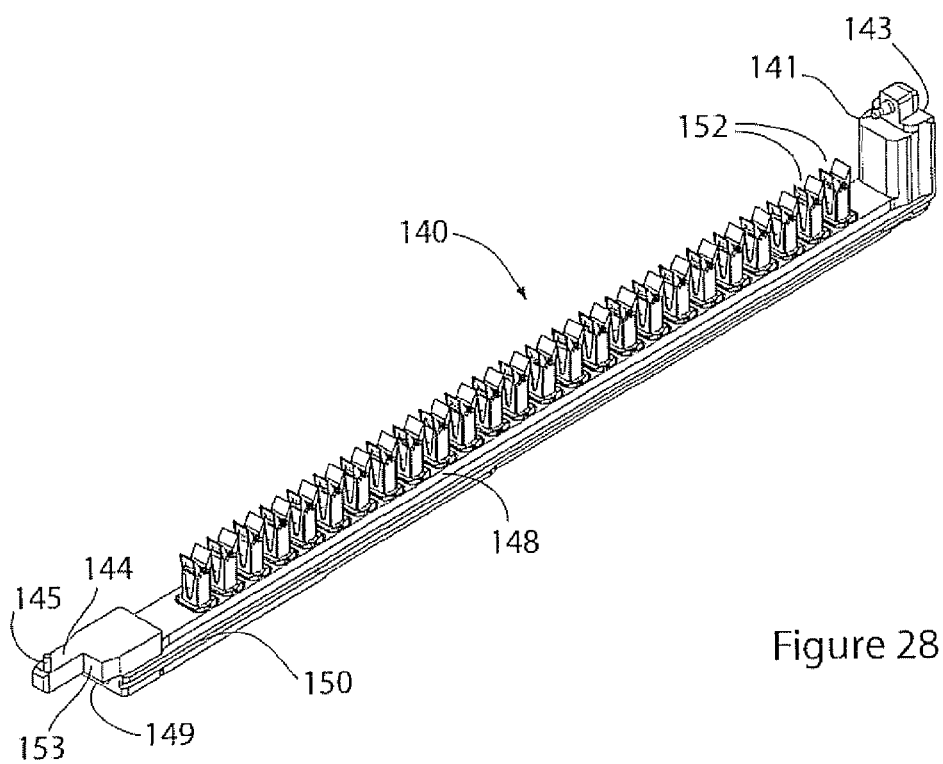
Figure 29:
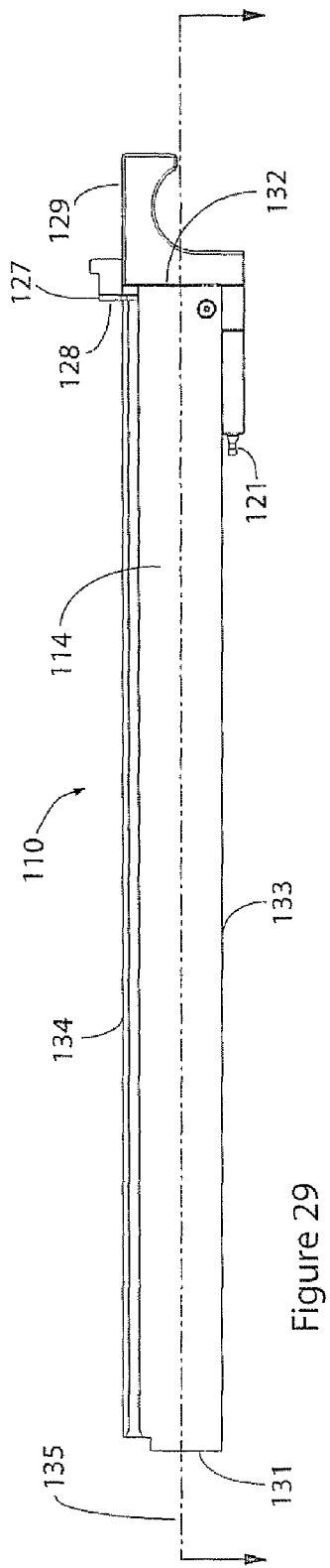
Figure 30:
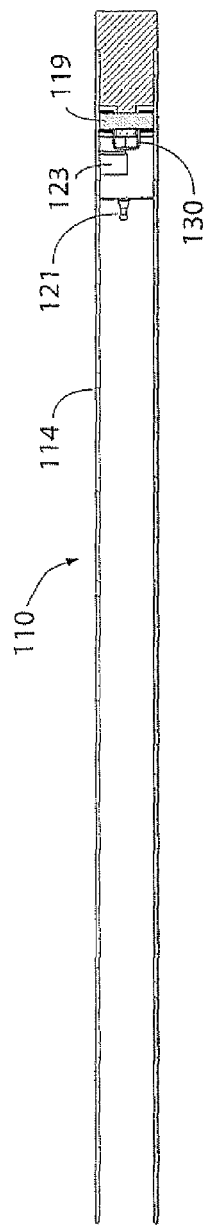
Figure 31:
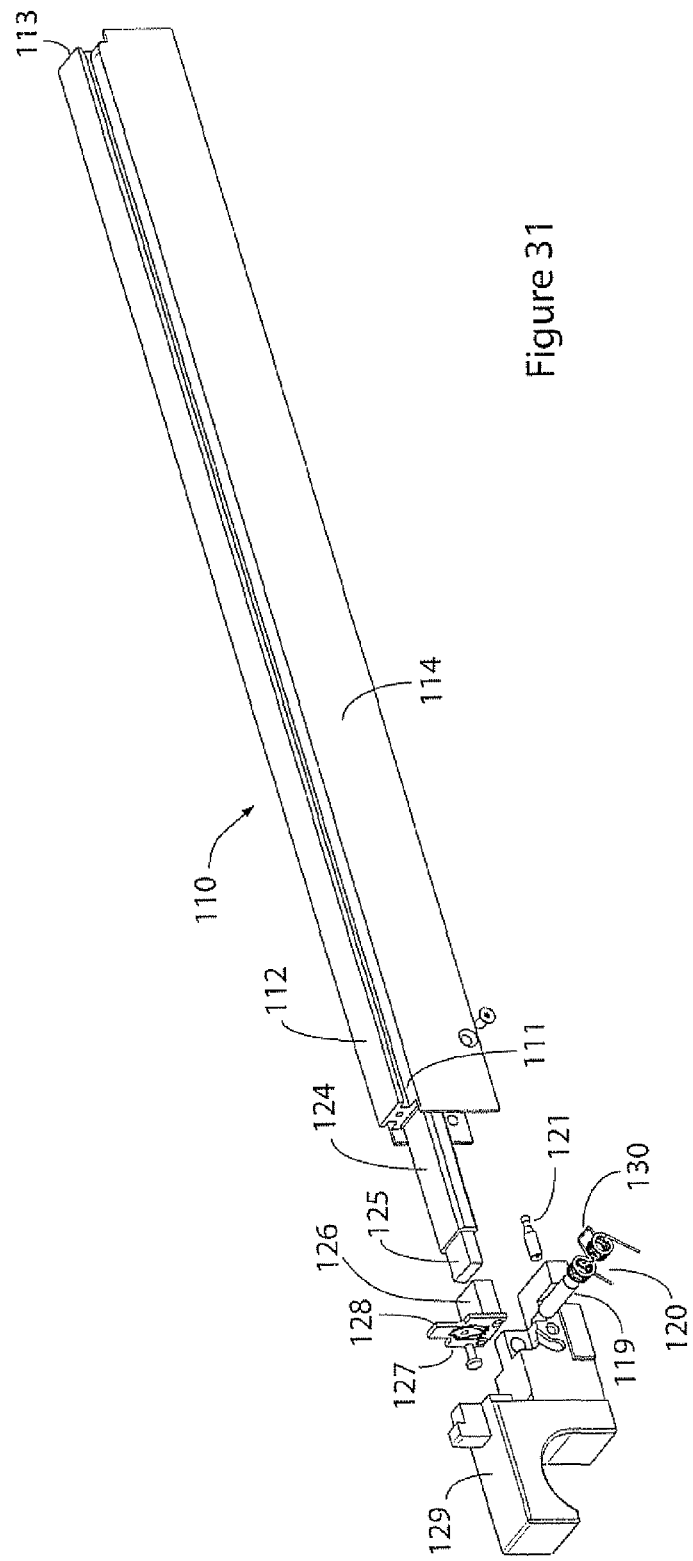
Figure 32:
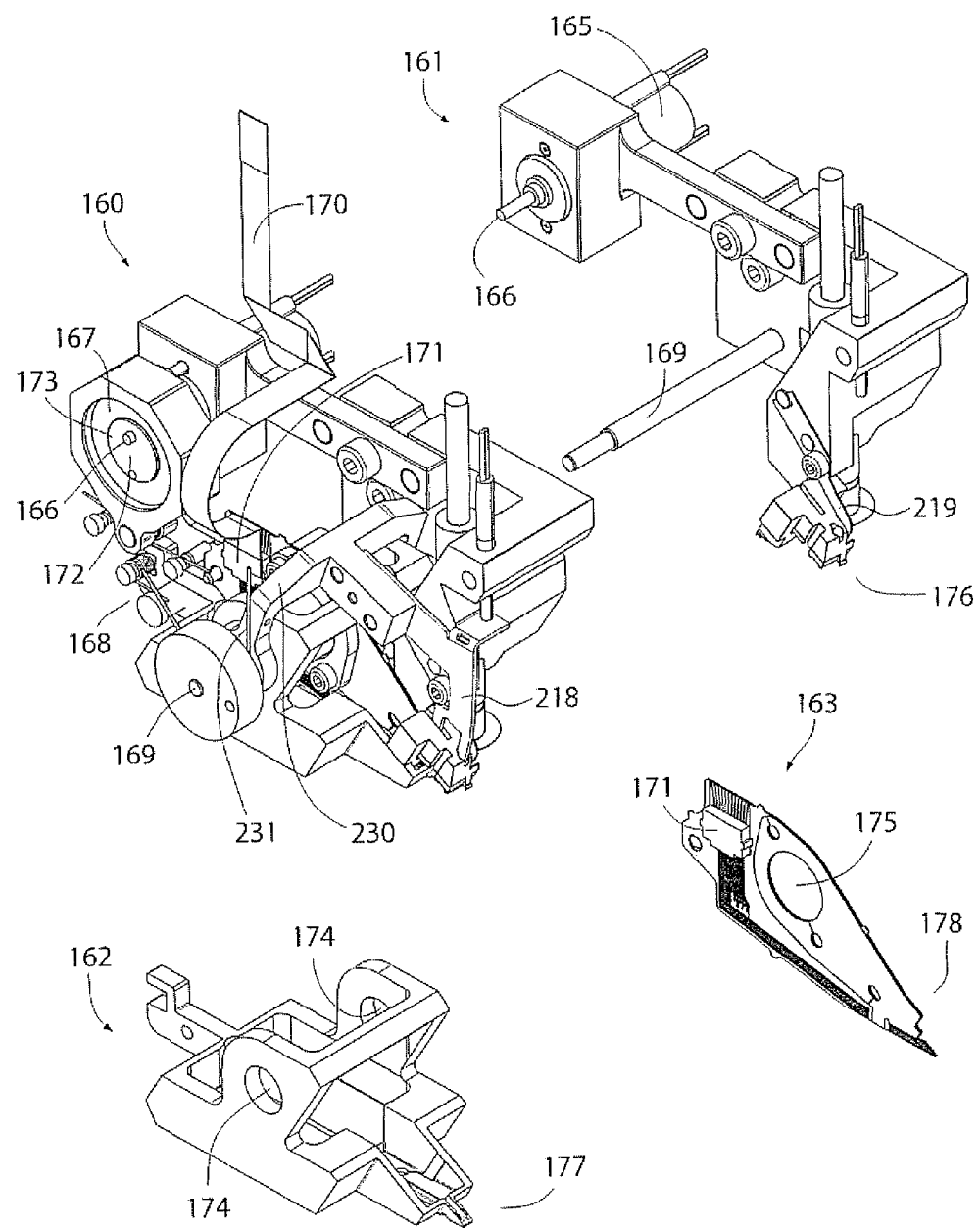
Figure 33A:
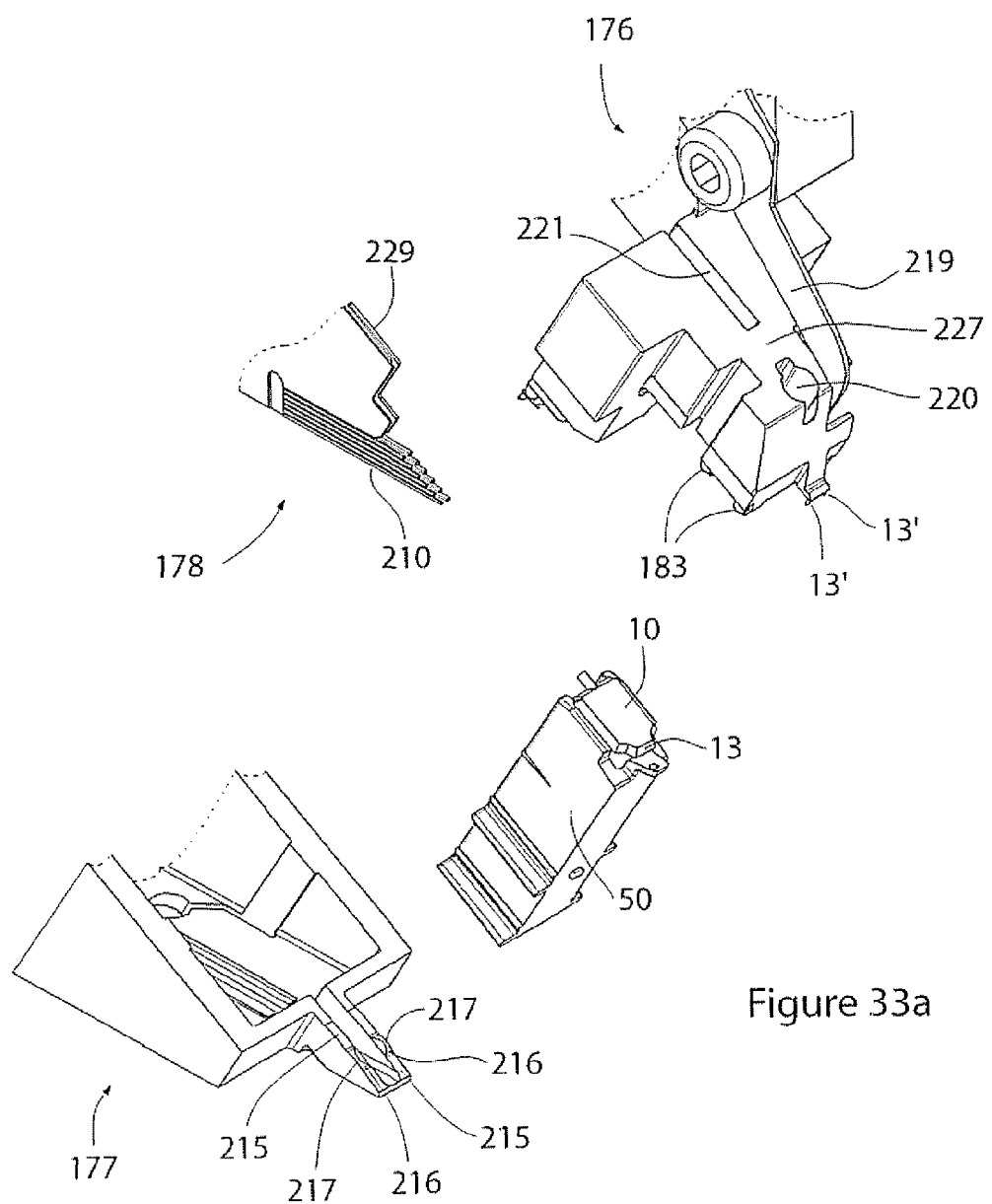
Figure 33B:
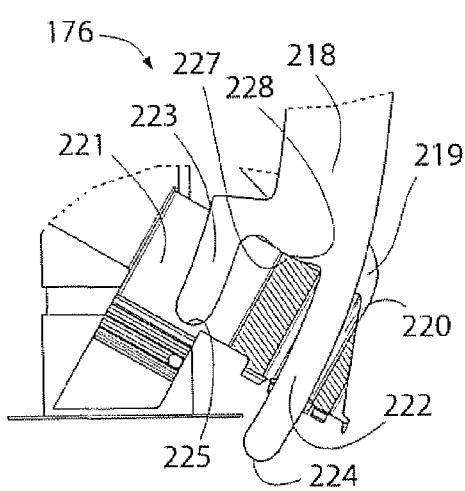
Figure 33C:
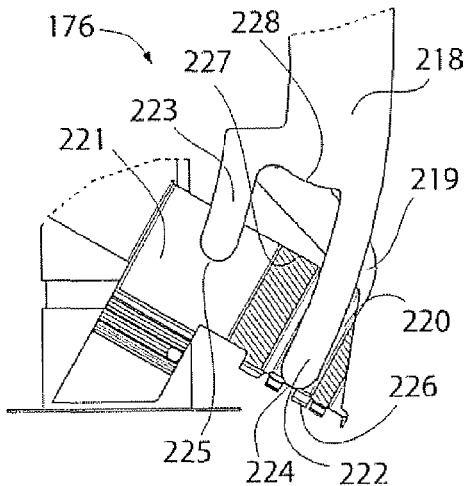
Figure 33D:
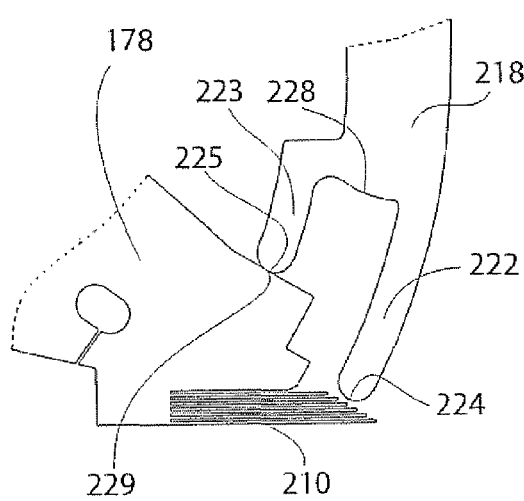
Figure 33E:
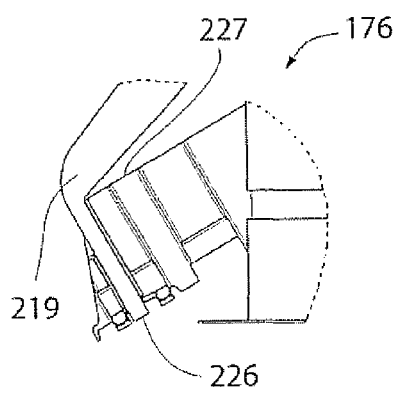
Figure 34:
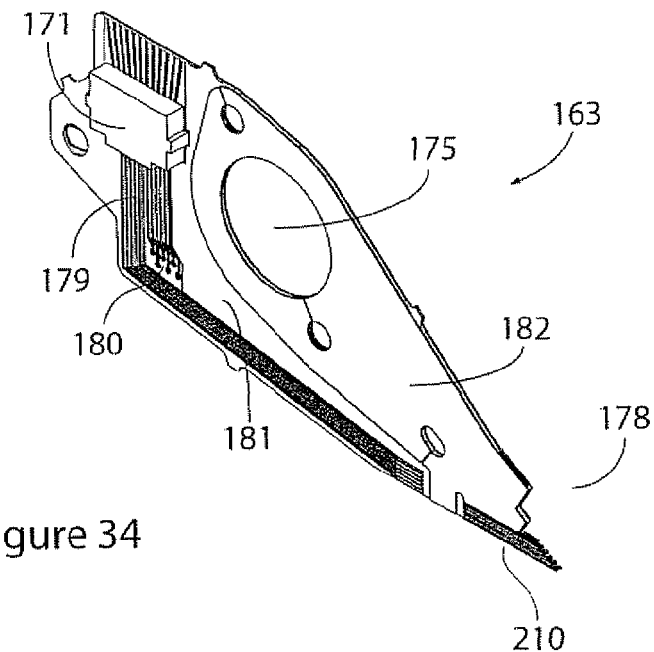
Figure 35A:
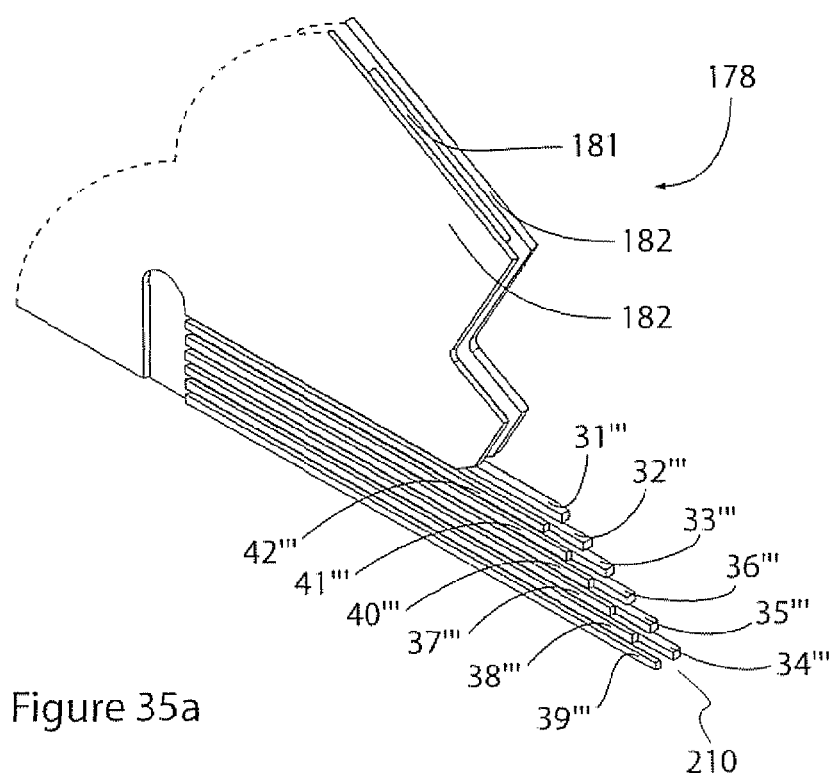
Figure 35B:
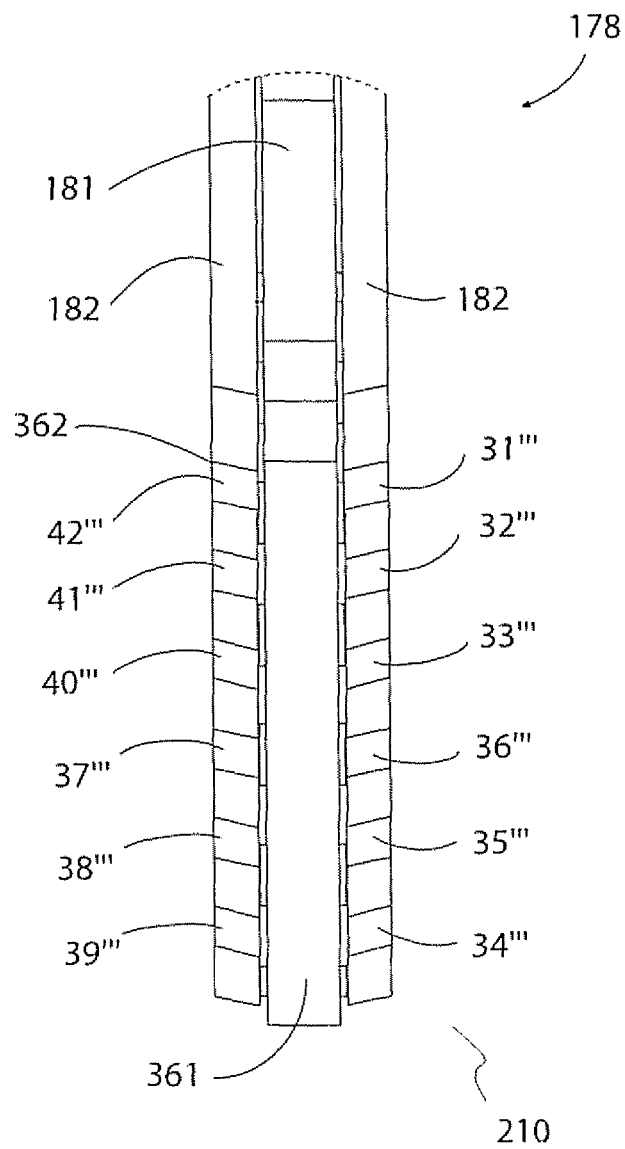
Figure 36:
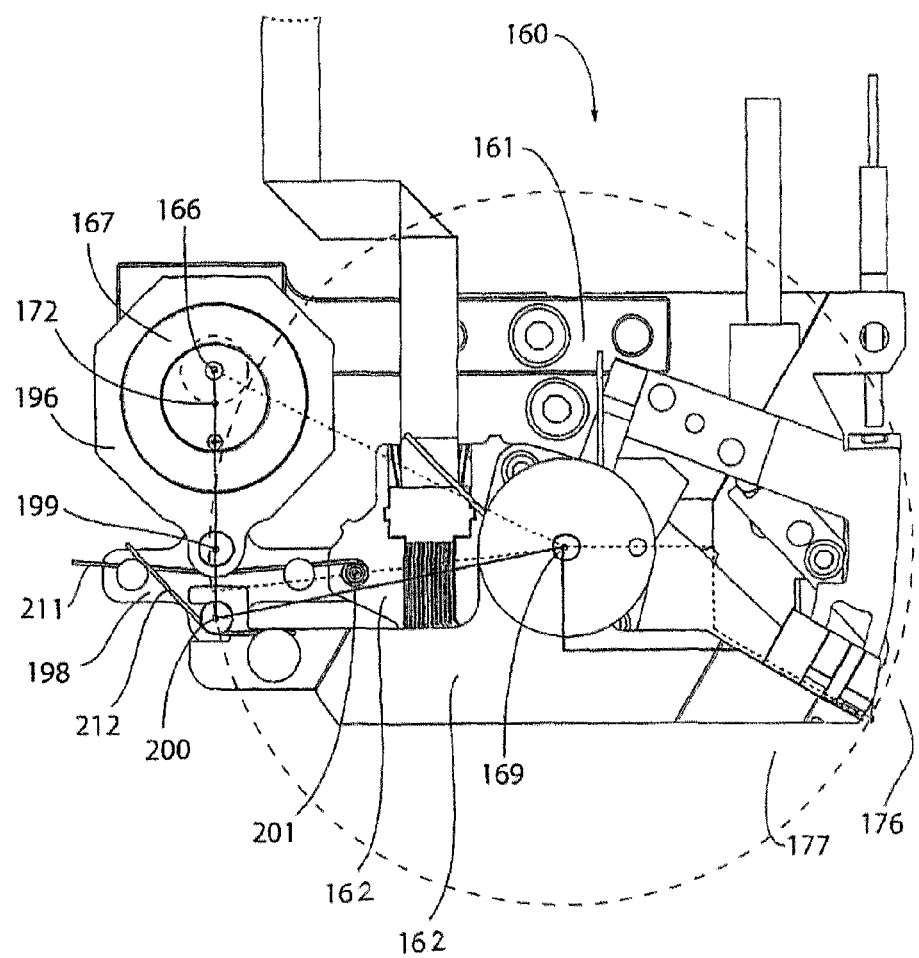
Figure 37:
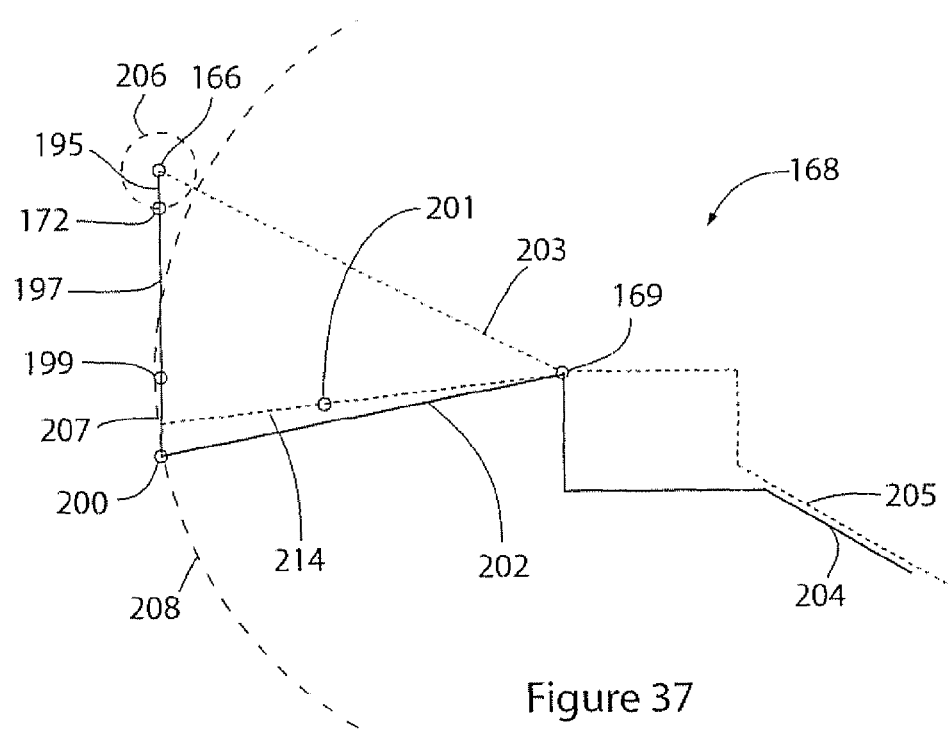
Figure 38:
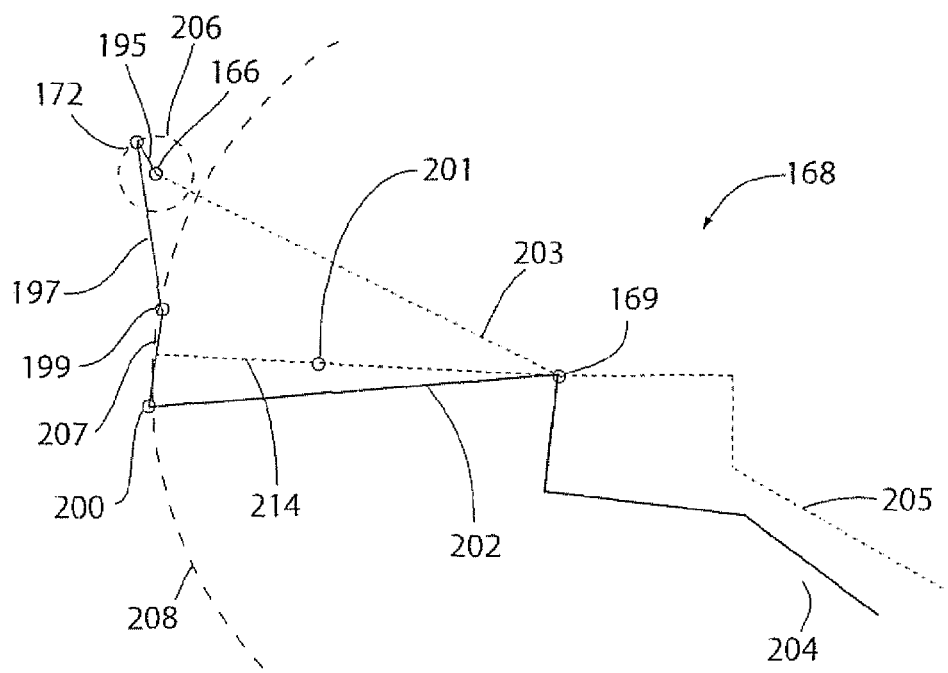

FIG. 4a illustrates additional features of the bottom face of a multi-point probe, FIG. 4b illustrates a multi-point probe having an alternative probe tip, FIG. 5 is a cross-sectional view of a multi-point probe, FIG. 6a is a blow-up of the probe tip of a multi-point probe seen from below, FIG. 6b is a blow-up of the alternative probe tip of FIG. 4b seen from below, FIG. 7 is a perspective view of a multi point probe primarily showing its bottom face, FIG. 8 is a front view of a probe holder carrying a multi-point probe, FIG. 9 is an exploded view of FIG. 8, FIG. 10 is a back view of a probe holder carrying a multi-point probe, FIG. 11 is an exploded view of FIG. 10, FIGS. 12-13 are perspective views of a bracket of a probe holder, FIGS. 14-15 are perspective views of a support column of a probe holder, FIG. 16 is a perspective view of a support column with a multi-point probe placed on its supporting column shoulders, FIG. 17 is a sectional view of the support column and multi-point probe of FIG. 16, FIG. 18 is a perspective and exploded view of a probe holder showing its assemblage, FIG. 19 is a perspective view of a probe holder showing the flexing of the brackets, FIG. 20 is a side view of a closed multi-point probe cassette, FIG. 21 is the same multi-point probe cassette as in FIG. 20, but partly opened, FIG. 22 is the same multi-point probe cassette as in FIGS. 20-21, but fully opened, FIG. 23 is a top view of a cassette rack, FIG. 24 is a back view of the cassette rack illustrated in FIG. 23, FIG. 25 is a bottom view of the cassette rack illustrated in FIGS. 23-24, FIG. 26 is a side view of the cassette rack illustrated in FIGS. 23-25, but with two probe holders in their respective recesses, FIG. 27 is a perspective view of the cassette rack illustrated in FIG. 26, FIG. 28 is a perspective view of the cassette rack illustrated in FIGS. 23-27, but with probe holders in all of its recesses, FIG. 29 is a side view of a cassette cover, FIG. 30 is a sectional top view of the cassette cover illustrated in FIG. 29, FIG. 31 is an exploded view of the cassette cover illustrated in FIGS. 29-30, FIG. 32 is a perspective view of a probe manipulator head and the partially exploded view of the same, FIG. 33a illustrates from a perspective view of how a probe manipulator head engages a multi-point probe on a support column, FIG. 33b illustrates a sectional side view of the maxilla front with the securing arm in its unengaged position, FIG. 33c illustrates a sectional side view of the maxilla front with the securing arm in its engaged position, FIG. 33d illustrates from a side view how the securing arm engages the contact tongue, FIG. 33e illustrates a side view of the maxilla front from the opposite side as compared to in FIGS. 33b-33c, FIG. 34 is a perspective view of a contact tongue, FIG. 35a is a perspective view of the contact tip of the contact tongue illustrated in FIG. 34, FIG. 35b is a front view of the contact tip of the contact tongue illustrated in FIG. 34, FIG. 36 is a side view of a probe manipulator head with its schematic mechanical linkage outlined, FIG. 37 illustrates the same schematic mechanical linkage as in FIG. 36, FIG. 38 illustrates the same schematic mechanical linkage as in FIG. 36, but with the drive axle turned 150 degrees clockwise.

Figure 39A:
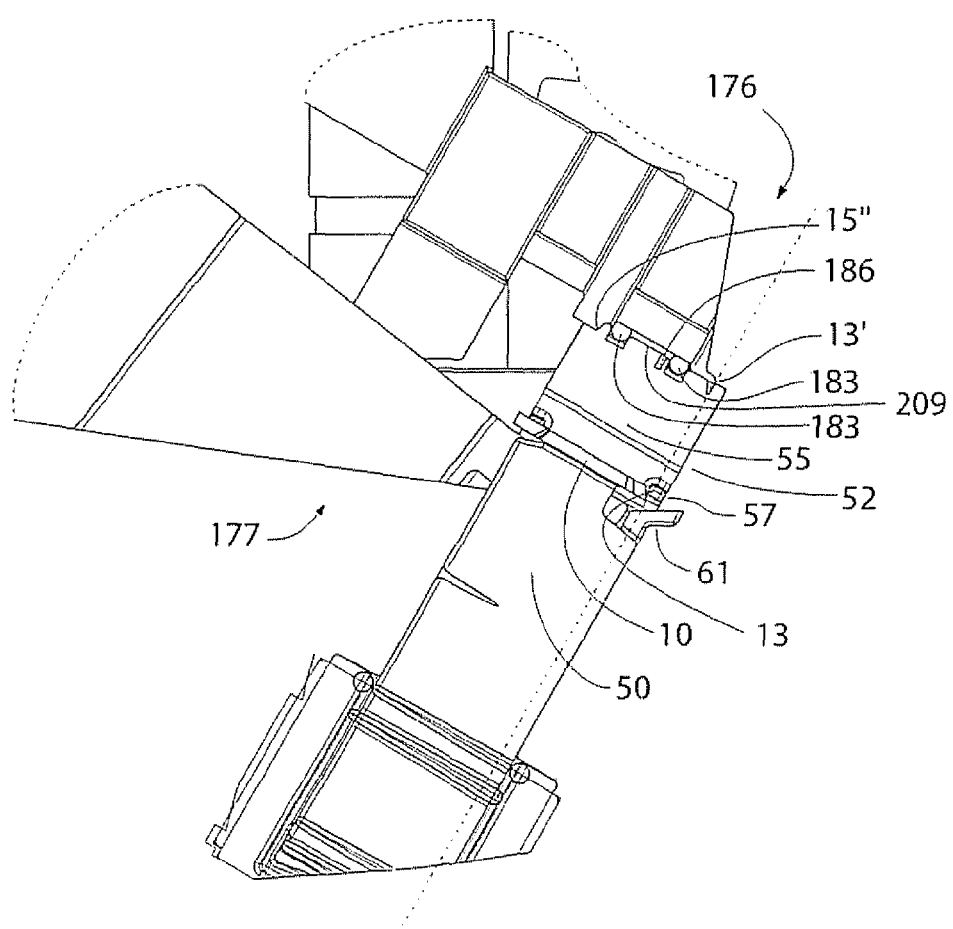
Figure 39B:
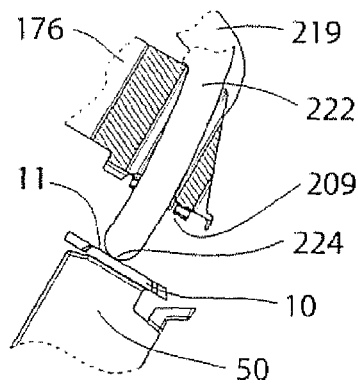
Figure 39C:
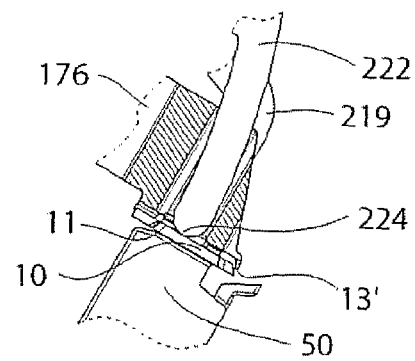
Figure 39D:
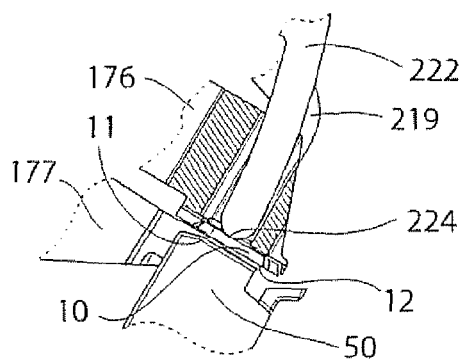
Figure 39E:
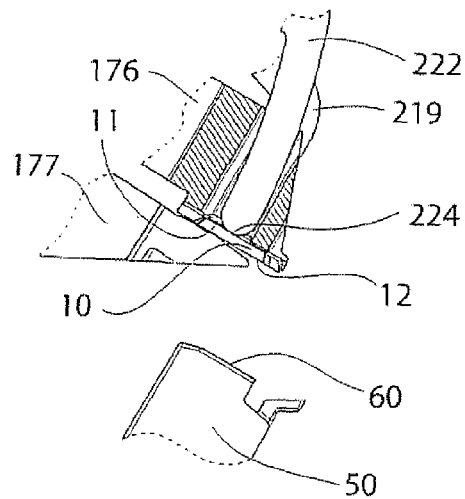
Figure 39F:
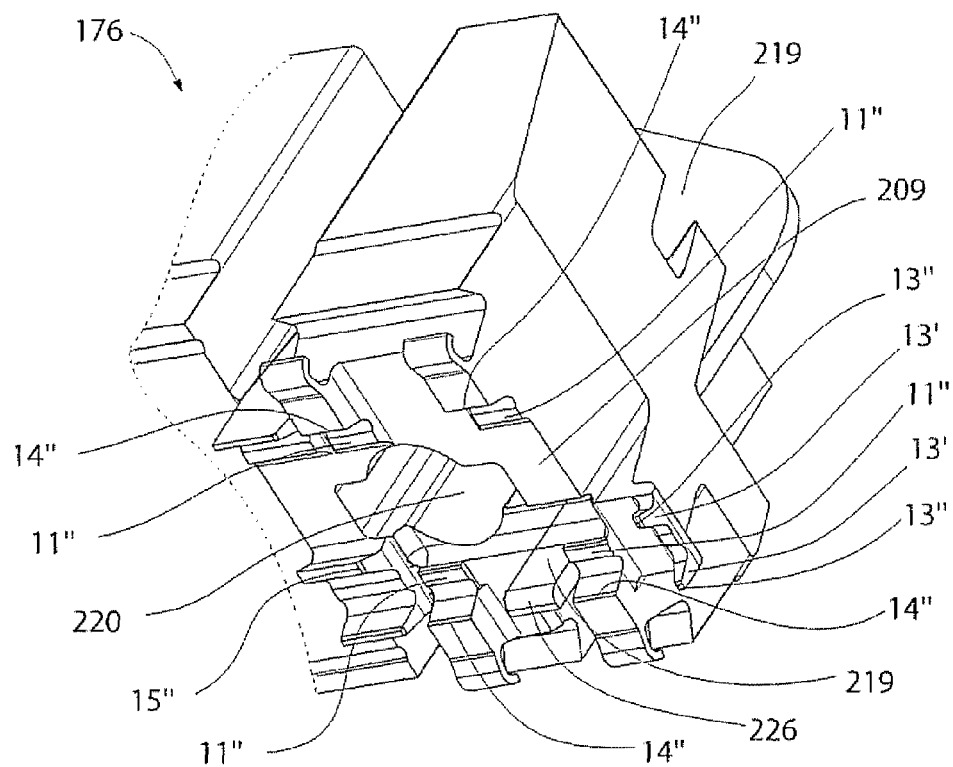
Figure 39G:
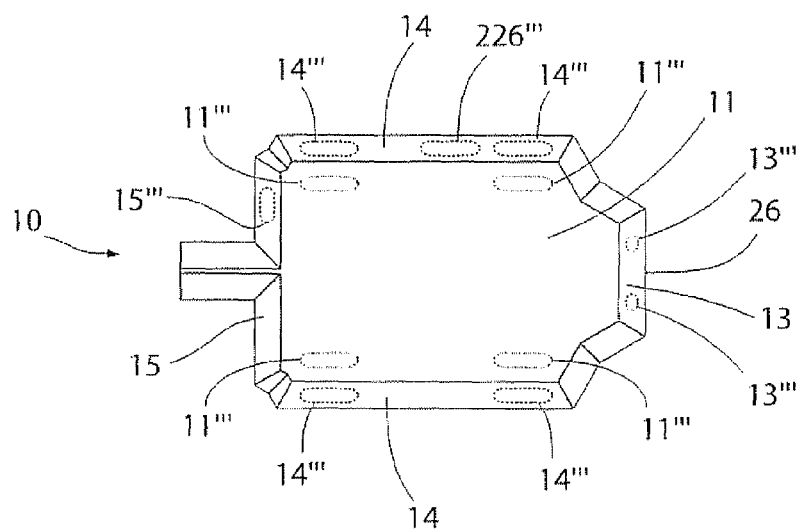
Figure 47:
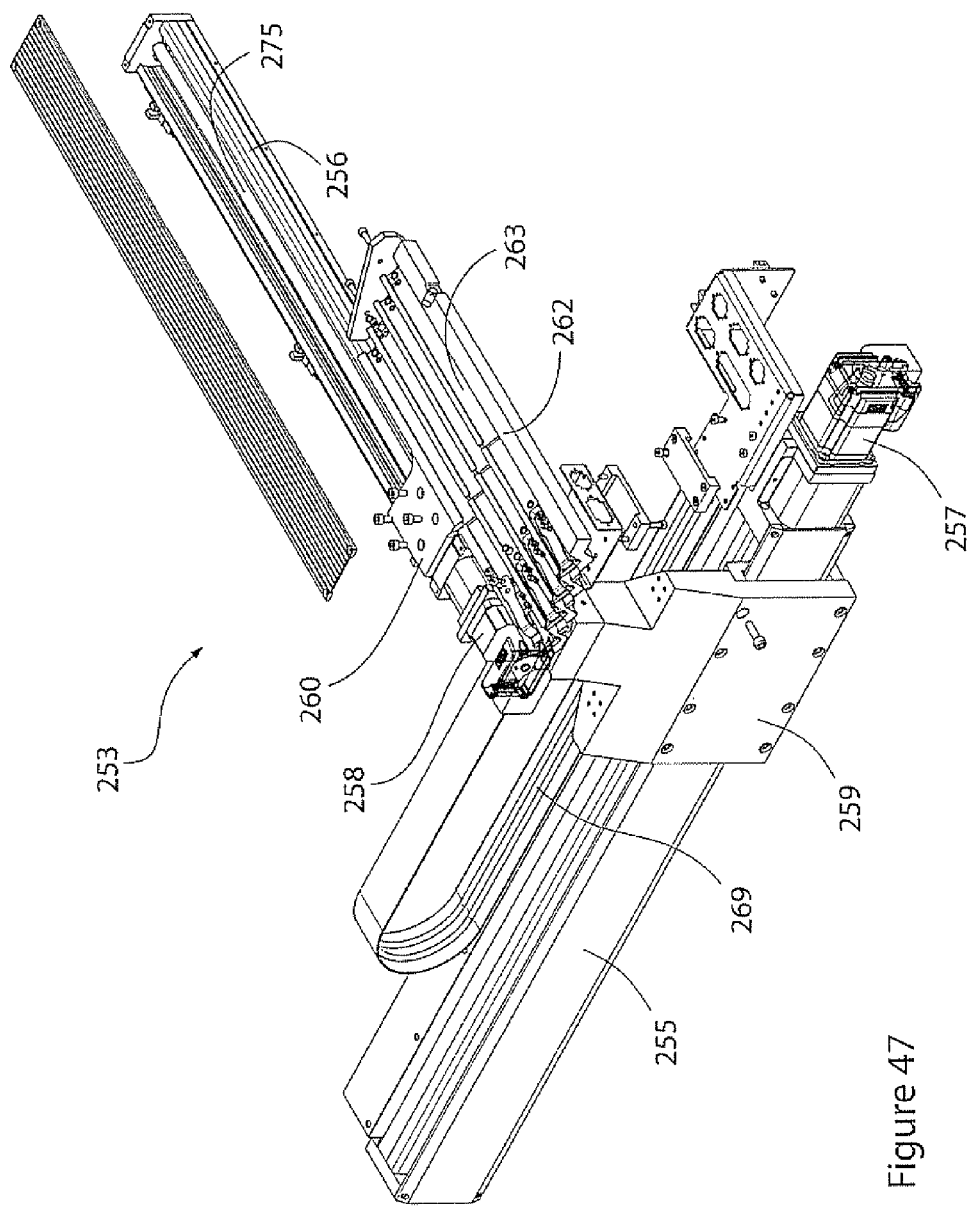
Figure 48:
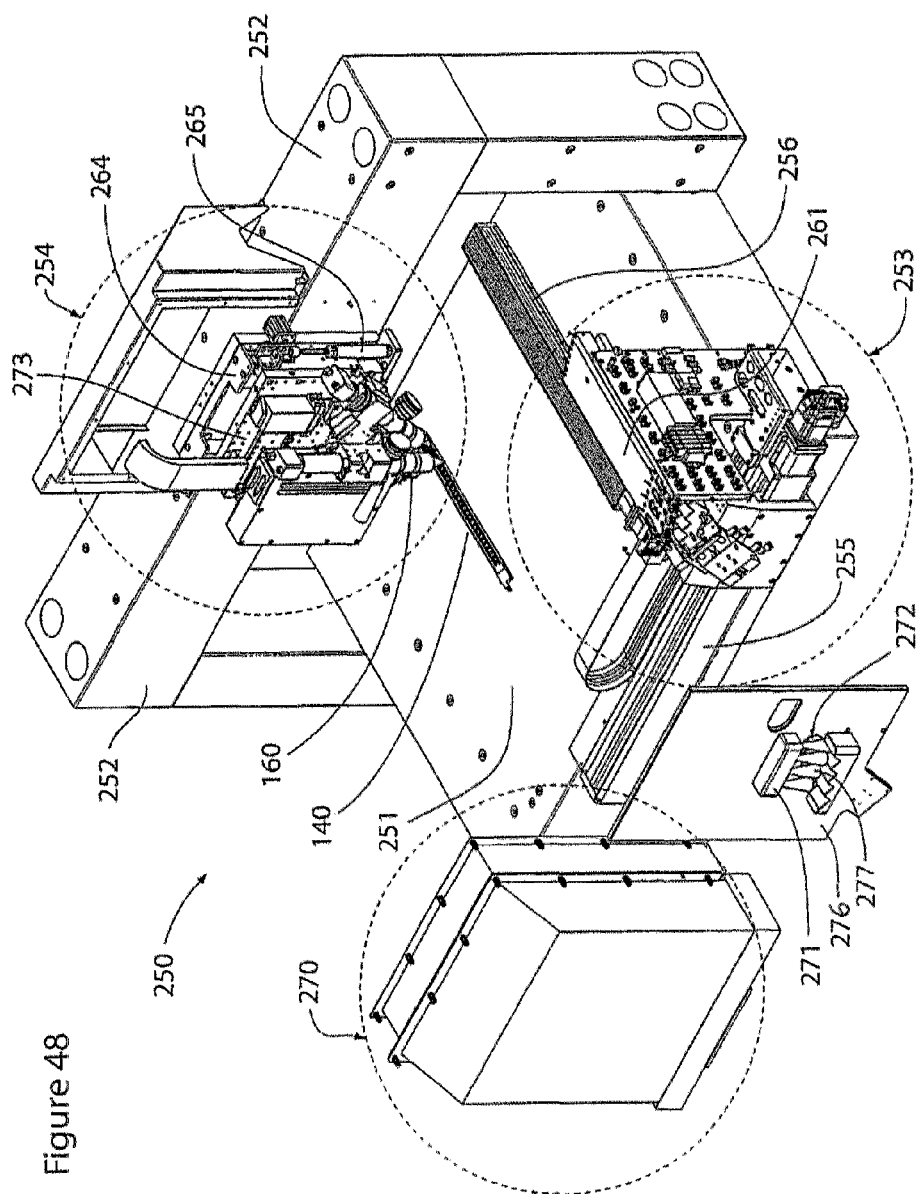

FIG. 39a is a side view of the maxilla front and mandible front of a probe manipulator head engaging a multi-point probe supported by probe holder, FIG. 39b-e illustrates from a side view how a maxilla front and mandible front engage a multipoint probe on a support column, where the maxilla front is depicted in a sectional view to show the workings of the probe securing finger, FIG. 39f is a perspective view of the maxilla front showing the details of the palate, FIG. 39g is a top view of the multi-point probe in FIGS. 1-7 showing the points of contact with the maxilla front, FIG. 40 is a partial sectional side view of a maxilla front engaging a multi-point probe, FIG. 41 is an exploded view of FIG. 40, FIG. 42 is a partial sectional front view of a maxilla front engaging a multi-point probe, FIG. 43 is an exploded view of FIG. 42, FIG. 44 is a front view of a vertical loader, FIG. 45 is a side view of the vertical loader of FIG. 44, FIG. 46 is a perspective view of the vertical loader of FIGS. 44 and 45, FIG. 47 is perspective view of a horizontal loader, and FIG. 48 is a perspective view of probe loader.

DETAILED DESCRIPTION

Figure 1:
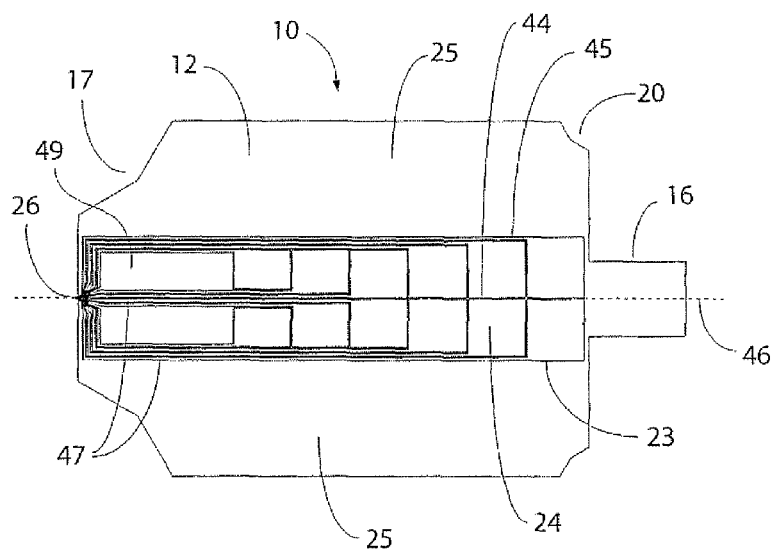
FIG. 1 is a bottom view of a multi-point probe.

FIG. 1 illustrates a multi-point probe 10 viewed from below. The bottom face 12 of the multi-point probe 10 has a probe tip 26 at its front and a manufacturing support 16 at its back. The manufacturing support 16 is an artifact from the production of the multi-point probe 10 and is no essential functional element, which means that in all of the described embodiments and in all of the figures it can be disregarded. An electrically conductive metal layer has been deposited onto the bottom face 12 of multi-point probe.

The basic shape of the bottom face 12 is rectangular with a length between the probe tip 26 and the manufacturing support 16 that is larger than the width. A non-essential feature has been included in the present embodiment, which is that the corners have been cut out giving them an inverted appearance. Naturally, in all of the presented embodiments, this feature can be disregarded. The inverted front corners 17 have a larger cut-out than the inverted back corners 20. Further, the shape of the inverted front corners is the same, which is also the case for the inverted back corners.

The multi-point probe 10 has a reflection symmetry around a longitudinal symmetry axis 46. Contact pads 24 and conduits 47 between the pads 24 and the probe tip 26 are defined by engraved cuts 23 in the metal surface of the bottom face 12. The engraved cuts 23 are preferably obtained through etching. Each contact pad 24 has an inner side 44 and an outer side 45, where the inner side 44 is the closer of the two to the longitudinal symmetry axis 46. Each contact pad 24 has a single conduit 47 leading to the probe tip 26. Some of the contact pads 24 have their associated conduit 47 connected at its inner side 44, while other contact pads 24 have their associated conduit 47 connected at its outer side 45. The contact pads 24 are divided into two rows placed on opposite sides of the longitudinal symmetry axis 46. Further, the contact pads 24 are placed as close as possible to the longitudinal symmetry axis 46, which means the separation or inner area between the two rows of pads is only defined by the width of the engraved cuts 23 and the width of the conduits 47 connected at the inner sides 44. Between the contact pads 24 and each of its edges of the multi-point probe 10 there is an outer area 25 suitable for being engaged when handling the multi-point probe 10.

Figure 2:
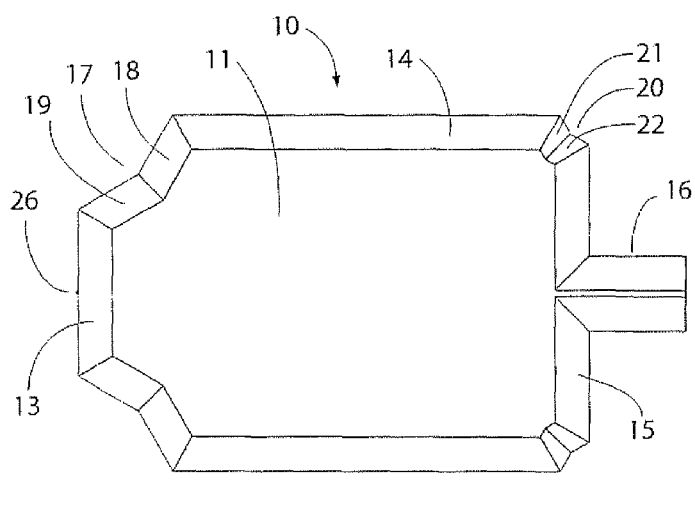
FIG. 2 is a top view of a multi-point probe.

FIG. 2 illustrates the multi-point probe 10 of FIG. 1, but viewed from below. The basic shape of the top face 11 is also rectangular and the top face 11 is parallel with the bottom face 12. The front face 13, the side faces 14 and the end face 15 are all planar and bevelled so that they individually contribute to decreases in the area of the top face 11, which is therefore smaller than the area of the bottom face 12. That the front face 13 is bevelled as described means that the probe tip 26 defines the furthest extension to the front of the multi-point probe 10. The manufacturing support 16 has also been bevelled by the same process by which the front, side, and end faces were bevelled.

Each of the inverted front corners 17 defines two bevelled surfaces, i.e. a first 18 and a second 19 bevelled surface. The same is the case for the inverted back corners 20, i.e. they each define a first bevelled surface 21 and a second bevelled surface 22. All of the bevelled surfaces are, in conjunction with the planar bottom face 12, suitable for defining an accurate orientation of the multi-point probe, which will be obvious from later examples and embodiments below.

Figure 3:
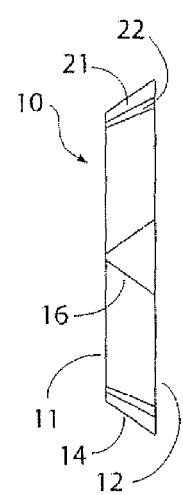
FIG. 3 is a back view of a multi-point probe.

FIG. 3 illustrates the multi-point probe 10 of FIGS. 1 and 2, but viewed from the back. It clearly shows that the top surface 11 and the bottom surface 12 are parallel, and that the area of the former is smaller than the area of the latter. The manufacturing support 16 has from this perspective, due to the fact that its sides also are bevelled, a triangular shape.

FIG. 4a illustrates the same multi-point probe 10 as in FIGS. 1 to 3, again viewed from below. The bottom face 12 has a hatched area indicating a lower Poly-silicon layer on top of an oxide layer. The shape of the oxide layer does not have to be the same as outlined in FIG. 4a, only the general coverage indicated is preferred. However, it is important that the surface properties of the more coarse oxide layer 28 are taken into account when handling the multi-point probe.

FIG. 5 is a sectional view of a multi-point probe 10 showing the top face 11, bottom face 12, and a bevelled side face 14, where the latter two define a side edge 29 and an acute internal side angle 21 between them.

FIG. 6a illustrates a greatly expanded view of a presently preferred probe tip 26 of the multi-point probe 10 of FIGS. 1 to 4. In the present example, the probe arms 31"-42" are divided into two groups showing reflection symmetry with respect to one another. The placing and the number of probe arms 31"-42" presented here are just an example and may be different in another embodiment. Each probe arm 31"-42" is an extension of a signal trace 31'-42', which is a continuation of a conduit 47 from a single contact pad 31-42. Here, the probe arm 31"-42", the signal trace 31'-42', and the contact pad 31-42 that are connected have been given the same index number but different numbers of markings. The metal deposited onto the bottom face 12 has also been deposited onto the signal traces 31'-42' and probe arms 31"-42", where the signal traces 31'-42' are separated by the same engraved cuts 23 as the conduits 47 and the contact pads 31-42. The probe arms 31"-42" extend freely from the front edge 43 of the multi-point probe and their distal ends are intended for contacting a test substrate in a multi-point measurements, e.g. in the thin film and semiconductor industries.

FIG. 7 is a perspective view of the multi-point probe 10 also illustrated in FIGS. 1 to 4, where the same index numbering as in the previous figures has been used.

FIG. 6b illustrates a greatly expanded view of an alternative probe tip 26 of the multi-point probe 10. The corresponding bottom face 12 of the multi-point probe 10 is shown in FIG. 4a, which differs from the bottom face 12 that of the previous FIGS. 1 to 4 in that the conduits 47 traces different paths. Each of the signal traces 31'-42' is a continuation of a conduit 47 from a single contact pad 31-42. As before, the signal trace 31'-42' and the contact pad 31-42 that are connected have been given the same index number but different numbers of markings. The multi-point probe 10 has four probe arms 35"-38" freely extending from the front edge 43 parallel to the bottom face 12 and connected to a respective signal traces 35'-38'. Further, the multi-point probe 10 has a cantilever strain gauge 351 freely extending from the front edge 43 and parallel to the bottom face 12 on either side of the probe arms 35-38".

The metal deposited onto the bottom face 12 has also been deposited onto the signal traces 31'-42', the cantilever strain gauges 351, and the probe arms 31"-42". The signal traces 31'-42' are separated by the same engraved cuts 23 as the conduits 47 and the contact pads 31-42. The thickness of the deposited metal layer is essentially constant, which means that the resistances of the signal traces 31'-42', the cantilever strain gauges 351, and the probe arms 31"-42" are defined by their associated widths and lengths.

Each of the cantilever strain gauges 351 has first limb 353 and a second limb 354 at the proximal end of the cantilever. The first 353 and second 354 limbs of each cantilever strain gauge cross the front edge 43 and interconnect two signal traces, i.e. the signal traces 31' and 34', and 39' and 42', respectively. When the cantilever strain gauge 351 is bent upon engagement the deposited metal on first 353 and second 354 limbs will stretch, in particular at the front edge 43, which leads to a deformation of the electrical conduit, i.e. the resistance for a current through the cantilever strain gauge 351 increases, A reference resistor 352 has been provided for each cantilever strain gauge 351 interconnecting the signal traces 31' and 32', and 41' and 42', respectively, The reference resistors 353 have the same form and dimensions as the corresponding cantilever strain gauges 351, whereby they have essentially the same resistance when the latter are unengaged. Further, the signal traces 32' and 33', 33' and 34', 39' and 40', and 40' and 41' are also interconnected. Clearly, the signal traces 31' to 34' and 39' to 42' define a circuitry on the bottom face 12 of the multi-point probe.

In this particular embodiment, the cantilever strain gauge 351 and the reference resistor 352 are coupled with two other reference resistors in a Wheatstone bridge via the contact pads 31-34 and 39-42. The function of the cantilever strain gauge 351 is further described in the PCT application WO 2008/110174.

FIG. 8 is a front view of a probe holder 152 supporting a multi-point probe 10. The multi-point probe 10 is supported from below by a support column 50 and held in position by two brackets 51 engaging it from above. FIG. 9 is an exploded view of FIG. 8 revealing additional details of the probe holder 152. The support column 50 has two shoulders 60 upon which the supporting surfaces of the bottom face 12 of the multi-point probe 10 rest. The shoulders 60 together define a supporting plane that in the depicted orientation is horizontal. The shoulders 60 are placed on opposite sides of the column 50. Further, a tongue 61 extends outward from the front of the column 50. Additionally, the column 50 constitutes a top part 58 and a bottom part 59 supporting the top part 58.

The two brackets 51 have identical shapes and are positioned on opposite sides of the support column 50. The brackets 51 have a neck 54 attached to the upper end of its base 53. Further, the neck 54 has at its upper end a bracket head 52. The neck 54 is of such construction that it can flex in a direction toward or away from the support column 50 outwards. If not specifically mentioned, when depicting the probe holder 152, the neck 54 of each bracket 51 is in or close to its resting or equilibrium position.

The bracket head 52 has a sloping head face 55 directed toward the support column 50. The sloping head face 55 defines a plane having an acute angle to a vertical axis when the neck 54 is in its resting position. This way the neck 54 will flex outwards from the support column 50 by simply bringing an object directly downward upon it.

Below the sloping head face 55 two bracket nips 57 are extending horizontally from the bracket head 52 in the direction of the support column 50. The bracket nips 57 are positioned at opposite sides of the bracket head 52 but on the same vertical position with respect to the bracket base 53. Therefore, in the front view of FIGS. 8 and 9 only one of the bracket nips 57 is visible. Each of the bracket nips 57 defines an engagement edge that is essentially horizontal when the neck 54 is in its resting position. The engagement edge of a bracket nip 57 is located at the lower end of the side facing the other bracket nip 57 on the same head. In the depicted orientation of FIGS. 8 and 9, the engagement edge of each bracket nip 57 defines a horizontal line parallel to the plane of the paper. This way the engagements edges of the bracket nips 57 on each bracket head 52 define a horizontal plane being perpendicular to the plane of the paper. When the support column 50 and the two brackets 51 are brought together to form a probe support 152 as in FIG. 8, the horizontal planes defined by the bracket nips 57 of the two brackets 51 are coplanar and parallel to the horizontal plane defined by the column shoulders 60. The vertical positions of the bracket nips 57 and the column shoulders 60 are such that when the multi-point probe 10 rests on the shoulders, the bracket nips 57 will engage its bevelled front face 13 and end faces through the engagement edges they define, thereby locking the multi-point probe 10 in a secure position. Further, the engagement will also force the multi-point probe 10 to orient itself so that its bevelled front face 13 and end faces are parallel to the engagement edges of the bracket nips 57. In FIG. 8 it is shown how the bracket nips 57 engage the bevelled front face 13 of the multipoint-probe 10.

FIGS. 10 and 11 illustrate the same probe holder 152 as in FIGS. 8 and 9, but viewed from the back instead. Most of the earlier described features have been pointed out with the same index numbering. A number of additional features are perceptible from this perspective. In FIG. 11 it is shown how the bracket nips 57 engage the bevelled end face 15 of the multipoint-probe 10. The column tongue 61 has an indentation 63 on its upper planar side defining a fiducial, or a marker. By this feature, it is possible to determine a vertical position of an optical microscope relative to the probe holder 152 by shifting its position until the fiducial is in the focus of the microscope. The fiducial may be provided with features, such as bumps or cuts, which can be utilized for an automated focusing.

The column body 58 defines a hollow space 64, which is open at the back and at the top of the column body 58. This allows a multi-point probe 10 placed on the column shoulders 60 to be gripped from behind and removed from the support column 50, e.g. by a pair of needle-nosed pliers.

FIGS. 12 and 13 illustrate the same bracket 51 as in FIGS. 8 to 11, but in two different perspective views instead. Some of the earlier described features have been pointed out with the same index numbering. Additionally, a number of new features have also been indicated.

Firstly, an aperture 65 is defined in the neck 54 having a shape such that its horizontal width increases when going toward the bracket head 52. This way, the flexibility of the bracket neck 54 will also increase when going toward the bracket head 52. A horizontal force component directed toward the sloping head face 55 will cause the bracket head 52 to move backward and simultaneously tilt the bracket head 52 so that the nips 57 move upward. With the particular shape of the aperture 54 described here, the tilting of the bracket head 52 will be augmented compared with the backward movement.

Secondly, two apertures 66 are defined in the base 53 of the bracket 51. Each of the apertures 66 has an elongated shape and defines a longitudinal direction that is oriented horizontally. Clearly, the brackets 51 have a reflection symmetry along a vertical axis, which is readily apparent in FIGS. 12 and 13, in particular in the latter.

FIGS. 14 to 16 illustrate the same support column 50 as in FIGS. 8 to 11, but in three different perspective views instead. Additionally, in FIG. 14 a multi-point probe 10 is resting on the shoulders 60 of the support column 50. Some of the earlier described features have been pointed out with the same index numbering. Additionally, a number of new features have also been indicated.

Firstly, it is readily apparent how the hollow space 64 is defined by the side 68 and front 69 of column body 58. Secondly, the support column 50 has two flanges 67 on either side of its base 59. These flanges 67 are shaped and positioned so that they fit closely into the apertures 66 of the bracket base 53. This way, a bracket 51 can be secured to either side of a support column 50, thereby defining a single unit or probe holder 152 as described in FIGS. 8 and 10.

FIG. 17 is a sectional view of the support column 50 of FIGS. 8 to 11 and 14 to 16 with the previous index numbering retained. A multi-point probe 10 is supported by the support column 50, which is positioned in its intended supporting orientation, whereby the plane defined by the bottom face 12 of the multi-point probe 10 defines an engagement angle 70 to a horizontal plane. Preferably, this angle is in the range of 25-35 degrees.

FIG. 18 illustrates how a pair of brackets 51 is brought together around a support column 50 to define a complete probe holder, which is then received in and secured by a recess 142. FIG. 19 illustrates the secured probe holder 152 of the previous FIG. 18 and how a force 71 acting on the sloping head face 55 causes the bracket head 52 to move outward and simultaneously tilt the bracket head 52 so that the nips 57 move upward as described previously in relation to FIGS. 12 and 13.

FIG. 20 is a side view of a probe cassette 100 in its closed state. FIG. 21 illustrates the same probe cassette 100 as in FIG. 20, but in a partly opened sate revealing a cover 110 pulled along the length of a rack 140. FIG. 21 reveals the same probe cassette as in the previous two figures, but in an open state where the cover 110 is fully separated from the rack 140.

FIG. 23 illustrates the cassette rack 140 of FIGS. 21 and 22 viewed from above. The rack 140 has an oblong shape defined by a rack bar 148 having a front 143 and an end 154. A catch pin 141 for being received in a catch bore of the cassette cover is positioned at the front 143 of the rack bar 148 and is pointing backward toward the end 154 of the rack bar 148. A plurality of recesses 142 for receiving probe holders are positioned in a row along the length of the rack bar 148. A lock arm 144 having an upwardly extending spring catch 145 is extending from the end of the rack bar 148. The lock arm 144 has a cut-out allowing a passage for lock shaft, whose function will be discussed later.

FIG. 24 illustrates the cassette rack 140 of FIG. 23 viewed from the back. The same index numbering as in FIG. 23 has been used for indicating the earlier discussed features. Additionally, FIG. 24 reveals a groove 150 on either side the rack bar, thereby defining a downward facing flanged slide support. The grooves 150 trace the sides of the rack bar, whereby the profile of the rack bar defines a downward facing flanged slide support 151. Further, FIG. 24 reveals a backward facing catch bore 149 at the end of the rack bar for receiving a catch pin of the cassette cover 110.

FIG. 25 illustrates the cassette rack 140 of FIGS. 23 and 24 viewed from below and further revealing a recess in the flanged support 151 provided with a catch bar 147 at a right angle to the grooves 150 of the rack bar 148. The catch bar 147 provides a firm grip or hold for sliding the cassette rack 140 relative to the cassette cover 110. FIG. 26 illustrates the same cassette rack 140 as in FIGS. 23 to 25, but viewed from the side and with two probe holders 152 fitted into a respective receiving recess 142 shown in FIG. 23. The groove 150 traces the complete length of the rack bar 148, thereby providing a flanged slide support that can be engaged over most of the length of the cassette rack 140.

FIG. 27 is perspective view of the cassette rack 140 of FIG. 26. The same index numbering as in FIGS. 23 to 27 has been used for indicating the earlier discussed features. FIG. 28 illustrates the same cassette rack as in FIG. 27, but with a probe holder 152 fitted into all of its recesses 142.

FIG. 29 illustrates the cassette cover 110 of FIGS. 21 and 22 viewed from the side. The cassette cover 110 has a housing 114 that is open at its front 131 and at its bottom 133, but closed at its end 132 and at its top 134. This allows the cassette 100 in its closed state to slide open in a direction toward the front 131 and parallel to the earlier described flanged slide support 151 of the rack 140. The closed end 132 of the housing 114 is sealed by a handle, by which the cassette cover 110, or for that matter the complete cassette in its closed state, can be pushed or pulled in the longitudinal direction of the cassette cover 110. The cassette cover is at the base of the handle 129 and at the top 134 of the housing 114 provided with a printed circuit board 127 having pad connectors 128 facing the front 131 of the cover 110. The function of the printed circuit board 127 is explained later in connection with FIG. 31. Further, the cassette cover is also provided with a catch pin 121 for being received in a catch bore of a cassette rack positioned at the bottom 133 of the housing 114 pointing forwards toward the front 131 of the housing 114.

FIG. 30 is a sectional top view along the cut 135 of the cassette cover 110 of FIG. 29. The same index numbering as in FIG. 29 has been used for indicating the previously discussed features. FIG. 30 further reveals a spring-loaded locking hook 130 held in position by a pivotal support defined around an axle 119 perpendicularly oriented with respect to the longitudinal direction defined between the front and end of the housing 114. The locking hook 130 can engage the spring catch 154 of a rack 140 described in connection with FIGS. 23 to 24 and 26 to 28. A passage 123 allows for a lock shaft to enter the housing 114 to disengage and lift the locking hook 130 from the spring catch 154.

FIG. 31 is an exploded view of the cassette cover 110 in FIG. 29, revealing details about the workings of the locking hook 130, which joins two coil springs centred on the supporting axle 119 in a double spring 120 defined by a single thread. The end points of the thread are held in position by a respective recess, thereby defining an equilibrium position of the locking hook 130 with respect to the rest of the cover 110.

FIG. 31 further reveals a non-volatile digital memory 124, here in the form of a USB-stick, coupled by a male 125 connector to female connector 126 rigidly attached to the printed circuit board 127. The printed circuit board 127 in turn is rigidly attached to the cassette housing 114. The printed circuit board 127 is provided with pad connectors 128 facing the front 131 of the housing 114. The pad connectors 128 are coupled to the female connector 126. This way, by coupling the male 125 and female 126 connectors together, the non-volatile digital memory 124 can be access through the pad connectors 128. The non-volatile digital memory can, for example, contain information about the number of times each probe stored in the cassette has been applied to a test surface.

Additionally, FIG. 31 reveals a groove 111 at the top and on either side of the housing 114. The grooves 111 trace the sides of the housing 114, whereby the profile at the top of the housing 114 defines an upward facing flanged slide support 112.

A perspective view of complete probe manipulator head 160, as well as a partly exploded perspective view of the same, is depicted in FIG. 32. The manipulator head 160 comprises a maxilla 161, a mandible 162, and a contact tongue 163. The maxilla 161 is provided with a pivot axis 169 and an electrical motor, or turn actuator, 165 having a drive axle 166. The maxilla 161 is further provided with a cylinder 173 centred in a ball bearing 167, where the cylinder 173 is rigidly connected to the drive axle 166 at a point being offset relative to the bearing centre 172. This way, when turning the drive axle 166, the ball bearing 167 will move up and down. The mandible 162 is connected to the maxilla 161 by two separate connections; via its ball bearing 167 and a mechanical linkage 168, and via the pivot axis 169 going through the pivot apertures 174 of the mandible 162. By this, the front 177 of the mandible 162 will repeatedly move to and from the front 176 of the maxilla 161 when the drive axle is turned in one direction.

The contact tongue 163 is placed between the pivot apertures 174 of the mandible 162 and is also provided with a pivot aperture 175 of its own through which the pivot axis 169 also runs. The contact tongue 163 is connected to the maxilla 161 via the mechanical linkage 168 and the pivot axis 169. This way, the front 178 of the contact tongue 163 will repeatedly move to and from the front 176 of the maxilla 161 when turning the drive axle 166. The workings of the mechanical linkage 168 will be further discussed below. The contact tongue 163 is also provided with insulation displacement connector 171 connected to a ribbon cable 170, through which test signals to the contact tongue 163 can be sent.

The probe manipulator head 160 is also provided with a securing arm 218 whose function will be discussed further below. The securing arm 218 is rigidly connected to a securing arm yoke 230, which in turn is pivotally connected to the pivot axis 169. This way the securing arm 218 can perform a well defined rotational movement centered around the pivot axis 169. The securing arm 218 defines a downward securing force by its own weight and by the weight of the securing arm yoke 230. A securing arm spring 231 defining a load between the maxilla 161 and the securing arm yoke 230 contributes to increase the downward securing force. Further, a positioning spring 219 in the form of a cantilever leaf spring at the maxilla front 176 is also shown in FIG. 32. The function of the positioning spring 219 will be described below.

A perspective view of a maxilla front 176, a mandible front 177, and a contact tongue front 178 is depicted in FIG. 33*a* showing their positions relative to one another when engaging a multi-point probe 10. The fronts have been moved apart for the sake of clarity, but when brought together they grip the multi-point probe 10. The maxilla front 176 has a pair of probe-support incisors 13' engaging the bevelled front face 13 of the multi-point probe, while the mandible front 177 has a pair of probe-support molars 215 and the contact tip 178 of the contact tongue 163 has a plurality of contact fingers 210 that engage the bottom face of the multi-point probe. Further, the multi-point probe 10 is depicted in a resting position on top of a support column 50 described in connection with FIGS. 8 to 11 and 14 to 19. A complete probe holder as in FIG. 8 and FIG. 10 has not been depicted for carrying the multi-point probe 10, which otherwise would have been concealed by the brackets 51. The maxilla front 176 is provided with a plurality of balls 183, preferably of sapphire, that will engage the sloping head face 55 of the bracket heads 52 when the mandible front 176 is brought down on the multi-point probe 10, thereby forcing the brackets heads 52 apart as described in connection with FIGS. 12, 13, and 19. The spherical hard surfaces of sapphire balls have the advantage that they do not scratch the surface of the sloping head face 55, which would otherwise be a source of free particles or dust.

The maxilla front 176 has a probe securing aperture 220 and a tongue securing aperture 221 through the maxilla ridge 227. Further, the positioning spring 219 of the maxilla front 176 and the tongue ridge 229 of the contact tip 178 are also visible in FIG. 32. The functions of all these features will be discussed later.

Each of the probe-support molars 215 comprises a convex engagement surface 216 having an engagement point 217 that connects to the bottom face of the multi-point probe 10. Each probe-support molar 215 defines a support plane by the tangential plane to the engagement point 217 and the convex engagement surface 216. The two support planes are coplanar with each other and with a common support plane between them. The contact tongue 163 can be rotated around the pivot axis 169 so that the plurality of contact fingers 210 of the contact tip 178 of the contact tongue 163 crosses this common support plane, whereby the contact fingers 210 can make contact with the bottom face of the multi-point probe 10 after the probe-support molars 215 have done this.

FIG. 33*b* illustrates a sectional side view of the maxilla front 176 with the securing arm 218 in its unengaged position. In this position the securing arm 218 rests on the maxilla ridge 227 by its downward facing convex resting surface. The securing arm 218 has a probe securing finger 222 going through the probe securing aperture 220 and ending in a rounded probe securing finger tip 224. The securing arm 218 also has a tongue securing finger 223 going through the tongue securing aperture 221 and ending in a rounded tongue securing finger tip 225. FIG. 33*c* illustrates a sectional side view of the maxilla front 176 with the securing arm 218 in its engaged position in which it has performed a rotation centred on the pivot axis 169 in FIG. 32. This rotation can be induced by a force acting on the probe securing finger tip 224 that is larger than the combined load of the weight of the securing arm 218, the weight of the securing arm yoke 230, and the spring force of the securing arm spring 231 described in relation to FIG. 32. In the engaged position the convex resting surface 228 no longer rests on the maxilla ridge 227, while the probe securing finger 222 and tongue securing finger 223 have been retracted into the probe securing aperture 220 and tongue securing aperture 221, respectively. With the probe securing finger 222 retracted, the tip 226 of the positioning spring 219 is visible. With the rounded tip 224 of the probe securing finger 222 and the rounded tip 225 of the tongue securing finger 223, no sharp edge will scrape off material when they are engaged.

FIG. 33*d* illustrates how the securing arm 218 of FIGS. 33*a* to 33*c* engages the tongue ridge 225 of a contact tip 178 by the rounded tip 225 of its tongue securing finger 223, thereby preventing the plurality of contact fingers 210 from coming in contact with the rounded tip 224 of the probe securing finger 222. If the plurality of contact fingers 210 were to come in contact with the tip 224 of the probe securing finger 222, this could cause them to bend and change orientation, which in turn could lead to a decrease in function when contacting a multi-point probe.

FIG. 33*e* is a side view of the maxilla front 176, but from the opposite direction to that of FIGS. 33*b* to 33*c*, clearly showing the lower part thereof and the tip 226 the positioning spring 219. The positioning spring 219 is a cantilever leaf spring for accurately positioning a multi-point probe by its tip 226, which will be discussed further in connection with FIGS. 39*f* and 39*g*.

FIG. 34 illustrates a blown up perspective view of a contact tongue 163. The same number indexing for the same features as in the previous FIGS. 32 and 33*a* has been used. Each contact finger of the plurality of contact fingers 210 is connected to the insulation displacement connector 171 via a single signal trace of a plurality of signal traces 179 in a printed circuit board 181. Half of the plurality of signal traces 179 is on the same side of the printed circuit board 181 as the insulation displacement connector 171, while the other half is on the other side of the printed circuit board 181, which they reach through conductive vias 180. Either side of the printed circuit board has been provided with a support board giving the contact tongue 163 improved structural rigidity.

FIG. 35*a* illustrates a perspective view of a contact tip 178 showing the printed circuit board 181 sandwiched between the two support boards 182. The plurality of contact fingers 210 is here resolved as individual electrically conductive contact fingers 31'''-42''' that extend freely from the contact tip 178 parallel to one another. The multi-point probe 10 of FIGS. 1 to 7 is compatible with the contact tongue in that all of the contact pads 31-42 are connected by the contact fingers 31'''-42'''. The contact fingers 31'''-42''' have been indexed so that a finger has the same number as the contact pad 31-42 of the multi-point probe 10 to which it connects, see further FIG. 4*a* and the associated text. As the contact pads 31-42 of the multi-point probe are ordered in two rows, the contact fingers are order in two columns correspondingly such that the contact fingers of each column are lying in a common plane.

FIG. 35*b* illustrates a front view of a contact tip 178 showing the printed circuit board 181 sandwiched between the two support boards 182. The plurality of contact fingers 210 is here resolved as individual electrically conductive contact fingers 31'''-42" having rhombic cross sections. The contact fingers 31'''-42" are oriented around their longitudinal direction so that the upper and outermost edge is the highest. This means that the rhombic cross section defines at the tip of each contact finger a contact corner 362 for engaging the contact pad of a multi-point probe. By this configuration, a contact finger twists around its longitudinal direction so that the contact corner 362 moves outward. Simultaneously, the contact finger will flex inward. This flexing will to some extent be limited by an electrically insulating support wall 361 between the first 31'''-36''' and second 37'''-42''' columns of contact fingers. The electrically insulating support wall 361 does not extend along the full length of the plurality of contact fingers 31'''-36''', but terminates so that they extend freely about the same distance from the electrically insulating support wall 361.

FIG. 36 is a side view of the complete manipulator head of FIG. 32 with a schematic mechanical linkage outlined representing the relative positions of the maxilla, mandible, and contact tongue when employing the manipulator head. When turning the drive axle 166 the bearing centre 172 traces a circle around it, which will move the outer race 196 of the ball bearing 167 in a vertical direction. The outer race 196 is connected to a stroke arm 198 via an outer race link 199 that allows the outer race 196 to perform a limited sliding motion relative to the stroke arm 198. A loaded upper leaf spring 211 acts to transfer the motion of the outer race 196 to the stroke arm 198. Further, the upper leaf spring also allows the outer race 196 to move relative to the stroke arm 198 when it flexes. The stroke arm 198 is connected to the mandible via a mandible link 200 that allows the stroke arm 198 to perform a limited sliding motion relative to the mandible 162. A loaded lower leaf spring 212 acts to transfer the motion of the stroke arm to the mandible 162. Further, the lower leaf spring also allows the stroke arm 198 to move relative to the mandible 162 when it flexes. The stroke arm is also connected to the contact tongue via a contact tongue link 201, which essentially represents a rigid connection.

As mentioned before, the mandible 162 pivots around the pivot axis 169, by which the separation between the maxilla front 176 and the mandible front 177 can be varied by turning the drive axle 166. The maxilla front 176 and the mandible front 177 define a closed or fully clenched position when the separation is at its minimum and an open position when the separation is larger than its minimum. The closed position is shown in FIG. 36. When reaching the closed position from an open position, the lower leaf spring 211 allows the stroke arm 198 to continue a downward motion, which will, via the contact tongue link 201, continue to turn the contact tongue around the pivot axis 169. This way, a multi-point probe will first be engaged by the maxilla front 176 and the mandible front 177 before the contact fingers 31''' to 42''' of the contact tongue 163 engage the contact pads 31 to 42 on the lower face of the multi-point probe 10.

FIG. 37 illustrates the schematic mechanical linkage outlined in FIG. 36. When turning the drive axle 166 the bearing centre 172 traces a circle 206, where the displacement of the drive axle 166 from the bearing centre 172 defines a crank shaft 195. A connecting rod 197 is defined by the relative position of the bearing centre 172 and the outer race link 199, effectively representing the ball bearing 167 and the outer race 196 in the mechanical linkage. A stroke shaft 207 is defined by the relative positions of the outer race link 199 and the mandible link 200, effectively representing the stroke arm 198. A mandible shaft 202 is defined by the relative positions of the mandible link 200 and the pivot axis 169, effectively representing the mandible 162. The mandible link 200 traces a circle 208 centred on the pivot axis 169. The mandible shaft 202 is extended in a lower support plane 204 representing the mandible front 177. A maxilla shaft 203 is defined by the relative positions of the pivot axis 169 and the drive axle 166, effectively representing the maxilla 161. The maxilla shaft 203 is extended in an upper support plane 205 representing the maxilla front 176. Further, the stroke shaft 207 is rigidly connected to a stroke arm 214 that in turn is connected to the pivot axis 169. The contact tongue link 201 is located on a point along the stroke arm 214, whereby it effectively represents the connection and workings of the stroke arm 198 and the contact tongue 163.

The schematic mechanical linkage of FIG. 37 represents a manipulator head 160 with its maxilla front 176 and the mandible front 177 in a closed position, i.e. with a minimum separation between them. FIG. 38 is the same schematic mechanical linkage as in FIG. 37, but representing a manipulator head 160 with its maxilla front 176 and the mandible front 177 in an open position, which in this example has been achieved through a 150 degree clockwise turning of the drive axle 166. In FIG. 37, the angle between the stroke arm 214 and the mandible shaft 202 is smaller than the corresponding angle in FIG. 38, representing the flexing of the lower leaf spring 212 (FIG. 36) in the closed position, which makes the contact tip 178 of the contact tongue 163 rotate further than the mandible front 177 around the pivot axis 169 when approaching the closed position. The length of the stroke shaft 207, i.e. the distance between the outer race link 199 and the mandible link 200, is shorter in FIG. 37 than in FIG. 38, representing the combined flexing of the lower leaf spring 212 and upper leaf spring 211 in the closed position. This means that the load on a multi-point probe held in position between the lower support plane 204 and upper support plane 205 is defined by the load on the leaf springs. Further, this also means that the closed position is maintained around the point of maximum load of the leaf springs and that the load on a multi-point probe will increase and decrease smoothly when it is engaged and disengaged, respectively, which will greatly improve the accuracy and repeatability of the gripping by the probe manipulator head 160.

Further, by turning the drive axle 166 a full revolution, the lower support plane 204 and upper support plane 205 will return cyclically to their original relative positions. With a drive axle 166 being an extension of the central axle of an electrical motor, this turn actuator will also return to the same position in its rotation cycle. With a rotation cycle divided into steps, a specific step can then be defined for the maximum load on the leaf springs, or for when the manipulator head is considered gripping a multi-point probe, which will also improve the accuracy and repeatability of the gripping by the probe manipulator head 160.

FIG. 39a is a side view of the maxilla front 176 and mandible front 177 of the probe manipulator head 160 of FIG. 32 engaging a multi-point probe 10 supported by a support column 50 and engaged by a bracket head 52 described earlier in connection with FIGS. 8 to 19. The maxilla front 176 has balls 183, preferably of sapphire on either of its sides, that engages the sloping head face 55 of the bracket head 52 when it moves down to grip the multi-point probe 10. This will flex the bracket head 52 away from the support column 50 as described in connection with FIGS. 12, 13 and 19.

In order to receive the top of the multi-point probe 10, the mandible front 176 defines a palate 209 having an end engagement edge 15" defining a back boundary for the motion of the multi-point probe 10. The mandible front 177 is further provided with two probe-support incisors 13' located at the front of the palate 209. However, only one of the probe-support incisors 13' is visible from the perspective of FIG. 39. Each of the probe-support incisors 13' has a rounded support tip by which the probe-support incisors 13' together define a front engagement edge for engaging the bevelled front face 13 and limiting the freedom of motion of the multi-point probe 10.

In FIG. 39a it is clearly shown how one of the support pins 57 of the bracket head 52 has an engagement edge at the lower end of the side facing the other support pin, where the engagement edge in question engages the bevelled front face 13 of the multi-point probe 10.

FIGS. 39b to 39e are side views of a maxilla front 176 and a mandible front 177 engaging a multipoint probe 10 on a support column 50, where the maxilla front 176 is depicted in a sectional view to show the workings of the probe securing finger 222. The order of the FIGS. 39b to 39e corresponds to the order the different engagement steps are performed. In FIG. 39b the rounded tip 224 of the probe securing finger 222 is brought into contact with the top face 11 of the multi-point probe 10, thereby securing it against the column 50 while the bracket head is flexed away from the support column 50 and releases the multi-point probe 10 as described in connection with FIGS. 12, 13, 19, and 39. In FIG. 39c the maxilla front 176 has been brought down on top of the multi-point probe 10 to confine it between its palate 209 and the shoulders 60 of the support column 50. The multi-point probe 10 is still held in place against the column 50 by the tip 224 of the probe securing finger 222. The palate 209 has not been brought into direct contact with the multi-point probe, which could damage it due to the comparatively large weight of the associated manipulator head.

In FIG. 39d the mandible front 177 has been brought up toward the maxilla front 176 to engage the bottom face 12 of the multi-point probe 10, thereby lifting it from the shoulders 60 of the support column 50 and pressing it against the palate 209. Now the multi-point probe is fully supported by the grip defined by the maxilla front 176 and the mandible front 177. In FIG. 39e the multi-point probe 10 has been removed from the support column 50 by simply moving the associated manipulator head. The mandible may be fitted with a vibrator, such as an electric motor with an unbalanced mass on its driveshaft or piezo-electric actuator. When activated, the small vibrations will cause the mandible to open for short periods of time, which allows the multi-point probe 10 to reposition itself.

FIG. 39f is a perspective view of the maxilla front 176 showing the details of the palate 209, while FIG. 39g is a top view of the multi-point probe 10 described in connection with FIGS. 1 to 7 showing its areas of contact with the palate 209. There are four downward facing oblong top engagement ridges 11" on the palate 209 engaging the top face 11 of the multi-point probe 10 at four correspondingly positioned and shaped top engagement areas 11'''. The two probe-support incisors 13' at the front of the palate 209 has a rounded support tip 13" engaging the front face 13 of the multi-point probe 10 at two correspondingly positioned and shaped front engagement areas 13'''. The front engagement areas 13''' are separated so that probe-support incisors 13' will not come in contact with the probe tip 26.

The palate 209 defines an end engagement edge 15" at its back engaging the end face 15 of the multi-point probe 10 at a correspondingly positioned and shaped end engagement area 15'''. Similarly, the palate 209 defines two collinear side engagement edges 14" on either of its sides engaging the side faces 14 of the multi-point probe 10 at four correspondingly positioned and shaped side engagement areas 14'''. All the engagement edges are rounded to reduce the emission of dust. Further, all the engagement areas are on the faces of the multi-point probe 10 and not on any edge, which may be sharp and easily chipped, which could also be a source of dust particles.

Further, FIG. 39f shows the positioning spring 219 and its rounded tip 226, which engages the multi-point probe 10 at the correspondingly positioned and shaped spring engagement area 226''' (FIG. 39g). This way, the positioning spring 219 presses the multi-point probe against the side engagements edges 14" on the opposite side of the palate 209 and a highly accurate and repeatable positioning can be achieved. For normal engagements, only the most distant rounded support tip 13" from the positioning spring 219 engages the multi-point probe. FIG. 39f also shows the probe securing aperture 220 discussed in connection with FIGS. 33b to 33e.

FIG. 40 is a partial sectional side view of the maxilla front 176 of FIG. 32 engaging and confining a multi-point probe 10. FIG. 41 is an exploded view of FIG. 40, wherein the same number indexing has been used for identical features. The front face 13 of the multi-point probe 10 may be engaged by the front engagement edge defined by the rounded support tip 13" of the probe support incisors 13', while the end face 15 may be engaged by the end engagement edge 15" defined by the palate 209. Here, the front engagement edge and the end engagement edge 15" are parallel to each other.

FIG. 42 is a partial sectional front view of the maxilla front 176 of FIG. 32 engaging a multi-point probe 10. The positioning spring 219 discussed in connection with FIGS. 39f and 39g has pushed the multi-point probe 10 against one of the side engagement edges 14" (FIG. 43). On either side of the maxilla front 176 is a support recess for receiving a ball, preferably of sapphire, discussed in connection with FIGS. 33a and 39. FIG. 43 is an exploded view FIG. 42, wherein the same number indexing has been used for identical features. On either side of the palate 209, the side engagement edges 14" for engaging the side faces 14 of the multi-point probe 10 are clearly visible. The side engagement edges 14" are parallel to one another and perpendicular to the front engagement edge and the end engagement edge 15".

In FIG. 41 an upper support length 187 is defined as the distance between the front engagement edge and the end engagement edge 15". The multi-point probe defines an upper face length 189 that is shorter than the upper support length 187. Similarly, in FIG. 43 an upper support width 190 is defined as the distance between the side engagement edges 14". The multi-point probe defines an upper face width 192 that is narrower than the upper support width 190. This way, the multi-point probe 10 may be received in the palate 209 and held against the top engagement ridges 11"

Further, the multi-point probe 10 defines a probe height 234, which is larger than the front support height 232 defined between the rounded support tip 13" and the top engagement ridges 11" and normal to the palate 209. The probe height 234 is also larger than the back support height 235 defined between the end engagement edge 15" and the top engagement ridges 11" and normal to the palate 209. Similarly, the probe height 234 is larger than the side support height 233 defined between one of the side engagement edges 14" and the top engagement ridges 11" and normal to the palate 209. This way, no sharp and fragile edge from the bevelled faces of the multi-point probe 10 may come in contact with the mandible front.

FIGS. 44, 45 and 46 show a front view, a side view and a perspective view, respectively, of a part of a vertical loader 254. A manipulator head 160 as described in connection with FIGS. 32 to 43 is located at the lower end of the vertical loader. The vertical loader is provided with a high-accuracy linear actuator that can shift the vertical position of the manipulator head 160 relative to the anchor plate 273. In FIGS. 44 to 46 the high-accuracy linear actuator is hidden behind the protective cover 274.

A vertical optical microscope 267 is attached to the vertical loader 254 for perpendicular viewing of the planar surface of a test substrate. The vertical optical microscope 267 has a variable vertical position, whereby it can be retracted for allowing access to the manipulator head 160 when loading it with a multi-point probe. By focusing the vertical optical microscope 267 on the surface of a test substrate, an accurate vertical distance between the manipulator head 160 and the test substrate can be obtained, which is paramount in order to employ microscopic multi-point probes without risk of damaging the test substrate or the probe tip.

A column-tongue optical microscope 266 is also attached to the vertical loader 254 for viewing the fiducial defined by the indentation 63 on the outwardly extending tongue 61 of a support column 50 as described in connection with FIGS. 10 and 13 to 17. By focusing the column-tongue optical microscope 266 on the fiducial, the relative position between the manipulator head 160 and the support column 50 can readily be determined to a high accuracy, which enables an accurate gripping of a multi-point probe by the manipulator head 160. The column-tongue optical microscope 266 can also be focused on the probe tip of a multi-point probe gripped by the manipulator head 160, thereby allowing for a visual study or inspection of the probe tip, both when it is unengaged and engaged to a test substrate. In FIGS. 44 to 46 the tips of the cones 268 represent the focus of the optical microscopes they attach to.

FIG. 47 is perspective view of a horizontal loader 253 having a first loader arm 255 defining a horizontal first loading axis and a second loader arm 256 defining a horizontal second loading axis; where the first and second loading axes define a right angle between them. The first loader arm 255 provides a sliding support for a first wagon 259. A first linear actuator 257 in the form of an electrical turn motor coupled to a threaded axle that is received in a threaded bore of the first wagon 259 enables the first wagon 259 to shift position along the horizontal first loading axis.

The second loader arm 256 is rigidly attached to the first wagon 259 and provides a sliding support for a second wagon 260. A second linear actuator 258 in the form of an electrical turn motor coupled to a threaded axle 275 that is received in a threaded bore of the second wagon 260 enables the second wagon 260 to shift position along the horizontal second loading axis. The horizontal loader 253 further comprises a flexible control conduit 269 for enabling a controlling of the second linear actuator at all positions of the first wagon 259 along the first loader arm 255.

The second wagon 260 is provided with a rack holder 262, which in turn is provided with flanges defining an upward facing second receiving flanged slide support 263 for cooperating with the second flanged slide support 151 of a rack 140 as described in connection with FIGS. 25 to 27. The receiving flanged slide support 263 extends parallel to the second loader arm 256. With a rack 140 secured to the rack holder 262, the horizontal loader 253 can by its first and second linear actuators 257, 258 move the rack 140 in a plane over an area defined by the lengths of the first and second 256 loader arms 255 and 256.

FIG. 48 is a perspective view of probe loader 250 comprising a horizontal support stage 251 and a vertical support stage 252 rigidly connected to the horizontal support stage 251. The vertical loader 254 partly described in connection with FIGS. 44 to 46 further comprises a vertical loader arm 264 defining a vertical loading axis and a vertical linear actuator 265 in the form of a pneumatically driven piston. The vertical loader arm 264 is rigidly connected to the vertical support stage 252 and provides a sliding support for the anchor plate 273, and consequently also for the probe gripper 160. This way, the vertical linear actuator 265 provides a variable position of the probe gripper 160 along the vertical loading axis.

The first loader arm 255 of the horizontal loader 253 is rigidly connected to the horizontal support stage 251 and is further provided with a cover holder 261 rigidly connected to the horizontal support stage 251 and provided with flanges defining a downward facing first receiving flanged slide support extending parallel to the second loading axis defined by the second loader arm 256 for cooperating with the first flanged slide support 112 of a cover 110 as discussed in connection with FIG. 31.

The probe loader 250 is in its loading position, in which the rack holder 262 is located at the cover holder 261 with the second receiving flanged slide support 263 positioned below and parallel to the first receiving flanged slide support. The position of the rack 140 in FIG. 48 corresponds to the gripping position of the probe loader 250, i.e. where a multi-point probe carried by the rack 140 can be gripped by the manipulator head 160 of the vertical loader 254. Naturally, the rack 140 cannot be maintained in the depicted position of its own accord, but needs to be supported by the rack holder 262 of the horizontal loader 253.

The probe loader 250 further comprises a protective cover 270 for being attached to the vertical support stage 252. The protective cover 270 is placed around the vertical loader 254 and has an open bottom for the probe manipulator head 160. Further, the probe loader 250 has a horizontal loader front 276 having cassette apertures 272 through which the closed multi-point probe cassette 100 of FIG. 20 can be inserted and received by the rack holder 262 and the cover holder 261. The horizontal loader front 276 is provided with a row of lamps 271 for illuminating the cassette 100 and cassette apertures 272 when loading. The illumination is represented by cones 277 in FIG. 48.

Example

A prototype implementation of the presently preferred embodiment described above was built, where the probe 10 was manufactured of Silicon, Silicon-di-oxide and Poly-silicon and the bevelled front 13, side 14 and end faces 15 were achieved through KOH etching. The engraved cuts 23 were provided via a combination of isotropic and anisotropic etching with BHF (buffered Hydrofluric acid) and ASE (Advanced Silicon Etching). The metal layer was of Titanium and Nickel and provided via e-beam evaporation, while the oxide layer was Silicon-di-oxide and provided through a thermal growth process.

For the probe holder, the support column 50 and brackets 51 were made by injection moulded ABS, which gave a sufficiently flexible bracket neck 54, but at the same time a sufficiently rigid support column 50. The cover 110 of the probe cassette 100 had a cassette housing 114 of milled industrial aluminium and a handle 129 of cast and milled industrial aluminium. For the cassette rack 140 the rack front 143, lock arm 144, and rack bar 148 were of milled industrial aluminium. Aluminium is lightweight and of sufficient structural strength for allowing an easy and secure manual handling of the cassette.

Regarding the locking mechanism, the double spring 130 was a commercially available Lesjöfors with the diameter of 6.4 mm. The support axle 119 was of POM and the spring catch 145 was of steel for minimizing wear on when locking and unlocking. For the same reason the cover catch pin 121, the rack catch pin 141, and the opening catch bar 147 were also of steel.

The non-volatile digital memory 124 was a commercially available flash memory Transcend, USB 2.0, 1 GB of the USB stick type, whereby the male connector 125 and female connector 126 were of USB standard. The printed circuit board 127 was of standard PCB type of FR4, where the connection pads 128 were of cupper and manufactured through electro plating.

The maxilla 161 of the probe manipulator head 160 was primarily of wire spark eroded tool grade steel. The mandible 162 of the probe manipulator head 160 was primarily of wire spark eroded tool grade aluminium.

The contact tongue 163 was primarily a printed circuit board 181 of standard PCB type of FR4. The plurality of signal traces 179 on either side of the printed circuit board 181 and the conductive via 180 were of cupper and accomplished through electro plating. The ribbon cable 170 was a Flexconn AWN-2896-VW-1 having internal electrical wires, while the compatible FFC connector 171 was a Farnell 132-4572. The contact fingers 31'''-42''' were of CuBe2 and manufactured through wire spark erosion. The support boards 182 were of CuBe2 to provide a rigid support for printed circuit board 181.

The aluminium probe-support molars 215 of the mandible 162 were given shape through wire and electrode spark erosion thereby defining their support planes accurately.

For the maxilla 161, the electrical motor 165 was a Maxon A-max, the drive axle 166 was a Maxon GS12A, and the ball bearing 167 was a SKF 61801. The bearing centre 172 and outer race 196 were of milled aluminium, while the pivot axis 169 was of milled aluminium to ensure a stable pivotal support. The probe-support incisors 13' and the palate 209 were made of tool grade steel through wire spark erosion, while the cantilever spring 186 was made of stainless spring grade steel for sufficient resilience. The balls 183 were of SiN3 manufactured by Carbotech in the dimension $\frac{1}{32}$" and the ball support 185 were manufactured through wire spark erosion.

The outer race 196 and stroke arm 198 were manufactured of aluminium through milling. The outer race link 199, the mandible link 200, and the contact tongue link 201 were rods of POM, while the upper leaf spring 211 and the lower leaf spring 212 were of spring grade stainless steel for providing sufficient resilience.

Regarding the probe loader 250, the horizontal support stage 251 and vertical support stage 252 were of granite. The first loader arm 255 was a commercially available Danaher URS-46, the second loader arm 256 was also a commercially available Danaher URS-46, while the vertical loader arm 264 was commercially available from Danaher. The first linear actuator 257 was centred on a commercially available threaded axle, while the second linear actuator 258 was on a commercially available threaded axle 275. The vertical linear actuator 165 was a pneumatically driven cylinder. The flexible control conduit 269 was a Leon PTFE.

The first wagon 259 and the second wagon 260 were custom built, while the anchor plate 273 was custom built of aluminium. The cover holder 261 and the rack holder 262 were primarily manufactured of aluminium through milling. The protective cover 274 on the vertical loader was of aluminium. The protective cover 270 and the horizontal loader front 276 were of aluminium. The illuminating LED-lights 271 were of Farnell FEL-F115Y1512V12.

ITEM LIST 10 probe
11 top face
11'' top engagement ridge
12 bottom face
13 bevelled front face
13' probe-support incisors
13'' rounded support tip
13''' front engagement areas
14 bevelled side face
14'' side engagement edge
14''' side engagement areas
15 bevelled end face
15'' end engagement edge
15''' end engagement areas
16 manufacturing support
17 inverted front corner
18 first bevelled front corner face
19 second bevelled front corner face
20 inverted back corner
21 first bevelled back corner face
22 second bevelled back corner face
23 engraved cut
24 pad
outer area
26 probe tip
27 metal layer
28 oxide layer
29 side edge
31-42 contact pad
31'-42' probe signal trace
31''-42'' probe arm
31'''-42''' contact finger
43 front edge
44 inner side of contact pad
45 outer side of contact pad
46 longitudinal symmetry axis
47 conduits
48 acute internal angle
49 front area
50 support column
51 bracket
52 bracket head
53 bracket base
54 bracket neck
55 sloping head face
56 bracket jaw
57 bracket support pins
58 column top part
59 column bottom part 60 column shoulder
61 column tongue
62 sloping tongue face
63 indentation
64 hollow space
65 neck aperture
66 base aperture
67 base flange
68 column side
69 column front
70 engagement angle
71 force
72 reference surface
73 rim
100 probe cassette
110 cassette cover
111 groove in cassette housing
112 flanged slide support
113 cover catch bore
114 cassette housing
119 support axle
120 double spring
121 cover catch pin
123 lock shaft passage
124 non-volatile digital memory
125 male connector
126 female connector
127 PCB
128 PCB pad connector
129 handle
130 locking hook
131 housing front
132 housing end
133 housing bottom
134 housing top
135 sectional cut
140 cassette rack
141 rack catch pin
142 recess for probe holder
143 rack front
144 lock arm
145 spring catch
146 opening recess
147 opening catch bar
148 rack bar
149 rack catch bore
150 groove in rack bar
151 flanged slide support
152 probe holder
153 lock shaft cut-out
154 rack bar end
160 probe manipulator head
161 maxilla
162 mandible
163 contact tongue
165 electrical motor
166 drive axle
167 ball bearing
168 mechanical linkage
169 pivot axis
170 ribbon cable
171 insulation displacement connector
172 bearing centre
173 displaced cylinder
174 pivot aperture
175 pivot aperture
176 maxilla front
177 mandible front
178 contact tip
179 plurality of signal traces
180 conductive via
181 printed circuit board
182 support board
183 sapphire ball
184 support recess
185 sapphire ball support
186 cantilever spring
187 upper support length
188 lower face length
189 upper face length
190 upper support width
191 lower face width
192 upper face width
195 crank shaft
196 outer race
197 connecting rod
198 stroke arm
199 outer race link
200 mandible link
201 contact tongue link
202 mandible shaft
203 maxilla shaft
204 lower support plane
205 upper support plane
206 bearing centre circle
207 stroke shaft
208 circle
209 palate
210 plurality of contact fingers
211 upper leaf spring
212 lower leaf spring
214 stroke arm
215 probe support molar
216 convex engagement surface
217 engagement point
218 securing arm
219 positioning spring
220 probe securing aperture
221 tongue securing aperture
222 probe securing finger
223 tongue securing finger
224 probe securing finger tip
225 tongue securing finger tip
226 positioning spring tip
226''' spring engagement area
227 maxilla ridge
228 convex resting surface
229 tongue ridge
230 securing arm yoke
231 securing arm spring
232 front support height
233 side support height
234 probe height
235 back support height
250 probe loader
251 horizontal support stage
252 vertical support stage
253 horizontal loader
254 vertical loader
255 first loader arm
256 second loader arm
257 first linear actuator
258 second linear actuator
259 first wagon 260 second wagon
261 cover holder
262 rack holder
263 receiving slide support
264 vertical loader arm
265 vertical linear actuator
266 column tongue microscope
267 vertical microscope
268 focal cones
269 control conduit
270 protective cover
271 LED-lights
272 cassette apertures
273 anchor plate
274 protective cover
275 threaded axle
276 horizontal loader front
277 illumination cones
351 cantilever strain gauge
352 reference resistor
353 first limb
354 second limb
361 electrically insulating support wall
362 contact corner Points Characterising the Invention 1 A multi-point probe (10) comprising a planar bottom face (12) and a planar top face (11) being parallel with each other, said multi-point probe (10) further comprising a bevelled planar front face (13), a first side face (14), a second side face (14) on the opposite side of said multi-point probe (10) from said first side face (14), and an end face (15) on the opposite side of said multi-point probe (10) from said front face (13), each of said front face (13), first side face (14), second side face (14), and end face (15) joining said bottom face (12) and said top face (11), said front face and (13) and said bottom face (12) defining an acute internal front angle and a front edge (43) between them, said first side face (14) and said bottom face (12) defining a first side edge between them, said second side face (14) and said bottom face (12) defining a second side edge between them, and said end face (14) and said bottom face (12) defining an end edge between them, a longitudinal direction (46) of said multi-point probe (10) is defined along said first and second side edges and perpendicular to said front edge (43), said bottom face (12) being provided with an electrically conducting metal layer and a set of engraved cuts (23) dividing said metal layer into a plurality of contact pads (31-42), a plurality of electrical conduits (47), and a plurality of signal traces (31'-42') converging at said front edge (43) to a probe tip (26), each electrical conduit of said plurality of electrical conduits (47) interconnecting a respective contact pad of said plurality of contact pads (31-42) and signal trace of said plurality of signal traces (31'-42'), said plurality of contact pads (31-42) being divided into a first row (31-36) and a second row (37-42) positioned beside each other and along said longitudinal direction (46), said first row (31-36) and said first side edge defining a first outer area (25) of said bottom face (12) between them, said second row (37-42) and said second side edge defining a second outer area (25) of said bottom face (12) between them, said first row (31-36) and said second row (37-42) defining an inner area between them, and said plurality of electrical conduits (47) being divided into an outer group and an inner group, an electrical conduit of said outer group traversing either of said first or second outer area and an electrical conduit of said inner group traversing said inner area.

2 A multi-point probe according to point 1, wherein two neighbouring contact pads of said first row of contact pads are separated by a single engraved cut of said set of engraved cuts (23) and two neighbouring contact pads of said second row of contact pads are separated by a single engraved cut of said set of engraved cuts (23).

3 A multi-point probe according to any of the points 1 to 2, wherein the shortest separation between a contact pad of said first row (31-36) and a contact pad of said second row (37-42) that are neighbouring is defined by a single engraved cut of said set of engraved cuts (23).

4 A multi-point probe according to any of the points 1 to 3, wherein said inner area between said first row (31-36) and said second row (37-42) is completely covered by said inner group of said plurality of electrical conduits (47) and by the respective engraved cuts of said set of engraved cuts (23) defining them.

5 A multi-point probe according to any of the points 1 to 4, wherein said plurality of electrical conduits (47) connects to said plurality of contact pads (31-42) in a direction parallel to said longitudinal direction.

6 A multi-point probe (10) according to any of the points 1 and 5, wherein said probe tip (26) comprises a number of probe arms (31"-42") being parallel to said bottom face (12) and extending freely from said front edge (43), each probe arm of said number of probe arms (31-42) being provided with an electrically conducting metal layer in connection with a single signal trace of said plurality of signal traces (31'-42').

7 A multi-point probe (10) according to any of the points 1 and 6, wherein two or more signal traces of said plurality of signal traces (31'-42') are interconnected for defining an electronic circuitry.

8 A multi-point probe (10) according to any of the points 1 and 7, wherein said probe tip (26) comprises a contact detector, said contact detector comprising a cantilever (351) freely extending from said front edge (43) of said multi-point probe (10) for contacting a test surface, said contact detector being connected to at least one contact pad of said plurality of contact pads (31-42) via a respective signal trace of said plurality of signal traces (31'-42').

9 A multi-point probe (10) according to point 8, wherein said contact detector is a cantilever strain gauge and said cantilever (351) is parallel to said bottom face (12) and is provided with an electrically conducting metal layer defining a first limb (353) and a second limb (354) at said front edge (43) of said multi-point probe (10), said first (353) and second (354) limbs crossing said front edge (43) and interconnecting a pair of signal traces of said plurality of signal traces (31'-42') via said freely extending cantilever (351).

10 A multi-point probe (10) according to any of the points 8 and 9, wherein a pair of signal traces are interconnected by a reference resistor (352) having approximately the same form and dimensions as the cantilever strain gauge (351).

11 A multi-point probe according to any of the points 1 to 6, wherein a probe arm of said number of probe arms (31"-42") defines a length between its distal end and said front edge (34) that is less than approximately 0.1 mm.

12 A multi-point probe according to any of the points 1 to 7, wherein the spacing between two neighbouring probe arms of said number of probe arms (3"-42") is less than approximately 0.05 mm, such as approximately 0.02 mm.

13 A multi-point probe (10) according to any of the points 1 to 12, wherein said first side face (14) is bevelled and define an acute internal first side angle between itself and said bottom face (12), said second side face (14) is bevelled and defines an acute internal second side angle between itself and said bottom face (12), and said end face (14) is bevelled and define an acute internal end angle between itself and said bottom face (12).

14 A probe holder (152) comprising a support column (50) defining a top at its upper end, a bottom at its lower end, said top and bottom being joined by a front, a back positioned on the opposite side of said support column from said front, a first side, and a second side positioned on the opposite side of said support column from said first side, said support column (50) constituting a top part (58) and a bottom part (59) supporting said top part (58), said support column (50) defining at its top a first shoulder (60) at its first side and a second shoulder (60) at its second side, said first shoulder (60) defining an upward facing and rectilinear first shoulder engagement edge and said second shoulder (60) defining an upward facing and rectilinear second shoulder engagement edge for engaging to a planar bottom face of multi-point probe, said first and second shoulders (60) together defining a supporting plane by their respective first and second shoulder engagement edges, and said support column (50) defining a hollow space (64) below and between said first and second shoulders (60) and further a single opening in its back and in its top to said hollow space.

15 A probe holder (152) according to point 14, wherein said support column (50) further comprises an upwardly and outwardly extending tongue (61) at its front, said tongue (61) being provided with a fiducial (73) for enabling automated optical focusing.

16 A probe holder (152) according to point 15, wherein said tongue (61) comprises a planar reference surface (72) provided with an indentation (63), said indentation (63) having a rim (73) coplanar with said planar reference surface (72), and said fiducial (73) being defined by said rim (73).

17 A probe holder (152) according to any of the points 14 to 16 further comprising a bracket (51), said bracket (51) comprising a bracket base (53), a bracket neck (54) and a bracket head (52), said bracket base (53) being joined to said bottom part (59) of said support column (50), said bracket neck (54) being connected at its bottom to said bracket base (53), and said bracket head (52) being connected to the top of said bracket neck (54), and said bracket neck (54) further being a resilient cantilever spring defining a resting position at its equilibrium position and a release position when being deflected away from said support column (50), said bracket head (52) comprising a pair of support pins (57) positioned above said column body (58), each support pin of said pair of support pins (57) defining a straight pin engagement edge at its side facing the other support pin for engaging a bevelled planar front face or end face of a multi-point probe, said pair of support pin (57) together defining an engagement plane by their respective pin engagement edge.

18 A probe holder (152) according to point 17, wherein said engagement plane defined by said pair of support pins (57) is parallel to said supporting plane defined by said first and second shoulders (60) when said bracket neck (54) is in its resting position.

19 A probe holder (152) according to any of the points 17 to 18, wherein said bracket head (52) further comprises a sloping head face (55) on its side facing said support column (50), said sloping head face (55) defining a plane having a normal defining a non-zero angle to a horizontal plane when said bracket neck (54) is in its resting position.

20 A probe holder (152) according to any of the points 17 to 19, wherein the flexibility of said bracket neck (54) increases in a direction from said bracket base (53) to said bracket head (52).

21 A probe holder (152) according to any of the points 17 to 20, wherein said bracket neck is provided with an aperture (65) having a width that increases in a direction from said bracket base (53) to said bracket head (52).

22 A probe cassette (100) comprising a cover (110), a rack (140) and a probe support (152) attached to said rack (140) for supporting one or more multi-point probes (10), said probe cassette (100) defining a closed state in which said cover (110) and said rack (140) are connected and enclose said probe support (152) and an open state in which said cover (110) and said rack (140) are disconnected, said cover (110) being provided with parallel grooves (111) defining an upward facing first flanged slide support (112) and said rack (140) being provided with parallel grooves (150) defining a downward facing second flanged slide support (151), said first flanged slide support (112) being positioned above and extending in the same direction as said second flanged slide support (151) when said probe cassette is in its closed state.

23 A probe cassette (100) according to point 22, wherein said cover (110) further comprises a handle and said rack (140) further being provided with a recess (146) in said second flanged slide support (151), said recess being provided with a catch bar (147) defining a right angle to said grooves (150) defining said second flanged slide support (151).

24 A probe cassette (100) according to any of the points 22 to 23 further comprising a lock (130, 145) providing a releasable locking of said cover (110) to said rack (140) in said closed state of said cassette (100).

25 A probe cassette (100) according to any of the points 22 to 24, wherein said cover (110) further comprises a pad connector (128) accessible from the outside of said cassette (100) in its closed state, a female connector (126) accessible from the inside of said cassette (100) in its closed state, and an electrical connection (126-127) between said pad connector (128) and said female connector (126).

26 A probe cassette (100) according to point 25 further comprising a non-volatile digital memory (124) being provided with a protective housing and a male connector (125) compatible with said female connector (126), said female (126) and male (125) connectors providing a releasable support of said non-volatile digital memory (124) when connected.

27 A probe cassette (100) according to point 26, wherein said non-volatile digital memory contains information corresponding to the number of performed engagements between a multi-point probe and a test sample.

28 A probe cassette (100) according to any of the points 22 to 27, wherein said probe support (152) is a probe holder (152) according to any of the points 10 to 17.

29 A probe manipulator head (160) comprising a contact tongue (163) defining a tip (178), said contact tongue comprising a plurality of contact fingers (31'''-42''') being electrically conducting and extending freely from its tip (178) for engaging a corresponding plurality of contact pads on the bottom face of a multi-point probe, and each contact finger of said plurality of contact fingers (31'''-42''') having a distal end and said plurality of contact fingers (31'''-42''') together defining a contact plane by their distal ends.

30 A probe manipulator head (160) according to point 29, wherein said contact fingers of said plurality of contact fingers (31'''-42''') are parallel and extend in a common direction.

31 A probe manipulator head (160) according to point 30, wherein the normal of said contact plane defines an engagement angle to said common direction of said plurality of contact fingers (31'''-42''').

32 A probe manipulator head (160) according to any of the points 29 to 31, wherein said plurality of contact finger (31'''-42''') is divided into a first column (31'''-36''') and a second column (37'''-42'''), the contact fingers of said first column (31'''-36''') laying in a first plane and the contact fingers of said second column (37'''-42''') laying in a second plane, said first plane and said second plane being parallel.

33 A probe manipulator head (160) according to any of the points 29 to 32 further comprising a mandible (162) defining a front (177), said mandible (162) comprising at its front (177) a first probe-support molar (215) defining a first support plane and a second probe-support molar (215) defining a second support plane for in unison engaging a planar bottom face of a multi-point probe, and said first probe-support molar (215) and said second probe-support molar (215) being separated, said first support plane and said second support plane being coplanar and defining a common tangential support plane between said first probe-support molar (215) and said second probe-support molar (215), said contact tongue (163) and said mandible (162) defining a tongue engagement orientation relative to one another in which said plurality of contact fingers (31'''-42''') crosses said common support plane.

34 A probe manipulator head (160) according to point 33, wherein said contact tongue (163) and said mandible (162) define a tongue disengagement orientation relative to one another in which said plurality of contact finger (31'''-42''') are all on one side of said common support plane.

35 A probe manipulator head (160) according to any of the points 33 and 34, wherein each of said first probe-support molar (215) and said second probe-support molar (215) comprises a convex engagement surface (216) having an engagement point (217) for engaging the bottom face (12) of a multi-point probe (10), said first support plane being coplanar with the tangential plane to said engagement point (217) and said convex engagement surface (216) of said first probe-support molar (215), and said second support plane being coplanar with the tangential plane to said engagement point (217) and said convex engagement surface (216) of said second probe-support molar (215).

36 A probe manipulator head (160) according to any of the points 33 to 35 further comprising a maxilla (161) defining a front (176), said maxilla (161) comprising a pivot axis (169) providing a pivotal support for said mandible (162) and said contact tongue (163) and a turn actuator (165, 166) coupled via a mechanical linkage (168) to said mandible (162) and said contact tongue (163), said pivot axis (169), said turn actuator (165, 166), said mechanical linkage (168), and said mandible (162) defining a variable separation between the front (177) of said mandible (162) and the front (176) of said maxilla (161), said variable separation being varied by turning said turn actuator (165, 166) and having a minimum separation defining a closed position for said mandible (162).

37 A probe manipulator head (160) according to point 36, wherein said variable separation returns cyclically to the same separation after a single complete turn of said turn actuator (165, 166).

38 A probe manipulator head (160) according to any of the points 36 to 37, wherein at a constant turning of said turn actuator (165, 166) the rate of change of said variable separation reaches a minimum at said closed position.

39 A probe manipulator head (160) according to any of the points 36 to 38, wherein the front (176) of said maxilla (161) defines a palate (209) for receiving a multi-point probe (10), said palate (209) having a front engagement edge, an end engagement edge (15") positioned on the opposite side of said palate (209) from said front engagement edge, and a first and a second side engagement edge (14") positioned on opposite sides of said palate (209) and between said front and end (15") engagement edges, said front and end (15") engagement edges being parallel to each other and to said common support plane between said first and second probe-support molars (215) when said mandible is in its closed position, and said first and second side engagement edges being parallel to each other and to said common support plane between said first and second probe-support molars (215) when said mandible is in its closed position.

40 A probe manipulator head (160) according to point 39, wherein the front (176) of said maxilla (161) comprises a first probe-support incisor (13') and a second probe-support incisor (13'), each having a rounded support tip at its distal end for engaging a bevelled planar front face of a multi-point probe, the rounded support tip of said first probe-support incisor (13') and the rounded support tip of said second probe-support incisor (13') defining said front engagement edge.

41 A probe loader (250) comprising a horizontal support stage (251) and a vertical support stage (252) rigidly connected to said horizontal support stage (251), a horizontal loader (253) supported by said horizontal support stage (251), and a vertical loader (254) supported by said vertical support stage (252), said horizontal loader comprising a first loader arm (255) defining a horizontal first loading axis and a second loader arm (256) defining a horizontal second loading axis, said first loading axis and said second loading axis jointly defining a crossing angle, said horizontal loader further comprising a first linear actuator (257), a first wagon (259), a second linear actuator (258), and a second wagon (260), said first loader arm being rigidly connected to said horizontal support stage (251) and providing a sliding support for said first wagon (259), and said first linear actuator (257) providing a variable position of said first wagon (259) along said first loading axis, said second loader arm (256) being rigidly connected to said first wagon (259) and providing a sliding support for said second wagon (260), and said second linear actuator (258) providing a variable position of said second wagon (260) along said second loading axis.

said probe loader (250) further comprising a cover holder (261) rigidly connected to said horizontal support stage (251) and provided with flanges defining a downward facing first receiving flanged slide support for cooperating with the first flanged slide support (112) of a cover (110) of a probe cassette (100), and said second wagon (260) comprising a rack holder (262) provided with flanges defining an upward facing second receiving flanged slide support (262) for cooperating with the second flanged slide support (151) of a rack (140) of a probe cassette (100).

42 A probe loader (250) according to point 41, wherein said vertical loader (254) comprises a vertical loader arm defining a vertical loading axis, a vertical linear actuator (265), and a probe gripper (160) for engaging a multi-point probe (10)

supported by a probe support (152) attached to a rack (140) supported by said rack holder (262), said vertical loader arm being rigidly connected to said vertical support stage (252) and providing a sliding support for said probe gripper (160), and said vertical linear actuator (265) providing a variable position of said probe gripper (160) along said vertical loading axis.

43 A probe loader (250) according to point 42, wherein said probe loader (250) defines a loading position in which said rack holder (262) is located at said cover holder (261) with said second receiving flanged slide support (263) positioned below and parallel to said first receiving flanged slide support, and a gripping position in which said rack holder (262) is located at said probe gripper (160) with said second receiving flanged slide support (263) positioned below said probe gripper (160).

44 A probe loader (250) according to point 41, wherein said probe gripper (160) comprises a probe manipulator head (160) according to any of the points 29 to 40.

45 A multi-point measuring system comprising a multi-point probe (10) according to any of the points 1 to 13 and a probe manipulator head (160) according to any of the points 29 to 40, wherein at least one of said plurality of contact fingers (31'''-42''') of said contact tongue (163) is connected by its distal end to a contact pad of said plurality of contact pads (31-42) of said multi-point probe (10) in a releasable connection.

46 A multi-point measuring system according to point 45 and any of the points 33 to 40, wherein said first outer area (25) of said multi-point probe (10) is parallel to said first support plane and engaged by said first probe-support molar (215) of said mandible (162), and said second outer area (25) of said multi-point probe (10) is parallel to said second support plane and engaged by said second probe-support molar (215) of said mandible (162).

47 A multi-point measuring system according to any of the points 45 to 46 and any of the points 39 to 40, wherein said bevelled planar front face (13) is parallel to and engaged by said front engagement edge of said maxilla (161), said first side face (14) is parallel to and engaged by said first side engagement edge (14") of said maxilla (161), said second side face (14) is parallel to and engaged by said second side engagement edge (14") of said maxilla (161), and said end face (15) is parallel to and engaged by said end engagement edge of said maxilla (161).

48 A loaded multi-point probe holder comprising a multi-point probe (10) according to any of the points 1 to 13 and a probe holder (152) according to any of the points 14 to 21, wherein said first outer area (25) of said multi-point probe (10) is in contact with said first shoulder (60) of said support column (50) and parallel to said first shoulder engagement edge, and said second outer area (25) of said multi-point probe (10) is in contact with said second shoulder (60) of said support column (50) and parallel to said second shoulder engagement edge.

49 A loaded multi-point probe holder according to point 43 and any of points 17 to 21, wherein said bevelled planar front face (13) of said multi-point probe (10) is parallel to and engaged by said pin engagement edge of one of said pair of support pins (57) of said bracket (51), and said end face (15) of said multi-point probe (10) is parallel to and engaged by said pin engagement edge of the other of said pair of support pins (57) of said bracket (51).

50 A loaded multi-point probe cassette comprising a probe cassette (100) according to any of the points 22 to 28, wherein said probe support (152) of said probe cassette (100) is a loaded multi-point probe holder according to any of the points 48 to 49.

51 A loaded multi-point probe cassette according to point 50 and to any of the points 18 to 19, wherein said non-volatile digital memory contains information corresponding to the number of performed measurement engagements by said multi-point probe of said loaded multi-point probe storage system.

52 A multi-point probe gripping system comprising a probe holder (152) according to any of the points 14 to 21 and a probe manipulator head (160) according to any of the points 29 to 41, wherein said probe holder (152) and said probe manipulator head (160) defines an engagement position relative to one another in which said contact plane defined by said plurality contact fingers (31'''-42''') of said contact tongue (163) is coplanar with said supporting plane defined by said first and second shoulders (60) of said support column, and said plurality of contact fingers (31'''-42''') traverses said hollow space (64) defined by said support column (50) from the back to the top of said support column (50) through said single opening.

53 A multi-point probe gripping system according to point 52 and any of the points 17 to 21, wherein in said engagement position said bracket neck (54) of said bracket (51) is held in said release position by engaging said bracket head (52) of said bracket (51) by said front (176) of said maxilla (161).

54 A loaded probe loader comprising a probe loader according to any of the points 41 to 44 and a probe cassette (100) according to any of the points 22 to 28, wherein said first flanged slide support (112) of said cover (110) of said cassette (100) cooperates with said first receiving flanged slide support of said cover holder of said probe loader, and said second flanged slide support (112) of said rack (140) of said cassette (100) cooperates with said second receiving flanged slide support of said rack holder of said probe loader.

55 A loaded probe loader according to point 54 and to point 43, wherein in said loading position of said probe loader said probe cassette (100) is in its closed state, and in said gripping position of said probe loader said probe cassette (100) is in its open state.

56 A method for connecting a multi-point probe (10) to a probe manipulator head (160) comprising the steps of:

providing a multi-point probe (10) according to any of the points 1 to 13, providing a probe manipulator head (160) according to any of the points 29 to 40, and connecting at least one of said plurality of contact fingers (31'''-42''') of said contact tongue (163) by its distal end to a contact pad of said plurality of contact pads (31-42) of said multi-point probe (10) in a releasable connection.

57 The method for connecting a multi-point probe (10) to a probe manipulator head (160) according to point 56 further comprising the steps of:

engaging said first outer area (25) of said multi-point probe (10) by said first probe-support molar (215) of said mandible (162) in a parallel relationship between said first outer area (25) and said first support plane, and engaging said second outer area (25) of said multi-point probe (10) by said second probe-support molar (215) of said mandible (162) in a parallel relationship between said second outer area (25) and said second support plane.

58 The method for connecting a multi-point probe (10) to a probe manipulator head (160) according to any of the points 57 to 58 further comprising the steps of:

engaging said bevelled planar front face (13) by said front engagement edge of said maxilla (161) in a parallel relationship between them, engaging said first side face (14) by said first side engagement edge (14") of said maxilla (161) in a parallel relationship between them, engaging said second side face (14) by said second side engagement edge (14") of said maxilla (161) in a parallel relationship between them, and engaging said end face (15) by said end engagement edge (15") of said maxilla (161) in a parallel relationship between them.

59 A method for loading a probe holder (152) with a multi-point probe (10) comprising the steps of:

providing a multi-point probe (10) according to any of the points 1 to 13, providing a probe holder (152) according to any of the points 14 to 21, engaging said first outer area (25) of said multi-point probe (10) by said first shoulder (60) of said support column (50) in a parallel relationship between said first outer area (25) and said first shoulder engagement edge, and engaging said second outer area (25) of said multi-point probe (10) by said second shoulder (60) of said support column (50) in a parallel relationship between said second outer area (25) and said second shoulder engagement edge.

60 The method for loading a probe holder (152) with a multi-point probe (10) according to point 59 further comprising the steps of:

engaging said bevelled planar front face (13) of said multi-point probe (10) by said pin engagement edge of one of said pair of support pins (57) of said bracket (51) in a parallel relationship between them, and engaging said end face (15) of said multi-point probe (10) by said pin engagement edge of the other of said pair of support pins (57) of said bracket (51) in a parallel relationship between them.

61 A method for loading a probe cassette (152) with a multi-point probe (10) comprising the steps of:

providing a multi-point probe (10) according to any of the points 1 to 13, providing a probe cassette (100) according to any of the points 22 to 28, and loading said probe support (152) of said probe cassette (100) with said multi-point probe.

62 The method for loading a probe cassette (152) with a multi-point probe (10) according to point 61 further comprising the step of:

storing information corresponding to the number of performed measurement engagements by said multi-point probe (10) in said non-volatile digital memory.

63 A method for engaging a probe holder (152) by a probe manipulator head (160) comprising the steps of:

providing a probe manipulator head (160) according to any of the points 29 to 40, providing a probe holder (152) according to any of the points 14 to 21, and positioning said probe holder (152) and said probe manipulator head (160) in an engagement position relative to one another in which said contact plane defined by said plurality contact fingers (31'''-42''') of said contact tongue (163) is coplanar with said supporting plane defined by said first and second shoulders (60) of said support column, and said plurality of contact fingers (31'''-42''') traverses said hollow space (64) defined by said support column (50) from the back to the top of said support column (50) through said single opening.

64 The method for engaging a probe holder (152) by a probe manipulator head (160) according to point 60 further comprising the step of:

holding said bracket neck (54) of said bracket (51) in said release position by engaging said bracket head (52) by said front (176) of said maxilla (161).

The invention claimed is:

1. A multi-point probe (10) comprising a planar bottom face (12) and a planar top face (11) being parallel with each other, said multi-point probe (10) further comprising a bevelled planar front face (13), a first side face (14), a second side face (14) on the opposite side of said multi-point probe (10) from said first side face (14), and an end face (15) on the opposite side of said multi-point probe (10) from said front face (13);

each of said front face (13), first side face (14), second side face (14), and end face (15) joining said bottom face (12) and said top face (11), said front face and (13) and said bottom face (12) defining an acute internal front angle and a front edge (43) between them, said first side face (14) and said bottom face (12) defining a first side edge between them, said second side face (14) and said bottom face (12) defining a second side edge between them, and said end face (14) and said bottom face (12) defining an end edge between them;

a longitudinal direction (46) of said multi-point probe (10) being defined along said first and second side edges and perpendicular to said front edge (43);

said bottom face (12) being provided with an electrically conducting metal layer and a set of engraved cuts (23) dividing said metal layer into a plurality of contact pads (31-42), a plurality of electrical conduits (47), and a plurality of signal traces (31'-42') converging at said front edge (43) to a probe tip (26), each electrical conduit of said plurality of electrical conduits (47) interconnecting a respective contact pad of said plurality of contact pads (31-42) and signal trace of said plurality of signal traces (31'-42');

said plurality of contact pads (31-42) being divided into a first row (31-36) and a second row (37-42) positioned beside each other and along said longitudinal direction (46), said first row (31-36) and said first side edge defining a first outer area (25) of said bottom face (12) between them, said second row (37-42) and said second side edge defining a second outer area (25) of said bottom face (12) between them, said first row (31-36) and said second row (37-42) defining an inner area between them; and said plurality of electrical conduits (47) being divided into an outer group and an inner group, an electrical conduit of said outer group traversing either of said first or second outer areas, and an electrical conduit of said inner group traversing said inner area.

2. A multi-point measuring system comprising: a multi-point probe (10) in accordance with claim 1, and a probe manipulator head (160);

wherein the probe manipulator head comprises:

a contact tongue (163) defining a tip (178), said contact tongue comprising a plurality of contact fingers (31'''-42''') being electrically conducting and extending freely from its tip (178) for engaging a corresponding plurality of contact pads on the bottom face of a multi-point probe, and each contact finger of said plurality of contact fingers (31'''-42''') having a distal end and said plurality of contact fingers (31'''-42''') together defining a contact plane by their distal ends; and wherein at least one of said plurality of contact fingers (31'''-42''') of said contact tongue (163) is connected by its distal end to a contact pad of said plurality of contact pads (31-42) of said multi-point probe (10) in a releasable connection.

3. A loaded multi-point probe holder comprising a multi-point probe (10) according to claim 1, and a probe holder (152);

wherein the probe holder comprises:

a support column (50) having an upper end defining a top, and a lower end defining a bottom, said top and bottom being joined by a front, a back positioned on the opposite side of said support column from said front, a first side, and a second side positioned on the opposite side of said support column from said first side; said support column (50) constituting a top part (58) and a bottom part (59) supporting said top part (58); said support column (50) defining at its top a first shoulder (60) at its first side and a second shoulder (60) at its second side, said first shoulder (60) defining an upward facing and rectilinear first shoulder engagement edge and said second shoulder (60) defining an upward facing and rectilinear second shoulder engagement edge for engaging to a planar bottom face of a multi-point probe, said first and second shoulders (60) together defining a supporting plane by their respective first and second shoulder engagement edges; and said support column (50) defining a hollow space (64) below and between said first and second shoulders (60) and further a single opening in its back and in its top to said hollow space; and wherein said first outer area (25) of said multi-point probe (10) is in contact with said first shoulder (60) of said support column (50) and parallel to said first shoulder engagement edge, and said second outer area (25) of said multi-point probe (10) is in contact with said second shoulder (60) of said support column (50) and parallel to said second shoulder engagement edge.

4. A loaded multi-point probe cassette comprising a probe cassette and a probe support; wherein said probe cassette comprises a cover (110), a rack (140) and a probe support (152) attached to said rack (140) for supporting one or more multi-point probes (10), said probe cassette (100) defining a closed state in which said cover (110) and said rack (140) are connected and enclose said probe support (152), and an open state in which said cover (110) and said rack (140) are disconnected; said cover (110) having a first set of parallel grooves (111) defining an upward facing first flanged slide support (112), and said rack (140) a second set of parallel grooves (150) defining a downward facing second flanged slide support (151), said first flanged slide support (112) being positioned above and extending in the same direction as said second flanged slide support (151) when said probe cassette is in its closed state; and wherein said probe support (152) of said probe cassette (100) comprises a loaded multi-point probe holder according to claim 3.

5. A method for connecting a multi-point probe (10) to a probe manipulator head (160), the method comprising the steps of:

providing a multi-point probe in accordance with claim 1;

providing a probe manipulator head (160) comprising a contact tongue (163) defining a tip (178), said contact tongue comprising a plurality of contact fingers (31'''-42''') being electrically conducting and extending freely from its tip (178) for engaging a corresponding plurality of contact pads on the bottom face of a multi-point probe, each contact finger of said plurality of contact fingers (31'''-42''') having a distal end and said plurality of contact fingers (31'''-42''') together defining a contact plane by their distal ends; and connecting at least one of said plurality of contact fingers (31'''-42''') of said contact tongue (163) by its distal end to a contact pad of said plurality of contact pads (31-42) of said multi-point probe (10) in a releasable connection.

6. A method for loading a probe holder (152) with a multi-point probe (10), the method comprising the steps of:

providing a multi-point probe according to claim 1;

providing a probe holder (152) comprising a support column (50) having an upper end defining a top, and a lower end defining a bottom, said top and bottom being joined by a front, a back positioned on the opposite side of said support column from said front, a first side, and a second side positioned on the opposite side of said support column from said first side, said support column (50) constituting a top part (58) and a bottom part (59) supporting said top part (58), said support column (50) defining at its top a first shoulder (60) at its first side and a second shoulder (60) at its second side, said first shoulder (60) defining an upward facing and rectilinear first shoulder engagement edge and said second shoulder (60) defining an upward facing and rectilinear second shoulder engagement edge for engaging to a planar bottom face of a multi-point probe, said first and second shoulders (60) together defining a supporting plane by their respective first and second shoulder engagement edges, said support column (50) defining a hollow space (64) below and between said first and second shoulders (60) and further a single opening in its back and in its top to said hollow space;

engaging said first outer area (25) of said multi-point probe (10) by said first shoulder (60) of said support column (50) in a parallel relationship between said first outer area (25) and said first shoulder engagement edge; and engaging said second outer area (25) of said multi-point probe (10) by said second shoulder (60) of said support column (50) in a parallel relationship between said second outer area (25) and said second shoulder engagement edge.

7. A method for loading a probe cassette (152) with a multi-point probe (10), the method comprising the steps of:

providing a multi-point probe (10) according to claim 1;

providing a probe cassette (100), comprising a cover (110), a rack (140) and a probe support (152) attached to said rack (140) for supporting one or more multi-point probes (10), said probe cassette (100) defining a closed state in which said cover (110) and said rack (140) are connected and enclose said probe support (152) and an open state in which said cover (110) and said rack (140) are disconnected, said cover (110) being provided with a first set of parallel grooves (111) defining an upward facing first flanged slide support (112) and said rack (140) being provided with a second set of parallel grooves (150) defining a downward facing second flanged slide support (151), said first flanged slide support (112) being positioned above and extending in the same direction as said second flanged slide support (151) when said probe cassette is in its closed state; and loading said probe support (152) of said probe cassette (100) with said multi-point probe.

8. A probe holder (152) for a multi-point probe, the probe holder comprising a support column (50) having an upper end defining a top, and a lower end defining a bottom, said top and bottom being joined by a front, a back positioned on the opposite side of said support column from said front, a first side, and a second side positioned on the opposite side of said support column from said first side;

said support column (50) constituting a top part (58) and a bottom part (59) supporting said top part (58);

said support column (50) defining at its top a first shoulder (60) at its first side and a second shoulder (60) at its second side, said first shoulder (60) defining an upward facing and rectilinear first shoulder engagement edge and said second shoulder (60) defining an upward facing and rectilinear second shoulder engagement edge for engaging to a planar bottom face of a multi-point probe, said first and second shoulders (60) together defining a supporting plane by their respective first and second shoulder engagement edges; and said support column (50) defining a hollow space (64) below and between said first and second shoulders (60) and further a single opening in its back and in its top to said hollow space.

9. A probe holder (152) according to claim 8, further comprising a bracket (51), said bracket (51) comprising a bracket base (53), a bracket neck (54) and a bracket head (52), said bracket base (53) being joined to said bottom part (59) of said support column (50), said bracket neck (54) having a bottom connected to said bracket base (53), and said bracket neck (54) having a top to which said bracket head (52) is connected; and said bracket neck (54) further being a resilient cantilever spring defining a resting position at an equilibrium position, and a release position when being deflected away from said support column (50), said bracket head (52) comprising a pair of support pins (57) positioned above said column body (58), each support pin of said pair of support pins (57) defining a straight pin engagement edge at its side facing the other support pin for engaging a bevelled planar front face or end face of a multi-point probe, said pair of support pins (57) together defining an engagement plane by their respective pin engagement edges.

10. A multi-point probe gripping system comprising a probe holder (152) according to claim 8, and a probe manipulator head (160);

wherein the probe manipulator head comprises a contact tongue (163) defining a tip (178), said contact tongue comprising a plurality of contact fingers (31'''-42''') being electrically conducting and extending freely from its tip (178) for engaging a corresponding plurality of contact pads on the bottom face of a multi-point probe, each contact finger of said plurality of contact fingers (31'''-42''') having a distal end and said plurality of contact fingers (31'''-42''') together defining a contact plane by their distal ends; and wherein said probe holder (152) and said probe manipulator head (160) define an engagement position relative to one another in which said contact plane defined by said plurality contact fingers (31'''-42''') of said contact tongue (163) is coplanar with said supporting plane defined by said first and second) shoulders (60) of said support column, and said plurality of contact fingers (31'''-42''') traverses said hollow space (64) defined by said support column (50) from the back to the top of said support column (50) through said single opening.

11. A probe cassette (100) comprising a cover (110), a rack (140) and a probe support (152) attached to said rack (140) for supporting one or more multi-point probes (10), said probe cassette (100) defining a closed state in which said cover (110) and said rack (140) are connected and enclose said probe support (152) and an open state in which said cover (110) and said rack (140) are disconnected, said cover (110) being provided with parallel grooves (111) defining an upward facing first flanged slide support (112) and said rack (140) being provided with parallel grooves (150) defining a downward facing second flanged slide support (151), said first flanged slide support (112) being positioned above and extending in the same direction as said second flanged slide support (151) when said probe cassette is in its closed state.

12. A probe manipulator head (160) comprising a contact tongue (163) defining a tip (178), said contact tongue comprising a plurality of contact fingers (31'''-42''') being electrically conducting and extending freely from its tip (178) for engaging a corresponding plurality of contact pads on the bottom face of a multi-point probe, and each contact finger of said plurality of contact fingers (31'''-42''') having a distal end and said plurality of contact fingers (31'''-42''') together defining a contact plane by their distal ends.

13. A probe manipulator head (160) according to claim 12 further comprising a mandible (162) defining a front (177), said mandible (162) comprising at its front (177) a first probe-support molar (215) defining a first support plane and a second probe-support molar (215) defining a second support plane for in unison engaging a planar bottom face of a multi-point probe, and said first probe-support molar (215) and said second probe-support molar (215) being separated, said first support plane and said second support plane being coplanar and defining a common tangential support plane between said first probe-support molar (215) and said second probe-support molar (215), said contact tongue (163) and said mandible (162) defining a tongue engagement orientation relative to one another in which said plurality of contact fingers (31'''-42''') crosses said common support plane.

14. A probe manipulator head (160) according to claim 12, further comprising a maxilla (161) defining a front (176), said maxilla (161) comprising a pivot axis (169) providing a pivotal support for said mandible (162) and said contact tongue (163) and a turn actuator (165,166) coupled via a mechanical linkage (168) to said mandible (162) and said contact tongue (163);

said pivot axis (169), said turn actuator (165,166), said mechanical linkage (168), and said mandible (162) defining a variable separation between the front (177) of said mandible (162) and the front (176) of said maxilla (161), said variable separation being varied by turning said turn actuator (165,166) and having a minimum separation defining a closed position for said mandible (162).

15. A method for engaging a probe holder (152) by a probe manipulator head (160), the method comprising the steps of:

providing a probe manipulator head (160) according to claim 12;

providing a probe holder (152) comprising a support column (50) having an upper end defining a top, and a lower end defining a bottom, said top and bottom being joined by a front, a back positioned on the opposite side of said support column from said front, a first side, and a second side positioned on the opposite side of said support column from said first side, said support column (50) constituting a top part (58) and a bottom part (59) supporting said top part (58), said support column (50) defining at its top a first shoulder (60) at its first side and a second shoulder (60) at its second side, said first shoulder (60) defining an upward facing and rectilinear first shoulder engagement edge and said second shoulder (60) defining an upward facing and rectilinear second shoulder engagement edge for engaging to a planar bottom face of a multi-point probe, said first and second shoulders (60) together defining a supporting plane by their respective first and second shoulder engagement edges, said support column (50) defining a hollow space (64) below and between said first and second shoulders (60) and further a single opening in its back and in its top to said hollow space; and positioning said probe holder (152) and said probe manipulator head (160) in an engagement position relative to one another in which said contact plane defined by said plurality contact fingers (31'''-42''') of said contact tongue (163) is coplanar with said supporting plane defined by said first and second shoulders (60) of said support column, and said plurality of contact fingers (31'''-42''') traverses said hollow space (64) defined by said support column (50) from the back to the top of said support column (50) through said single opening.

16. A probe loader (250) for a probe cassette (100) having a cassette cover (110) with a first flanged slide support (112) and a rack with a second flanged slide support (151), said probe loader comprising a horizontal support stage (251) and a vertical support stage (252) rigidly connected to said horizontal support stage (251), a horizontal loader (253) supported by said horizontal support stage (251), and a vertical loader (254) supported by said vertical support stage (252);

said horizontal loader comprising a first loader arm (255) defining a horizontal first loading axis and a second loader arm (256) defining a horizontal second loading axis, said first loading axis and said second loading axis jointly defining a crossing angle;

said horizontal loader further comprising a first linear actuator (257), a first wagon (259), a second linear actuator (258), and a second wagon (260);

said first loader arm being rigidly connected to said horizontal support stage (251) and providing a sliding support for said first wagon (259), and said first linear actuator (257) providing a variable position of said first wagon (259) along said first loading axis;

said second loader arm (256) being rigidly connected to said first wagon (259) and providing a sliding support for said second wagon (260), and said second linear actuator (258) providing a variable position of said second wagon (260) along said second loading axis;

said probe loader (250) further comprising a cover holder (261) rigidly connected to said horizontal support stage (251) and provided with flanges defining a downward facing first receiving flanged slide support configured for cooperating with the first flanged slide support (112) of a cover (110) of a probe cassette (100); and said second wagon (260) comprising a rack holder (262) provided with flanges defining an upward facing second receiving flanged slide support (262) configured for cooperating with the second flanged slide support (151) of a rack (140) of a probe cassette (100).

17. A loaded probe loader comprising a probe loader (250) in accordance with claim 16, and a probe cassette (100);

wherein the probe cassette comprises a cover (110), a rack (140) and a probe support (152) attached to said rack (140) for supporting one or more multi-point probes (10), said probe cassette (100) defining a closed state in which said cover (110) and said rack (140) are connected and enclose said probe support (152) and an open state in which said cover (110) and said rack (140) are disconnected; said cover (110) being provided with a first set of parallel grooves (111) defining an upward facing first flanged slide support (112) and said rack (140) being provided with a second set of parallel grooves (150) defining a downward facing second flanged slide support (151), said first flanged slide support (112) being positioned above and extending in the same direction as said second flanged slide support (151) when said probe cassette is in its closed state; and wherein said first flanged slide support (112) of said cover (110) of said cassette (100) cooperates with said first receiving flanged slide support of said cover holder of said probe loader, and said second flanged slide support (112) of said rack (140) of said cassette (100) cooperates with said second receiving flanged slide support of said rack holder of said probe loader.

* * * * *